(12) United States Patent
     Umezaki

(10) Patent No.: US 11,916,150 B2
(45) Date of Patent: Feb. 27, 2024

(54) SEMICONDUCTOR DEVICE

(71) Applicant: Semiconductor Energy Laboratory Co., Ltd., Atsugi (JP)

(72) Inventor: Atsushi Umezaki, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/946,116

(22) Filed: Sep. 16, 2022

(65) Prior Publication Data

US 2023/0019400 A1   Jan. 19, 2023

Related U.S. Application Data

(63) Continuation of application No. 17/408,572, filed on Aug. 23, 2021, now Pat. No. 11,575,049, which is a
(Continued)

(30) Foreign Application Priority Data

Mar. 27, 2009   (JP) ................................. 2009-077955

(51) Int. Cl.
    *G09G 3/20*   (2006.01)
    *G09G 3/36*   (2006.01)
    (Continued)

(52) U.S. Cl.
    CPC ........... *H01L 29/7869* (2013.01); *G09G 3/20* (2013.01); *G09G 3/3648* (2013.01); *G11C 19/28* (2013.01);
    (Continued)

(58) Field of Classification Search
    CPC .... G06F 3/03648; G09G 3/3225; G11C 19/28
    (Continued)

(56) References Cited

U.S. PATENT DOCUMENTS

| 5,434,899 A | 7/1995 | Huq et al. |
| 5,731,856 A | 3/1998 | Kim et al. |

(Continued)

FOREIGN PATENT DOCUMENTS

| CN | 001912965 A | 2/2007 |
| CN | 101166023 A | 4/2008 |

(Continued)

OTHER PUBLICATIONS

Chinese Office Action (Application No. 201010155622.3) dated Feb. 5, 2013.

(Continued)

*Primary Examiner* — Calvin C Ma
(74) *Attorney, Agent, or Firm* — Fish & Richardson P.C.

(57) ABSTRACT

One of the objects is to improve display quality by reduction in malfunctions of a circuit. In a driver circuit formed using a plurality of pulse output circuits having first to third transistors and first to fourth signal lines, a first clock signal is supplied to the first signal line; a preceding stage signal is supplied to the second signal line; a second clock signal is supplied to the third signal line; an output signal is output from the fourth signal line. Duty ratios of the first clock signal and the second clock signal are different from each other. A period during which the second clock signal is changed from an L-level signal to an H-level signal after the first clock signal is changed from an H-level signal to an L-level signal is longer than a period during which the preceding stage signal is changed from an L-level signal to an H-level signal.

2 Claims, 33 Drawing Sheets

Related U.S. Application Data continuation of application No. 16/925,381, filed on Jul. 10, 2020, now Pat. No. 11,127,858, which is a continuation of application No. 16/416,394, filed on May 20, 2019, now Pat. No. 10,714,630, which is a continuation of application No. 16/244,193, filed on Jan. 10, 2019, now Pat. No. 10,297,693, which is a continuation of application No. 16/022,806, filed on Jun. 29, 2018, now Pat. No. 10,181,530, which is a continuation of application No. 15/168,293, filed on May 31, 2016, now Pat. No. 10,026,848, which is a continuation of application No. 13/975,422, filed on Aug. 26, 2013, now Pat. No. 9,362,412, which is a continuation of application No. 12/731,722, filed on Mar. 25, 2010, now Pat. No. 8,519,929.

(51) Int. Cl.
  *H01L 29/786* (2006.01)
  *G11C 19/28* (2006.01)
  *H01L 21/477* (2006.01)
  *H01L 27/12* (2006.01)

(52) U.S. Cl.
  CPC .......... *H01L 21/477* (2013.01); *H01L 27/127* (2013.01); *H01L 27/1255* (2013.01); *G09G 2300/04* (2013.01); *G09G 2310/0275* (2013.01)

(58) Field of Classification Search
  USPC .......................................... 345/87, 205, 690
  See application file for complete search history.

(56) References Cited

U.S. PATENT DOCUMENTS

| | | |
|---|---|---|
| 5,744,864 A | 4/1998 | Cillessen et al. |
| 5,859,630 A | 1/1999 | Huq |
| 6,294,274 B1 | 9/2001 | Kawazoe et al. |
| 6,563,174 B2 | 5/2003 | Kawasaki et al. |
| 6,693,617 B2 | 2/2004 | Sasaki et al. |
| 6,727,522 B1 | 4/2004 | Kawasaki et al. |
| 6,756,816 B2 | 6/2004 | Miyake |
| 6,813,332 B2 | 11/2004 | Nagao et al. |
| 6,906,385 B2 | 6/2005 | Moon et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,084,668 B2 | 8/2006 | Miyake |
| 7,105,868 B2 | 9/2006 | Nause et al. |
| 7,116,748 B2 | 10/2006 | Nagao et al. |
| 7,173,676 B2 | 2/2007 | Jeon et al. |
| 7,211,825 B2 | 5/2007 | Shih et al. |
| 7,215,315 B2 | 5/2007 | Morosawa et al. |
| 7,282,782 B2 | 10/2007 | Hoffman et al. |
| 7,297,977 B2 | 11/2007 | Hoffman et al. |
| 7,319,452 B2 | 1/2008 | Moon |
| 7,323,356 B2 | 1/2008 | Hosono et al. |
| 7,372,300 B2 | 5/2008 | Tobita |
| 7,385,224 B2 | 6/2008 | Ishii et al. |
| 7,402,506 B2 | 7/2008 | Levy et al. |
| 7,411,209 B2 | 8/2008 | Endo et al. |
| 7,436,923 B2 | 10/2008 | Tobita |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,486,269 B2 | 2/2009 | Moon |
| 7,492,853 B2 | 2/2009 | Tobita |
| 7,499,518 B2 | 3/2009 | Tobita et al. |
| 7,501,293 B2 | 3/2009 | Ito et al. |
| 7,535,027 B2 | 5/2009 | Moon et al. |
| 7,656,004 B2 | 2/2010 | Jeon et al. |
| 7,667,784 B2 | 2/2010 | Kim et al. |
| 7,674,650 B2 | 3/2010 | Akimoto et al. |
| 7,704,859 B2 | 4/2010 | Sato |
| 7,724,864 B2 | 5/2010 | Kim et al. |
| 7,732,819 B2 | 6/2010 | Akimoto et al. |
| 7,804,553 B2 | 9/2010 | Chang |
| 7,859,507 B2 | 12/2010 | Jang. et al. |
| 7,910,490 B2 | 3/2011 | Akimoto et al. |
| 7,932,521 B2 | 4/2011 | Akimoto et al. |
| 7,932,888 B2 | 4/2011 | Miyake |
| 7,936,331 B2 | 5/2011 | Uh et al. |
| 7,936,332 B2 | 5/2011 | Lee et al. |
| 8,008,690 B2 | 8/2011 | Moon et al. |
| 8,120,598 B2 | 2/2012 | Shin et al. |
| 8,159,422 B2 | 4/2012 | Abe |
| 8,164,555 B2 | 4/2012 | Miyake et al. |
| 8,274,077 B2 | 9/2012 | Akimoto et al. |
| 8,330,492 B2 | 12/2012 | Umezaki |
| 8,363,000 B2 | 1/2013 | Umezaki |
| 8,466,463 B2 | 6/2013 | Akimoto et al. |
| 8,493,309 B2 | 7/2013 | Tobita |
| 8,508,459 B2 | 8/2013 | Miyake |
| 8,610,179 B2 | 12/2013 | Moon et al. |
| 8,629,069 B2 | 1/2014 | Akimoto et al. |
| 8,669,550 B2 | 3/2014 | Akimoto et al. |
| 8,760,443 B2 | 6/2014 | Shin et al. |
| 8,766,901 B2 | 7/2014 | Miyake |
| 8,790,959 B2 | 7/2014 | Akimoto et al. |
| 8,796,069 B2 | 8/2014 | Akimoto et al. |
| 8,798,226 B2 | 8/2014 | Nagao et al. |
| 8,803,768 B2 | 8/2014 | Kimura et al. |
| 8,803,781 B2 | 8/2014 | Kimura et al. |
| 8,816,949 B2 | 8/2014 | Tobita |
| 9,064,753 B2 | 6/2015 | Miyake |
| 9,070,593 B2 | 6/2015 | Umezaki |
| 9,099,562 B2 | 8/2015 | Akimoto et al. |
| 9,214,473 B2 | 12/2015 | Umezaki |
| 9,461,071 B2 | 10/2016 | Umezaki |
| 9,954,010 B2 | 4/2018 | Umezaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0002615 A1 | 1/2003 | Morosawa et al. |
| 2003/0043104 A1 | 3/2003 | Lee et al. |
| 2003/0137503 A1 | 7/2003 | Kimura et al. |
| 2003/0184512 A1 | 10/2003 | Hayashi et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0061547 A1 | 4/2004 | Miyazaki et al. |
| 2004/0127038 A1 | 7/2004 | Carcia et al. |
| 2005/0007183 A1* | 1/2005 | Miyazaki ....... H03K 19/018585 327/534 |
| 2005/0017302 A1 | 1/2005 | Hoffman |
| 2005/0122052 A1 | 6/2005 | Horiuchi et al. |
| 2005/0199959 A1 | 9/2005 | Chiang et al. |
| 2005/0285840 A1 | 12/2005 | Jang et al. |
| 2006/0007085 A1 | 1/2006 | Kim et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0227093 A1* | 10/2006 | Jang .................. G11C 19/28 345/100 |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0280279 A1 | 12/2006 | Nagao et al. |
| 2006/0284171 A1 | 12/2006 | Levy et al. |

(56) References Cited

U.S. PATENT DOCUMENTS

| | | |
|---|---|---|
| 2006/0284172 A1 | 12/2006 | Ishii |
| 2006/0291610 A1 | 12/2006 | Lo et al. |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0086558 A1 | 4/2007 | Wei et al. |
| 2007/0090365 A1 | 4/2007 | Hayashi et al. |
| 2007/0108446 A1 | 5/2007 | Akimoto |
| 2007/0151144 A1 | 7/2007 | Hou et al. |
| 2007/0152217 A1 | 7/2007 | Lai et al. |
| 2007/0159742 A1 | 7/2007 | Iwabuchi et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0236640 A1 | 10/2007 | Kimura |
| 2007/0247932 A1 | 10/2007 | Tobita |
| 2007/0252928 A1 | 11/2007 | Ito et al. |
| 2007/0272922 A1 | 11/2007 | Kim et al. |
| 2007/0272982 A1 | 11/2007 | Sato |
| 2007/0284627 A1 | 12/2007 | Kimura |
| 2007/0287296 A1 | 12/2007 | Chang |
| 2008/0006877 A1 | 1/2008 | Mardilovich et al. |
| 2008/0007296 A1 | 1/2008 | Umezaki |
| 2008/0013670 A1 | 1/2008 | Lo et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0079701 A1 | 4/2008 | Shin et al. |
| 2008/0083950 A1 | 4/2008 | Pan et al. |
| 2008/0106191 A1 | 5/2008 | Kawase |
| 2008/0117157 A1 | 5/2008 | Hwang et al. |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0211760 A1 | 9/2008 | Baek et al. |
| 2008/0224133 A1 | 9/2008 | Park et al. |
| 2008/0253499 A1 | 10/2008 | Chan et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0258998 A1 | 10/2008 | Miyake |
| 2008/0296568 A1 | 12/2008 | Ryu et al. |
| 2008/0308805 A1 | 12/2008 | Akimoto et al. |
| 2009/0021662 A1 | 1/2009 | Chang |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0224245 A1 | 9/2009 | Umezaki |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0104851 A1 | 5/2011 | Akimoto et al. |
| 2011/0121290 A1 | 5/2011 | Akimoto et al. |
| 2011/0193622 A1 | 8/2011 | Miyake |
| 2013/0314139 A1 | 11/2013 | Umezaki |
| 2014/0334596 A1 | 11/2014 | Kimura et al. |
| 2014/0346506 A1 | 11/2014 | Kimura et al. |
| 2015/0340513 A1 | 11/2015 | Akimoto et al. |
| 2017/0062483 A1 | 3/2017 | Kimura et al. |
| 2018/0240817 A1 | 8/2018 | Umezaki |
| 2019/0051759 A1 | 2/2019 | Akimoto et al. |

FOREIGN PATENT DOCUMENTS

| | | |
|---|---|---|
| CN | 101187743 A | 5/2008 |
| EP | 0696803 A | 2/1996 |
| EP | 1737044 A | 12/2006 |
| EP | 1770788 A | 4/2007 |
| EP | 1870877 A | 12/2007 |
| EP | 1918904 A | 5/2008 |
| EP | 1923859 A | 5/2008 |
| EP | 1978502 A | 10/2008 |
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-087897 A | 4/1996 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-160299 A | 6/2001 |
| JP | 2002-076356 A | 3/2002 |
| JP | 2002-197885 A | 7/2002 |
| JP | 2002-289859 A | 10/2002 |
| JP | 2003-086000 A | 3/2003 |
| JP | 2003-086808 A | 3/2003 |
| JP | 2003-228053 A | 8/2003 |
| JP | 2003-346492 A | 12/2003 |
| JP | 2004-103957 A | 4/2004 |
| JP | 2004-193248 A | 7/2004 |
| JP | 2004-273614 A | 9/2004 |
| JP | 2004-273732 A | 9/2004 |
| JP | 2004-295126 A | 10/2004 |
| JP | 2004-334216 A | 11/2004 |
| JP | 2005-277323 A | 10/2005 |
| JP | 2006-024350 A | 1/2006 |
| JP | 2006-164477 A | 6/2006 |
| JP | 2006-293299 A | 10/2006 |
| JP | 2006-351165 A | 12/2006 |
| JP | 2006-351171 A | 12/2006 |
| JP | 2007-011336 A | 1/2007 |
| JP | 2007-108453 A | 4/2007 |
| JP | 2007-207411 A | 8/2007 |
| JP | 2007-316110 A | 12/2007 |
| JP | 2008-003602 A | 1/2008 |
| JP | 2008-009393 A | 1/2008 |
| JP | 2008-058939 A | 3/2008 |
| JP | 2008-107807 A | 5/2008 |
| JP | 2008-122939 A | 5/2008 |
| JP | 2008-134625 A | 6/2008 |
| JP | 2008-140490 A | 6/2008 |
| JP | 2008-140522 A | 6/2008 |
| JP | 2008-146079 A | 6/2008 |
| JP | 2008-205767 A | 9/2008 |
| JP | 2008-251084 A | 10/2008 |
| JP | 2008-251094 A | 10/2008 |
| JP | 2008-297753 A | 12/2008 |
| JP | 2009-004757 A | 1/2009 |
| JP | 2009-021612 A | 1/2009 |
| JP | 2010-192019 A | 9/2010 |
| KR | 2004-0067881 A | 7/2004 |
| KR | 2004-0078422 A | 9/2004 |
| KR | 2007-0070087 A | 7/2007 |
| KR | 2007-0093912 A | 9/2007 |
| KR | 2007-0105271 A | 10/2007 |
| KR | 2008-0030212 A | 4/2008 |
| KR | 2008-0081822 A | 9/2008 |
| KR | 2008-0090978 A | 10/2008 |
| KR | 2008-0104726 A | 12/2008 |
| KR | 2009-0007958 A | 1/2009 |
| KR | 2009-0013811 A | 2/2009 |

(56) References Cited

FOREIGN PATENT DOCUMENTS

| | | |
|---|---|---|
| WO | WO-2004/104981 | 12/2004 |
| WO | WO-2004/114391 | 12/2004 |
| WO | WO-2008/029717 | 3/2008 |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn-O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2: Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

(56) References Cited

OTHER PUBLICATIONS

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW'08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m <4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Korean Office Action (Application No. 2010-0025567) dated Feb. 20, 2016.

Korean Office Action (Application No. 2017-0072981) dated Sep. 27, 2018.

* cited by examiner

PRIOR ART

PRIOR ART

PRIOR ART

PRIOR ART

PRIOR ART

SEMICONDUCTOR DEVICE

CROSS-REFERENCE TO RELATED APPLICATIONS

This application is a continuation of U.S. application Ser. No. 17/408,572, filed Aug. 23, 2021, now allowed, which is a continuation of U.S. application Ser. No. 16/925,381, filed Jul. 10, 2020, now U.S. Pat. No. 11,127,858, which is a continuation of U.S. application Ser. No. 16/416,394, filed May 20, 2019, now U.S. Pat. No. 10,714,630, which is a continuation of U.S. application Ser. No. 16/244,193, filed Jan. 10, 2019, now U.S. Pat. No. 10,297,693, which is a continuation of U.S. application Ser. No. 16/022,806, filed Jun. 29, 2018, now U.S. Pat. No. 10,181,530, which is a continuation of U.S. application Ser. No. 15/168,293, filed May 31, 2016, now U.S. Pat. No. 10,026,848, which is a continuation of U.S. application Ser. No. 13/975,422, filed Aug. 26, 2013, now U.S. Pat. No. 9,362,412, which is a continuation of U.S. application Ser. No. 12/731,722, filed Mar. 25, 2010, now U.S. Pat. No. 8,519,929, which claims the benefit of a foreign priority application filed in Japan as Serial No. 2009-077955 on Mar. 27, 2009, all of which are incorporated by reference.

BACKGROUND OF THE INVENTION

1. Field of the Invention

The present invention relates to semiconductor devices, display devices, liquid crystal display devices, light-emitting devices, driving methods thereof, or production methods thereof. In particular, the present invention relates to semiconductor devices, display devices, liquid crystal display devices, or light-emitting devices each including a driver circuit formed over the same substrate as a pixel portion, or driving methods thereof. Alternatively, the present invention relates to electronic devices including the semiconductor devices, the display devices, the liquid crystal display devices, or the light-emitting devices.

2. Description of the Related Art

In recent years, with the increase of large display devices such as liquid crystal televisions, display devices have actively developed. In particular, a technique for forming a driver circuit such as a gate driver over the same substrate as a pixel portion with the use of a transistor formed using a non-single-crystal semiconductor has actively developed because the technique greatly contributes to reduction in cost and improvement in reliability (see Reference 1).

REFERENCE

Reference 1: Japanese Published Patent Application No. 2006-293299

SUMMARY OF THE INVENTION

It is an object of one embodiment of the present invention to improve display quality by reduction in malfunctions of a circuit. Alternatively, it is an object of one embodiment of the present invention to reduce signal distortion or signal delay. Alternatively, it is an object of one embodiment of the present invention to suppress degradation in characteristics of a transistor. Alternatively, it is an object of one embodiment of the present invention to decrease the channel width of a transistor. Alternatively, it is an object of one embodiment of the present invention to decrease a layout area. Alternatively, it is an object of one embodiment of the present invention to reduce the frame of a display device. Alternatively, it is an object of one embodiment of the present invention to obtain a higher-definition display device. Alternatively, it is an object of one embodiment of the present invention to reduce cost. Note that the description of these objects does not impede the existence of other objects. Note that one embodiment of the present invention does not necessarily achieve all the above objects.

One embodiment of the present invention is a semiconductor device which includes a driver circuit formed using a plurality of pulse output circuits having first to third transistors and first to fourth terminals respectively connected to first to fourth signal lines, and a pixel. In the driver circuit, a first terminal of the first transistor is electrically connected to the first signal line; a second terminal of the first transistor is electrically connected to the fourth signal line; a gate and a first terminal of the second transistor are electrically connected to the third signal line; a first terminal of the third transistor is electrically connected to the third signal line; a gate of the third transistor is electrically connected to the second signal line; a gate of the first transistor, a second terminal of the second transistor, and a second terminal of the third transistor are electrically connected to each other. A first clock signal is supplied to the first signal line. A second clock signal is supplied to the second signal line. A preceding stage signal is supplied to the third signal line. An output signal is output from the fourth signal line. Duty ratios of the first clock signal and the second clock signal are different from each other.

In a semiconductor device according to one embodiment of the present invention, a period during which the second clock signal is changed from an L-level signal to an H-level signal after the first clock signal is changed from an H-level signal to an L-level signal may be longer than a period during which the preceding stage signal is changed from an L-level signal to an H-level signal.

In a semiconductor device according to one embodiment of the present invention, the driver circuit may include a control circuit, a fourth transistor, and a fifth transistor. A first terminal of the fourth transistor is electrically connected to the fourth signal line. A second terminal of the fourth transistor is electrically connected to a wiring for supplying a low power supply potential. A first terminal of the fifth transistor is electrically connected to a node where the gate of the first transistor, the second terminal of the second transistor, and the second terminal of the third transistor are electrically connected to each other. A second terminal of the fifth transistor is electrically connected to the wiring for supplying a low power supply potential. The control circuit may control potentials of gates of the fourth transistor and the fifth transistor depending on a potential of the node where the gate of the first transistor, the second terminal of the second transistor, and the second terminal of the third transistor are electrically connected to each other.

In a semiconductor device according to one embodiment of the present invention, the first to fifth transistors may have the same polarity.

In a semiconductor device according to one embodiment of the present invention, the first clock signal may be supplied to a first terminal in a pulse output circuit in an odd-numbered stage; the second clock signal may be supplied to a second terminal in the pulse output circuit in the odd-numbered stage; a third clock signal may be supplied to a first terminal in a pulse output circuit in an even-numbered stage; and a fourth clock signal may be supplied to a second terminal in the pulse output circuit in the even-numbered stage.

Note that a variety of switches can be used as a switch. For example, an electrical switch, a mechanical switch, or the like can be used as a switch. That is, any element can be used as a switch as long as it can control current, without limitation to a certain element. For example, a transistor (e.g., a bipolar transistor or a MOS transistor), a diode (e.g., a PN diode, a PIN diode, a Schottky diode, an MIM (metal insulator metal) diode, an MIS (metal insulator semiconductor) diode, or a diode-connected transistor), a logic circuit in which such elements are combined, or the like can be used as a switch. An example of a mechanical switch is a switch formed using a MEMS (micro electro mechanical system) technology, such as a digital micromirror device (DMD). Such a switch includes an electrode which can be moved mechanically, and operates by controlling conduction and non-conduction in accordance with movement of the electrode.

Note that in the case of using a transistor as a switch, the polarity (conductivity type) of the transistor is not particularly limited to a certain type because it operates just as a switch.

Note that a CMOS switch may be used as a switch with the use of both an n-channel transistor and a p-channel transistor.

Note that a display element, a display device which is a device including a display element, a light-emitting element, and a light-emitting device which is a device including a light-emitting element can employ various modes and can include various elements. For example, a display medium, whose contrast, luminance, reflectivity, transmittance, or the like changes by electromagnetic action, such as an EL (electroluminescence) element (e.g., an EL element including organic and inorganic materials, an organic EL element, or an inorganic EL element), an LED (e.g., a white LED, a red LED, a green LED, or a blue LED), a transistor (a transistor which emits light depending on the amount of current), an electron emitter, a liquid crystal element, electronic ink, an electrophoretic element, a grating light valve (GLV), a plasma display panel (PDP), a digital micromirror device (DMD), a piezoelectric ceramic display, or a carbon nanotube, can be used in a display element, a display device, a light-emitting element, or a light-emitting device. Display devices having EL elements include an EL display and the like. Display devices having electron emitters include a field emission display (FED), an SED-type flat panel display (SED: surface-conduction electron-emitter display), and the like. Display devices having liquid crystal elements include a liquid crystal display (e.g., a transmissive liquid crystal display, a transflective liquid crystal display, a reflective liquid crystal display, a direct-view liquid crystal display, or a projection liquid crystal display) and the like. Display devices having electronic ink or electrophoretic elements include electronic paper and the like.

For example, an element which controls transmission or non-transmission of light by optical modulation action of liquid crystals can be used as a liquid crystal element. The element can include a pair of electrodes and liquid crystals. Note that the optical modulation action of liquid crystals is controlled by an electric field applied to the liquid crystals (including a horizontal electric field, a vertical electric field, and a diagonal electric field). Note that in specific, the following can be used for a liquid crystal element, for example: a nematic liquid crystal, a cholesteric liquid crystal, a smectic liquid crystal, a discotic liquid crystal, a thermotropic liquid crystal, a lyotropic liquid crystal, a low-molecular liquid crystal, a high-molecular liquid crystal, a polymer dispersed liquid crystal (PDLC), a ferroelectric liquid crystal, an anti-ferroelectric liquid crystal, a main-chain liquid crystal, a side-chain high-molecular liquid crystal, a plasma addressed liquid crystal (PALC), a banana-shaped liquid crystal, and the like. In addition, the following can be used as a diving method of a liquid crystal: a TN (twisted nematic) mode, an STN (super twisted nematic) mode, an IPS (in-plane-switching) mode, an FFS (fringe field switching) mode, an MVA (multi-domain vertical alignment) mode, a PVA (patterned vertical alignment) mode, an ASV (advanced super view) mode, an ASM (axially symmetric aligned microcell) mode, an OCB (optically compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a guest-host mode, a blue phase mode, and the like. Note that the present invention is not limited to this, and a variety of liquid crystal elements and driving methods thereof can be used as a liquid crystal element and a driving method thereof.

Note that transistors with a variety of structures can be used as a transistor, without limitation to a certain type. For example, a thin film transistor (TFT) including a non-single-crystal semiconductor film typified by amorphous silicon, polycrystalline silicon, microcrystalline (also referred to as microcrystal, nanocrystal, or semi-amorphous) silicon, or the like can be used as a transistor.

Note that for example, a transistor including a compound semiconductor or an oxide semiconductor, such as ZnO, a-InGaZnO, SiGe, GaAs, IZO, ITO, SnO, TiO, or AlZnSnO (AZTO), a thin film transistor obtained by thinning such a compound semiconductor or an oxide semiconductor, or the like can be used as a transistor. Thus, manufacturing temperature can be lowered and for example, such a transistor can be formed at room temperature. Accordingly, the transistor can be formed directly on a substrate having low heat resistance, such as a plastic substrate or a film substrate. Note that such a compound semiconductor or an oxide semiconductor can be used not only for a channel portion of the transistor but also for other applications. For example, such a compound semiconductor or an oxide semiconductor can be used for a wiring, a resistor, a pixel electrode, a light-transmitting electrode, or the like. Since such an element can be formed at the same time as the transistor, cost can be reduced.

Note that for example, a transistor or the like formed by an inkjet method or a printing method can be used as a transistor. Thus, a transistor can be formed at room temperature, can be formed at a low vacuum, or can be formed using a large substrate. Therefore, the transistor can be formed without use of a mask (reticle), so that the layout of the transistor can be changed easily. Alternatively, since the transistor can be formed without use of a resist, material cost is reduced and the number of steps can be reduced. Further, since a film can be formed where needed, a material is not wasted as compared to a manufacturing method by which etching is performed after the film is formed over the entire surface, so that cost can be reduced.

Note that for example, a transistor or the like including an organic semiconductor or a carbon nanotube can be used as a transistor. Thus, such a transistor can be formed over a flexible substrate. A semiconductor device formed using such a substrate can resist shocks.

Note that transistors with a variety of different structures can be used as a transistor. For example, a MOS transistor, a junction transistor, a bipolar transistor, or the like can be used as a transistor.

Note that for example, a transistor with a multi-gate structure having two or more gate electrodes can be used as a transistor. With the multi-gate structure, a structure where a plurality of transistors are connected in series is provided because channel regions are connected in series.

Note that for example, a transistor with a structure where gate electrodes are formed above and below a channel can be used as a transistor. With the structure where the gate electrodes are formed above and below the channel, a circuit structure where a plurality of transistors are connected in parallel is provided.

Note that for example, a transistor with a structure where a gate electrode is formed above a channel region, a structure where a gate electrode is formed below a channel region, a staggered structure, an inverted staggered structure, a structure where a channel region is divided into a plurality of regions, a structure where channel regions are connected in parallel or in series, or the like can be used as a transistor.

Note that for example, a transistor with a structure where a source electrode or a drain electrode overlaps with a channel region (or part of it) can be used as a transistor.

Note that for example, a transistor with a structure where an LDD region is provided can be used as a transistor.

Note that a transistor can be formed using a variety of substrates, without limitation to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. As a glass substrate, a barium borosilicate glass substrate, an aluminoborosilicate glass substrate, a soda-lime glass substrate, or the like can be used, for example. For a flexible substrate, a flexible synthetic resin such as plastics typified by polyethylene terephthalate (PET), polyethylene naphthalate (PEN), or polyether sulfone (PES), or acrylic can be used, for example. For an attachment film, polypropylene, polyester, vinyl, polyvinyl fluoride, polyvinyl chloride, or the like can be used for example. For a base material film, polyester, polyamide, polyimide, an inorganic vapor deposition film, paper, or the like can be used, for example.

Note that the transistor may be formed using one substrate, and then, the transistor may be transferred to another substrate. In addition to the above substrates over which the transistor can be formed, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, or the like can be used as a substrate to which the transistor is transferred.

Note that all the circuits that are necessary to realize a predetermined function can be formed using the same substrate (e.g., a glass substrate, a plastic substrate, a single crystal substrate, or an SOI substrate). Thus, cost can be reduced by reduction in the number of components and reliability can be improved by reduction in the number of connections to circuit components.

Note that it is possible not to form all the circuits that are necessary to realize the predetermined function over the same substrate. That is, some of the circuits which are necessary to realize the predetermined function can be formed using one substrate and some of the circuits which are necessary to realize the predetermined function can be formed using another substrate. For example, some of the circuits which are necessary to realize the predetermined function can be formed using a glass substrate and some of the circuits which are necessary to realize the predetermined function can be formed using a single crystal substrate (or an SOI substrate). The single crystal substrate over which some of the circuits which are necessary to realize the predetermined function (such a substrate is also referred to as an IC chip) can be connected to the glass substrate by COG (chip on glass), and the IC chip can be provided over the glass substrate. Alternatively, the IC chip can be connected to the glass substrate by TAB (tape automated bonding), COF (chip on film), SMT (surface mount technology), a printed circuit board, or the like.

Note that a transistor is an element having at least three terminals: a gate, a drain, and a source. The transistor has a channel region between a drain region and a source region, and current can flow through the drain region, the channel region, and the source region. Here, since the source and the drain of the transistor change depending on the structure, the operating condition, and the like of the transistor, it is difficult to define which is a source or a drain. Thus, a region which serves as a source or a region which serves as a drain is not referred to as a source or a drain in some cases. In that case, one of the source and the drain might be referred to as a first terminal, a first electrode, or a first region, and the other of the source and the drain might be referred to as a second terminal, a second electrode, or a second region, for example.

Note that a transistor may be an element having at least three terminals: a base, an emitter, and a collector. Also in this case, one of the emitter and the collector might be referred to as a first terminal, a first electrode, or a first region, and the other of the emitter and the collector might be referred to as a second terminal, a second electrode, or a second region, for example. Note that in the case where a bipolar transistor is used as the transistor, the term "gate" can be replaced with the term "base".

Note that when it is explicitly described that "A and B are connected", the case where A and B are electrically connected, the case where A and B are functionally connected, and the case where A and B are directly connected are included therein. Here, each of A and B is an object (e.g., a device, an element, a circuit, a wiring, an electrode, a terminal, a conductive film, or a layer). Accordingly, another element may be interposed between elements having a connection relation illustrated in drawings and texts, without limitation to a predetermined connection relation, for example, the connection relation illustrated in the drawings and the texts.

For example, in the case where A and B are electrically connected, one or more elements which enable electrical connection between A and B (e.g., a switch, a transistor, a capacitor, an inductor, a resistor, and/or a diode) can be connected between A and B.

For example, in the case where A and B are functionally connected, one or more circuits which enable functional connection between A and B (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a dc-dc converter, a step-up dc-dc converter, or a step-down dc-dc converter) or a level shifter circuit for changing a potential level of a signal; a voltage source; a current source; a switching circuit; an amplifier circuit such as a circuit which can increase signal amplitude, the amount of current, or the like, an operational amplifier, a differential amplifier circuit, a source follower circuit, or a buffer circuit; a signal generation circuit; a memory circuit; and/or a control circuit) can be connected between A and B. Note that for example, in the case where a signal output from A is transmitted to B even when another circuit is interposed between A and B, A and B are functionally connected.

Note that when it is explicitly described that "A and B are electrically connected", the case where A and B are electrically connected (i.e., the case where A and B are connected with another element or another circuit interposed therebetween), the case where A and B are functionally connected (i.e., the case where A and B are functionally connected with another circuit interposed therebetween), and the case where A and B are directly connected (i.e., the case where A and B are connected without another element or another circuit interposed therebetween) are included therein. That is, when it is explicitly described that "A and B are electrically connected", the description is the same as the case where it is explicitly only described that "A and B are connected".

Note that when it is explicitly described that "B is formed on A" or "B is formed over A", it does not necessarily mean that B is formed in direct contact with A. The description includes the case where A and B are not in direct contact with each other, i.e., the case where another object is interposed between A and B. Here, each of A and B is an object (e.g., a device, an element, a circuit, a wiring, an electrode, a terminal, a conductive film, or a layer).

Accordingly, for example, when it is explicitly described that "a layer B is formed on (or over) a layer A", it includes both the case where the layer B is formed in direct contact with the layer A, and the case where another layer (e.g., a layer C or a layer D) is formed in direct contact with the layer A and the layer B is formed in direct contact with the layer C or the layer D. Note that another layer (e.g., a layer C or a layer D) may be a single layer or a plurality of layers.

In a similar manner, when it is explicitly described that "B is formed above A", it does not necessarily mean that B is formed in direct contact with A, and another object may be interposed therebetween. Thus, for example, when it is described that "a layer B is formed above a layer A", it includes both the case where the layer B is formed in direct contact with the layer A, and the case where another layer (e.g., a layer C or a layer D) is formed in direct contact with the layer A and the layer B is formed in direct contact with the layer C or the layer D. Note that another layer (e.g., a layer C or a layer D) may be a single layer or a plurality of layers.

Note that when it is explicitly described that "B is formed on A", "B is formed over A", or "B is formed above A", it includes the case where B is formed obliquely over/above A.

Note that the same can be said when it is described that "B is formed under A" or "B is formed below A".

Note that when an object is explicitly described in a singular form, the object is preferably singular. Note that the present invention is not limited to this, and the object can be plural. In a similar manner, when an object is explicitly described in a plural form, the object is preferably plural. Note that the present invention is not limited to this, and the object can be singular.

Note that size, the thickness of layers, or regions in the drawings are exaggerated for simplicity in some cases. Thus, embodiments of the present invention are not limited to such scales illustrated in the drawings.

Note that the drawings are perspective views of ideal examples, and shapes or values are not limited to those illustrated in the drawings. For example, the following can be included: variation in shape due to a manufacturing technique; variation in shape due to an error; variation in signal, voltage, or current due to noise; variation in signal, voltage, or current due to a difference in timing: or the like.

Note that technical terms are used in order to describe a specific embodiment, example, or the like in many cases. However, one embodiment of the present invention should not be construed as being limited by the technical terms.

Note that terms which are not defined (including terms used for science and technology, such as technical terms or academic parlance) can be used as terms which have meaning equal to general meaning that an ordinary person skilled in the art understands. It is preferable that terms defined by dictionaries or the like be construed as consistent meaning with the background of related art.

Note that terms such as "first", "second", "third", and the like are used for distinguishing various elements, members, regions, layers, and areas from others. Therefore, the terms such as "first", "second", "third", and the like do not limit the number of the elements, members, regions, layers, areas, or the like. Further, for example, the term "first" can be replaced with the term "second", "third", or the like.

Note that terms for describing spatial arrangement, such as "over", "above", "under", "below", "laterally", "right", "left", "obliquely", "behind", "front", "inside", "outside", and "in" are often used for briefly showing a relationship between an element and another element or between a feature and another feature with reference to a diagram. Note that embodiments of the present invention are not limited to this, and such terms for describing spatial arrangement can indicate not only the direction illustrated in a diagram but also another direction. For example, when it is explicitly described that "B is over A", it does not necessarily mean that B is placed over A, and can include the case where B is placed under A because a device in a diagram can be inverted or rotated by 180°. Accordingly, "over" can refer to the direction described by "under" in addition to the direction described by "over". Note that embodiments of the present invention are not limited to this, and "over" can refer to any of the other directions described by "laterally", "right", "left", "obliquely", "behind", "front", "inside", "outside", and "in" in addition to the directions described by "over" and "under" because the device in the diagram can be rotated in a variety of directions. That is, the terms for describing spatial arrangement can be construed adequately depending on the situation.

In one embodiment of the present invention, display quality can be improved by reduction in malfunctions of a circuit. Alternatively, in one embodiment of the present invention, signal distortion or signal delay can be reduced. Alternatively, in one embodiment of the present invention, degradation in characteristics of a transistor can be suppressed. Alternatively, in one embodiment of the present invention, the channel width of a transistor can be decreased. Alternatively, in one embodiment of the present invention, a layout area can be decreased. Alternatively, in one embodiment of the present invention, the frame of a display device can be reduced. Alternatively, in one embodiment of the present invention, a higher-definition display device can be obtained. Alternatively, in one embodiment of the present invention, cost can be reduced.

DETAILED DESCRIPTION OF THE INVENTION

Figure 1A:
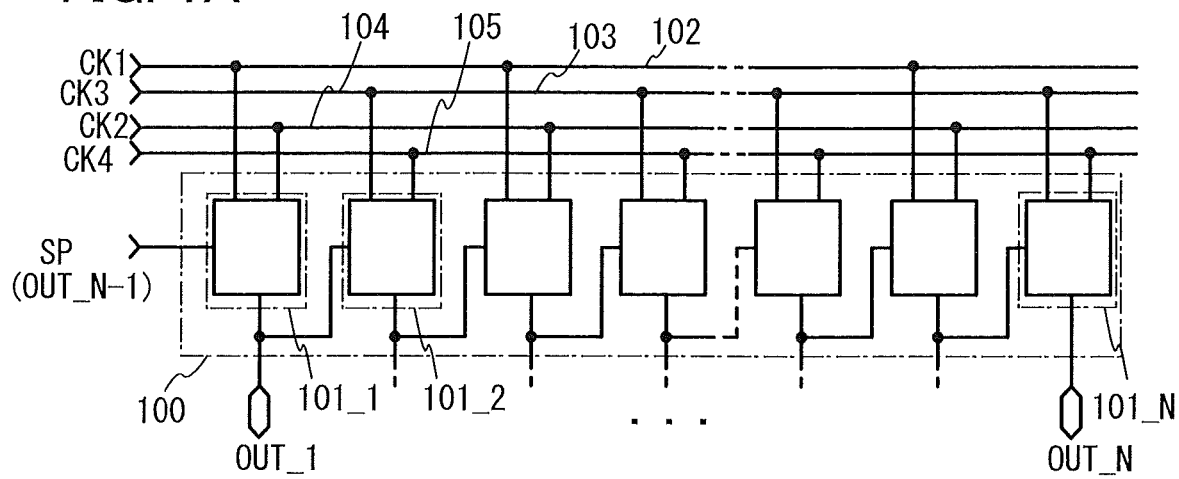
FIGS. 1A to 1D are circuit diagrams of a semiconductor device.

Hereinafter, embodiments of the present invention will be described with reference to the drawings. Note that the embodiments can be implemented in various different ways and it will be readily appreciated by those skilled in the art that modes and details of the embodiments can be changed in various ways without departing from the spirit and scope of the present invention. Therefore, the present invention should not be construed as being limited to the following description of the embodiments. Note that in structures described below, the same portions or portions having similar functions are denoted by common reference numerals in different drawings, and description thereof is not repeated.

Note that a content (or may be part of the content) described in one embodiment may be applied to, combined with, or replaced by a different content (or may be part of the different content) described in the embodiment and/or a content (or may be part of the content) described in one or a plurality of different embodiments.

Note that in each embodiment, a content described in the embodiment is a content described with reference to a variety of diagrams or a content described with a text described in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

Embodiment 1

In this embodiment, examples of semiconductor devices are described. The semiconductor device in this embodiment can be used for a shift register, a gate driver, a source driver, a display device, or the like, for example. Note that the semiconductor device in this embodiment can also be referred to as a driver circuit.

First, a semiconductor device which functions as a shift register in a driver circuit is described with reference to FIGS. 1A to 1D, FIGS. 2A and 2B, FIGS. 3A to 3C, FIG. 4, FIGS. 5A and 5B, and FIG. 6. A semiconductor device 100 includes first to N-th pulse output circuits 101_1 to 101N (N≥2) (see FIG. 1A). A first clock signal CK1, a third clock signal CK3, a second clock signal CK2, and a fourth clock signal CK4 are input to the first to N-th pulse output circuits 101_1 to 101_N in the semiconductor device 100 illustrated in FIG. 1A from a first wiring 102, a second wiring 103, a third wiring 104, and a fourth wiring 105, respectively. A start pulse SP or an output signal (also referred to as a preceding stage signal OUT_N−1), which is from the pulse output circuit in the preceding stage, is input to the pulse output circuit in each stage. Further, an output signal OUT_N which is to be output to a gate line, a data line, or the like is output from the pulse output circuit in each stage. Note that in the pulse output circuit, a dummy stage for outputting a signal which does not contribute to display in a display portion may be provided. For example, in a structure where the pulse output circuit is used as a shift register in a gate driver and outputs pulses sequentially to n pieces of gate lines, N pieces of stages (n≤N) may be provided. Note that the number of outputs of an output signal may be plural depending on the loads of portions to which the output signal is output. With a structure where a plurality of output signals corresponding to the loads are output, signal distortion, signal delay, or the like can be suppressed.

Note that the third clock signal CK3 is, for example, a signal whose phase is deviated from the phase of the first clock signal CK1 by 180°. In addition, the first clock signal CK1 may be a signal having a duty ratio of 50%, and the third clock signal CK3 may be a clock signal obtained by inversion of the first clock signal CK1. Note that the fourth clock signal CK4 is, for example, a signal whose phase is deviated from the phase of the second clock signal CK2 by 180°.

Figure 1B:
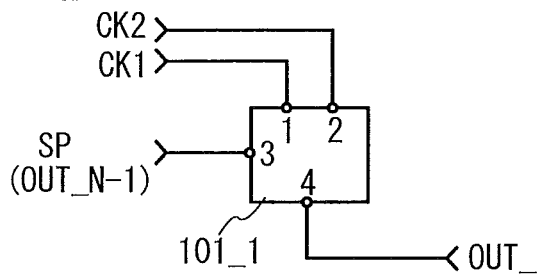
Figure 1C:
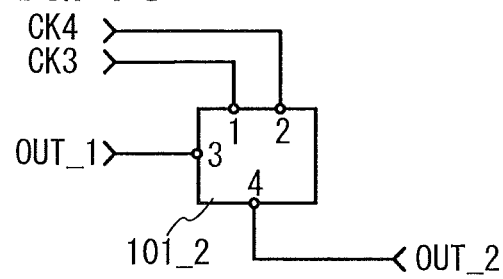

Note that input signals, which are the first clock signal CK1 and the third clock signal CK3, and the second clock signal CK2 and the fourth clock signal CK4, are switched between the pulse output circuit in the odd-numbered stage and the pulse output circuit in the even-numbered stage. In specific, as illustrated in FIG. 1B, in the pulse output circuit 101_1 in the odd-numbered stage (here, a first stage, for example), the first clock signal CK1 is input to a first terminal; the second clock signal CK2 is input to a second terminal; the start pulse SP (the preceding stage signal OUT_N−1 in the odd-numbered stages after a third stage) is input to a third terminal; and the output signal OUT_N is output from a fourth terminal. Further, as illustrated in FIG. 1C, in the pulse output circuit 101_2 in the even-numbered stage (here, a second stage, for example), the third clock signal CK3 is input to a first terminal; the fourth clock signal CK4 is input to a second terminal; the preceding stage signal OUT_1 (the preceding stage signal OUT_N−1 in the even-numbered stages after a fourth stage) is input to a third terminal; an output signal OUT_2 is output from a fourth terminal. Note that the first clock signal CK1 and the third clock signal CK3, and the second clock signal CK2 and the fourth clock signal CK4 are each a signal which is repeatedly changed between an H-level signal (also referred to as a high power supply potential level or an H level) and an L-level signal (also referred to as a low power supply potential level or an L level) every predetermined period.

Figure 1D:
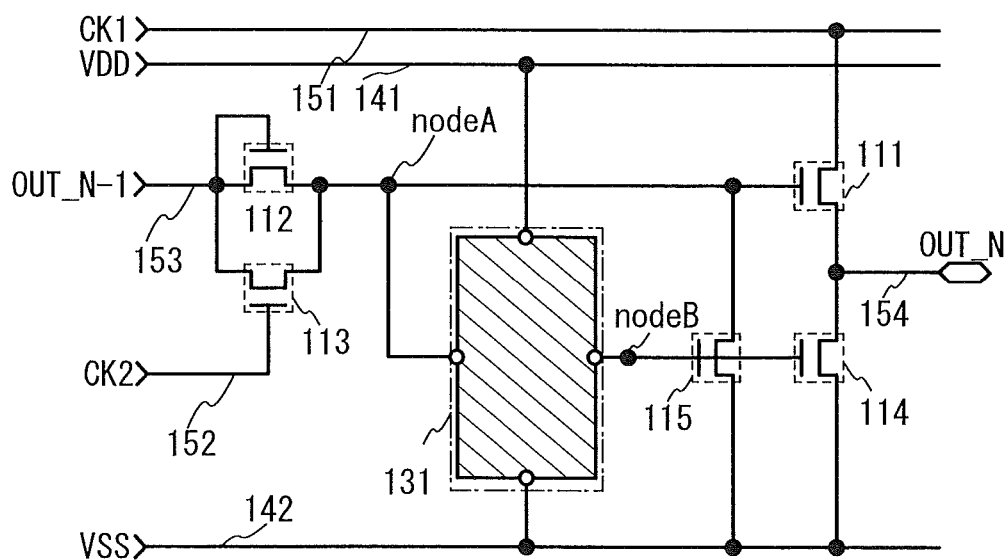

Next, an example of the circuit structure of the pulse output circuit is described with reference to FIG. 1D. Note that in FIG. 1D, the structure of the pulse output circuit in the odd-numbered stage is described as an example. Note that the input signals to the pulse output circuit in the odd-numbered stage and the pulse output circuit in the even-numbered stage differ from each other. That is, the first clock signal CK1 and the third clock signal CK3 are input to the pulse output circuit in the odd-numbered stage, and the second clock signal CK2 and the fourth clock signal CK4 are input to the pulse output circuit in the even-numbered stage, as described above.

The pulse output circuit includes first to fifth transistors 111 to 115 and a control circuit 131. In addition, FIG. 1D illustrates the case where a high power supply potential VDD is supplied through a first power supply line 141 and a low power supply potential VSS is supplied through a second power supply line 142, in addition to the above-described signals which are input to the first to fourth terminals. Note that in FIG. 1D, a wiring for inputting the first clock signal CK1 to the first terminal, a wiring for inputting the second clock signal CK2 to the second terminal, a wiring for inputting the preceding stage signal OUT_N−1 to the third terminal, and a wiring for outputting the output signal OUT_N from the fourth terminal are referred to as a first signal line 151, a second signal line 152, a third signal line 153, and a fourth signal line 154, respectively. Note that for description, as illustrated in FIG. 1D, a portion where a gate of the first transistor 111, a second terminal of the second transistor 112, a second terminal of the third transistor 113, and a first terminal of the fifth transistor 115 are connected to each other is denoted by a node A. Further, a portion where a gate of the fourth transistor 114 and a gate of the fifth transistor 115 are connected to each other is denoted by a node B.

A first terminal of the first transistor 111 is connected to the first signal line 151. A second terminal of the first transistor 111 is connected to a first terminal of the fourth transistor 114 and the fourth signal line 154. The gate of the first transistor 111 is connected to the node A. A first terminal of the second transistor 112 is connected to a gate of the second transistor 112, a first terminal of the third transistor 113, and the third signal line 153. The second terminal of the second transistor 112 is connected to the node A. The gate of the second transistor 112 is connected to the first terminal of the second transistor 112, the first terminal of the third transistor 113, and the third signal line 153. The first terminal of the third transistor 113 is connected to the gate of the second transistor 112, the first terminal of the second transistor 112, and the third signal line 153. The second terminal of the third transistor 113 is connected to the node A. A gate of the third transistor 113 is connected to the second signal line 152. A first terminal of the fourth transistor 114 is connected to the second terminal of the first transistor 111 and the fourth signal line 154. A second terminal of the fourth transistor 114 is connected to the second power supply line 142. The gate of the fourth transistor 114 is connected to the node B. The first terminal of the fifth transistor 115 is connected to the node A. A second terminal of the fifth transistor 115 is connected to the second power supply line 142. The gate of the fifth transistor 115 is connected to the node B. The control circuit 131 is a circuit which has a function of controlling the level of a potential of the node B in accordance with a potential of the node A, and is connected to the node A, the first power supply line 141, the second power supply line 142, and the node B.

Note that a capacitor for performing bootstrap operation by setting the gate of the first transistor 111 in a floating state may be additionally provided between the gate of the first transistor 111 and the second terminal of the first transistor 111. When the bootstrap operation can be performed using parasitic capacitance between the gate of the first transistor 111 and the second terminal of the first transistor 111, the capacitor can be eliminated.

Note that voltage refers to a potential difference between a given potential and a ground potential in many cases. Thus, voltage, potential, and potential difference can be interchanged one another.

Note that the first to fifth transistors 111 to 115 preferably have the same polarity and are n-channel transistors in many cases. However, this embodiment is not limited to this. The first to fifth transistors 111 to 115 can be p-channel transistors.

Here, before circuit operation in this embodiment is described in detail, operation in a circuit structure disclosed in Reference 1 is described as a comparative example. Then, advantages of the structure in this embodiment are described in detail. Note that the comparative example illustrated in FIGS. 28A to 28C, FIGS. 29A and 29B, FIGS. 30A and 30B, FIGS. 31A and 31B, and FIG. 32 is described not to be compared to all the structures disclosed in this specification but to be compared to the structure illustrated in FIGS. 1A to 1D.

Figure 5A:
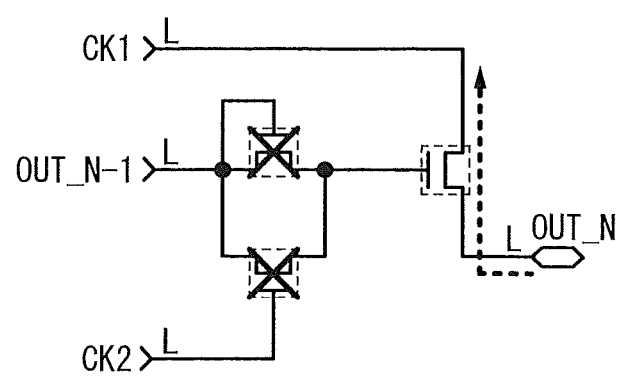
FIGS. 5A and 5B are schematic views for illustrating the operation of the semiconductor device.
Figure 5B:
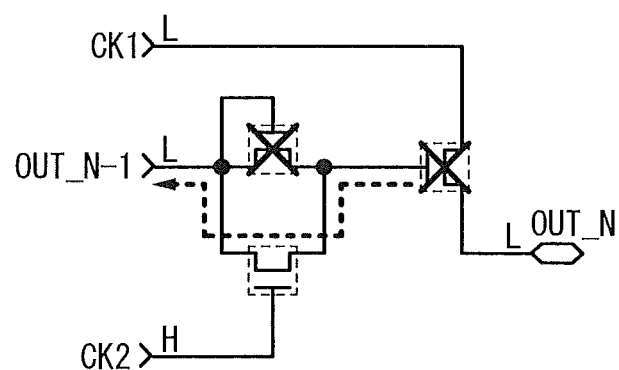
Figure 6:
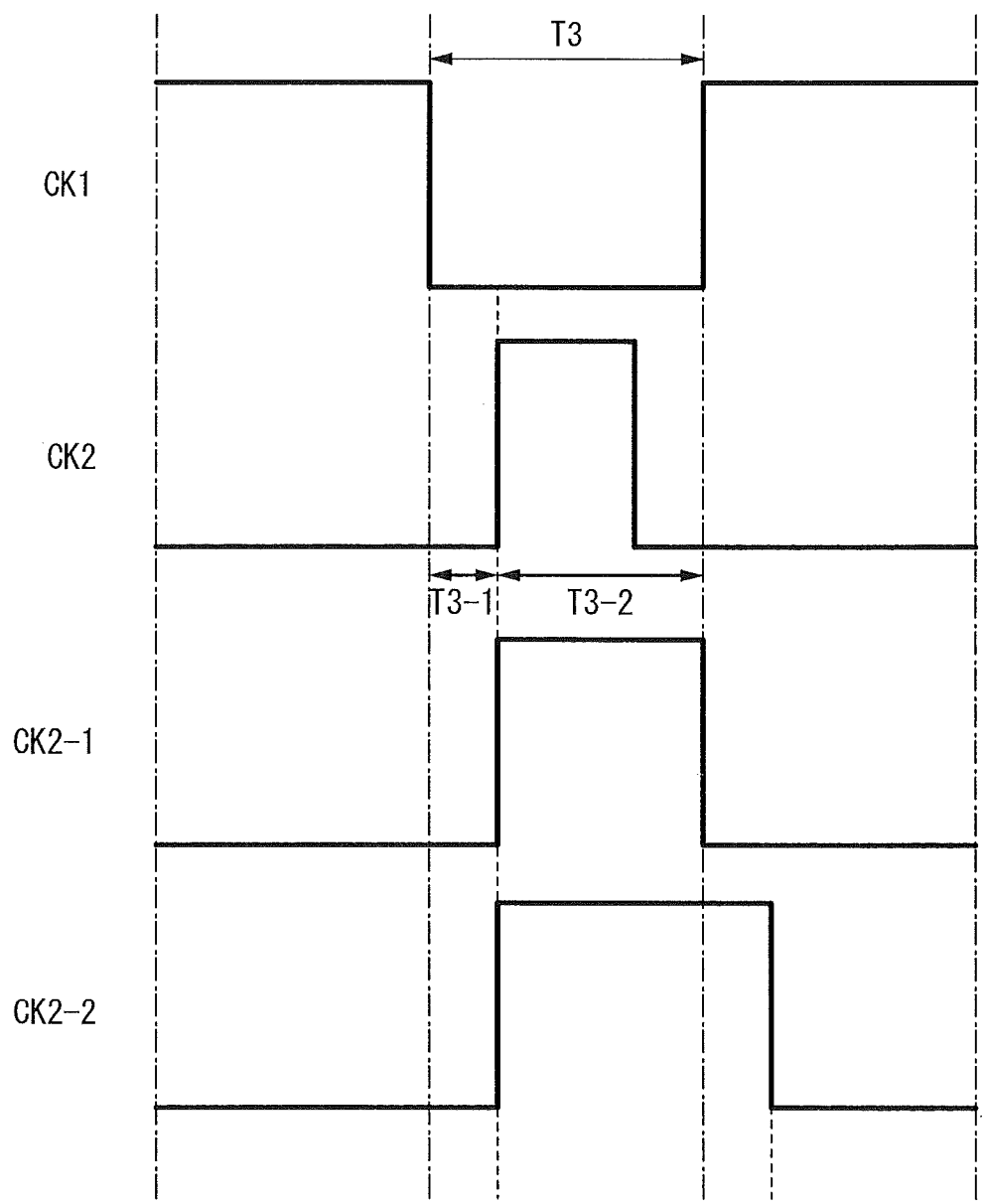
FIG. 6 is a timing chart for illustrating the operation of the semiconductor device.
Figure 28A:
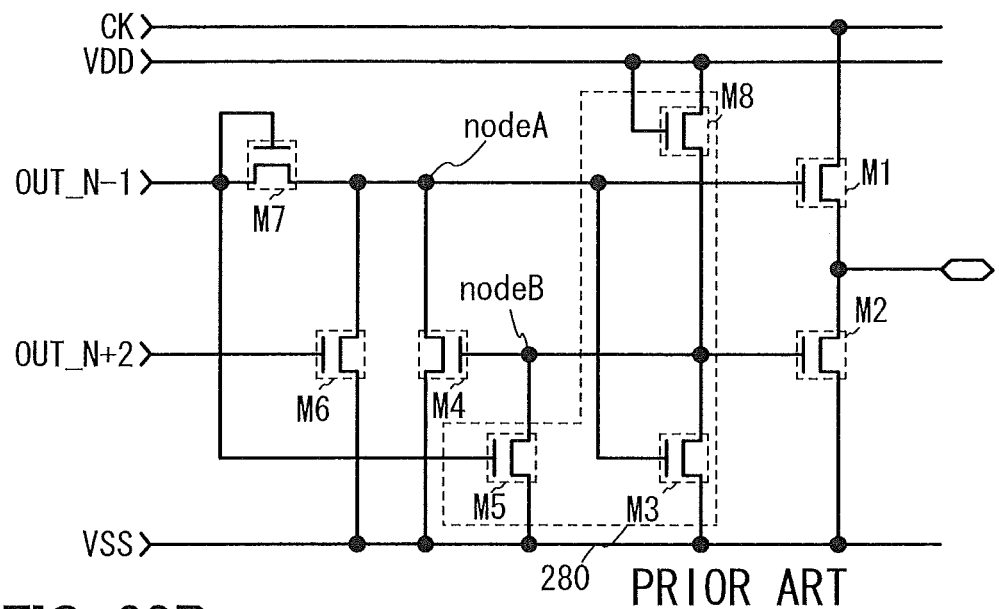
FIGS. 28A to 28C are a circuit diagram of a semiconductor device and timing charts for illustrating the operation of the semiconductor device.
Figure 28B:
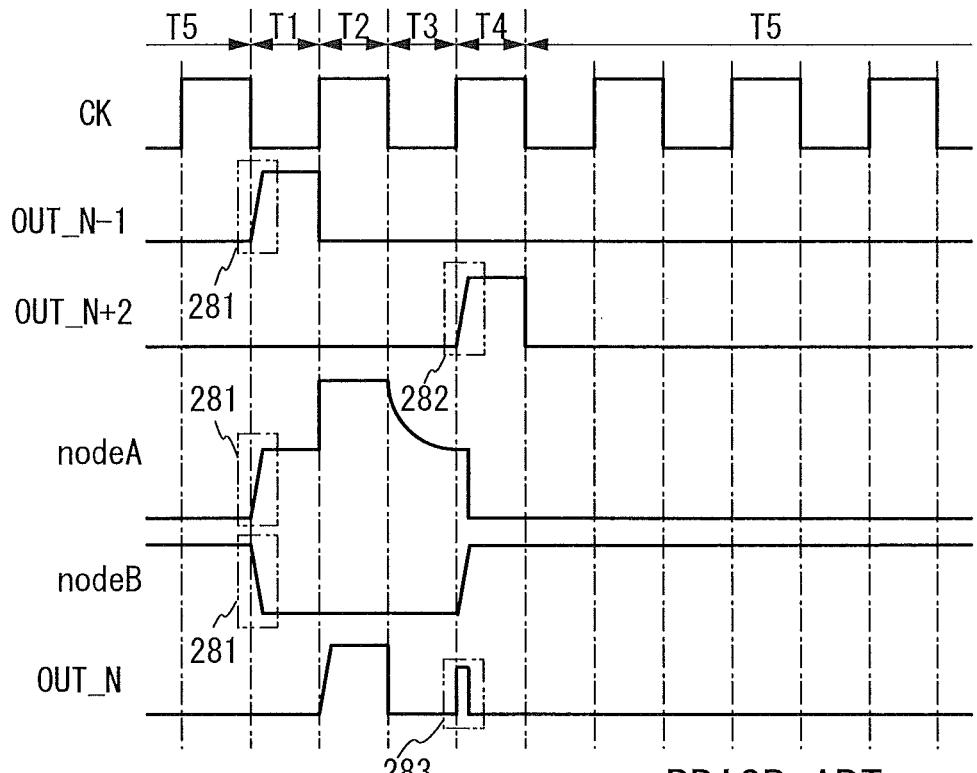
Figure 28C:
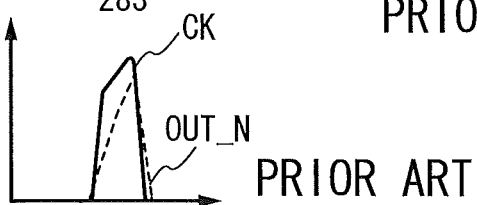

FIG. 28A illustrates transistors M1 to M8 which are included in a shift register in FIG. 5 and FIG. 6 in Reference 1. In the circuit structure disclosed in Reference 1, fall time of the output signal OUT_N in a gate driver can be shortened as illustrated in the timing chart of FIG. 28B. Next, on/off of each transistor and a potential of each wiring are described in FIG. 28B by division of the whole period into a first period T1, a second period T2, a third period T3, a fourth period T4, and a fifth period T5. Note that the potential of each wiring is denoted by "H" (a signal determined by a high power supply potential or an H-level signal) or "L" (a signal determined by a low power supply potential or an L-level signal) for simplicity. Note that FIG. 28C illustrate a specific example of the waveform of the clock signal CK and the output signal OUT_N, as in FIG. 8 in Reference 1. Note that since description in FIGS. 28A to 28C is similar to description in FIG. 6, FIG. 7, and FIG. 8 in Reference 1, description in Reference 1 is incorporated for detailed description. Note that the transistors M3, M5, and M8 provided in a region surrounded by a dotted line 280 in FIG. 28A correspond to a control circuit which has a function of controlling the level of the potential of the node B in accordance with the potential of the node A and controls on/off of the transistor M4. Note that the control circuit is a circuit having a function which is similar to the function of the control circuit 131 illustrated in FIG. 1D in Embodiment 1.

Figure 29A:
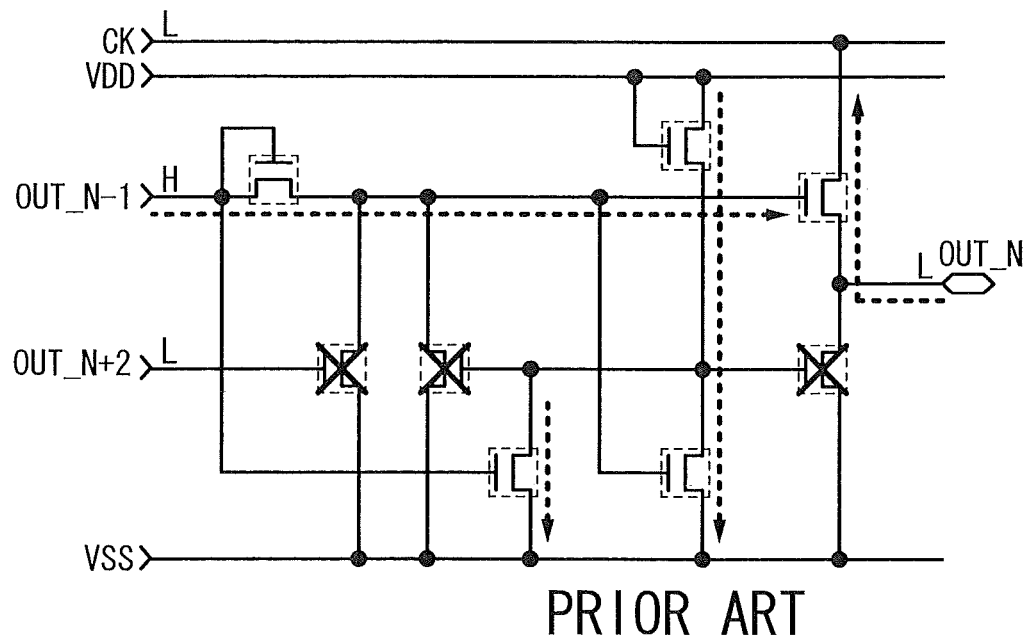
FIGS. 29A and 29B are circuit diagrams of the semiconductor device.
Figure 29B:
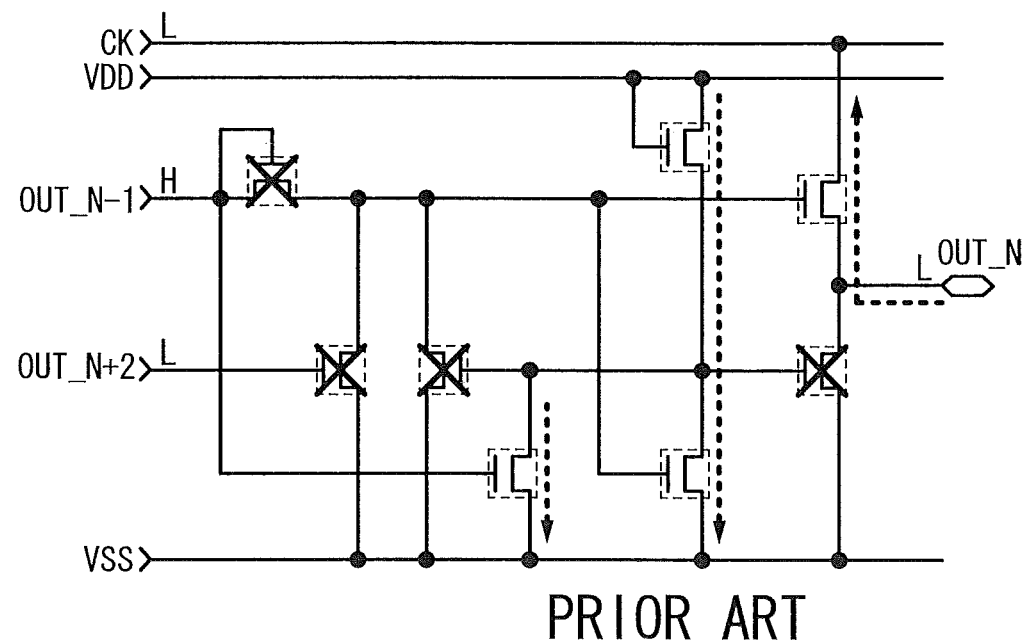
Figure 30A:
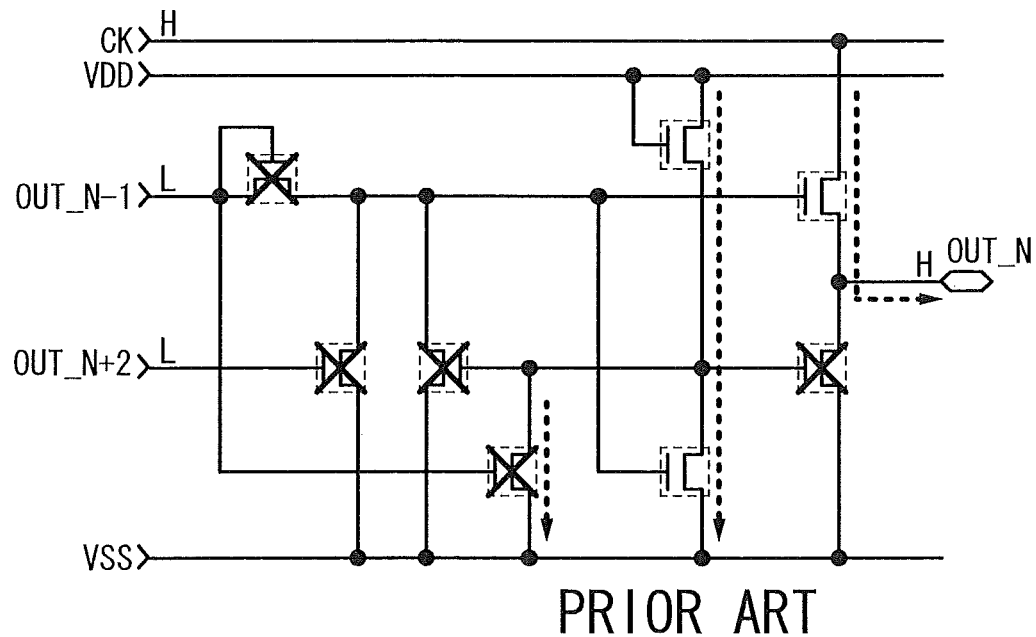
FIGS. 30A and 30B are circuit diagrams of the semiconductor device.
Figure 30B:
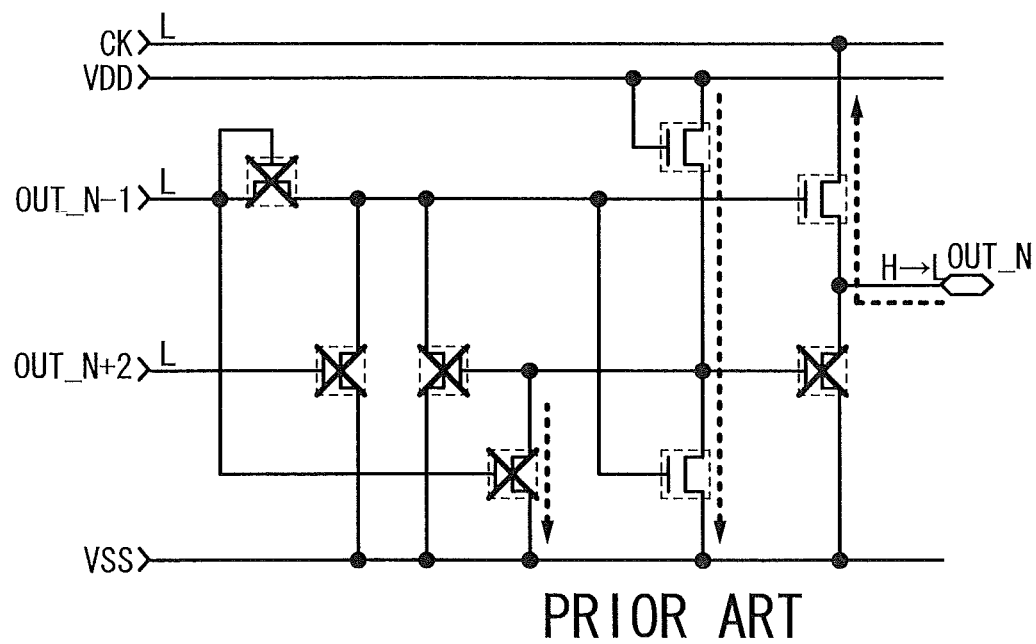

In the first period T1, the operation of the first half is illustrated in FIG. 29A as a period T1–1. Note that "the first half" here refers to a transition period by supply of a predetermined potential in the first period T1. First, the preceding stage signal OUT_N−1, the clock signal CK, and a signal OUT_N+2 for resetting (hereinafter referred to as a reset signal) are an H-level signal, an L-level signal, and an L-level signal, respectively. Accordingly, the potential of the node A is at a potential obtained by addition of the threshold voltage to the low power supply potential VSS (VSS+Vth), and the transistors M1 and M3 (transistors with no marks in the diagrams) are turned on, as illustrated in the diagram. Further, as illustrated in FIG. 29A, the transistors M5, M7, and M8 are turned on and the transistors M2, M4, and M6 are turned off (transistors with × marks in the diagrams). Then, current flows as indicated by dashed arrows in FIG. 29A. Next, the operation of the latter half in the first period T1 is illustrated in FIG. 29B as a period T1–2. Note that "the latter half" here refers to a stationary state after the transition state by supply of a predetermined potential in the first period T1. When current flows as in FIG. 29A, the potential of the node A rises to a potential obtained by subtraction of the threshold voltage from the high power supply potential VDD (VDD−Vth), and the transistor M7 is turned off, as illustrated in FIG. 29B. In this case, the node A is set to be in a floating state. Then, the potential of each wiring in the first period T1 is determined as in FIG. 28B.

Note that FIG. 28B briefly illustrates a waveform when the rise of the output signal OUT_N which corresponds to the preceding stage signal OUT_N−1 in a different stage is delayed as compared to the rise of the clock signal CK, as illustrated in FIG. 28C. The delay of the preceding stage signal OUT_N−1 results in rise in the potential of the node A and fall in the potential of the node B. This is because the load of a wiring or the like connected to a subsequent stage of the transistor M1 is increased, so that the size of the transistor is designed to be larger. Therefore, gate capacitance of the transistor M1 is increased, and it takes longer time to store or release electric charge to/from a gate of the transistor M1 when the transistor M1 is turned on or off, which appears as delay of the rise or fall of the signal (indicated by dashed-two dotted lines 281 in FIG. 28B). Note that malfunctions of the circuit due to delay of the rise or fall of the signal do not easily occur in the first period T1.

Next, in the second period T2, the clock signal CK, the preceding stage signal OUT_N−1, and the reset signal OUT_N+2 are an H-level signal, an L-level signal, and an L-level signal, respectively. Accordingly, the potential of the output signal OUT_N rises and the potential of the node A which is set to be in a floating state by bootstrap operation rises. Thus, current flows as indicated by dashed arrows in FIG. 30A and an H-level signal is output as the output signal OUT_N.

Next, in the third period T3, the clock signal CK, the preceding stage signal OUT_N−1, the reset signal OUT_N+2 are L-level signals. In this case, since the potential of the node A is higher than the potential VDD+Vth by the bootstrap operation in the second period T2, the transistor M1 is kept on. Then, current flows from the terminal outputting the output signal OUT_N whose potential is at an H level as indicated by dashed arrows in FIG. 30B, so that the potential of the output signal OUT_N decreases to an L level. After that, with capacitive coupling due to parasitic capacitance of the transistor M1, the potential of the node A decreases to around VDD−Vth. Thus, the potential of the output signal OUT_N is at an L level. In the third period T3, the transistor M1 is kept on by keeping the potential of the node A at a high potential. When the transistor M1 is on in the third period T3, the clock signal CK whose potential is at an L level can be supplied as the output signal OUT_N through the transistor M1. Since the channel width of the transistor M1 is larger than the channel widths of the other transistors because the transistor M1 is used for driving a gate line, for example, a large amount of current can flow and the fall time of the output signal OUT_N can be shortened.

Figure 31A:
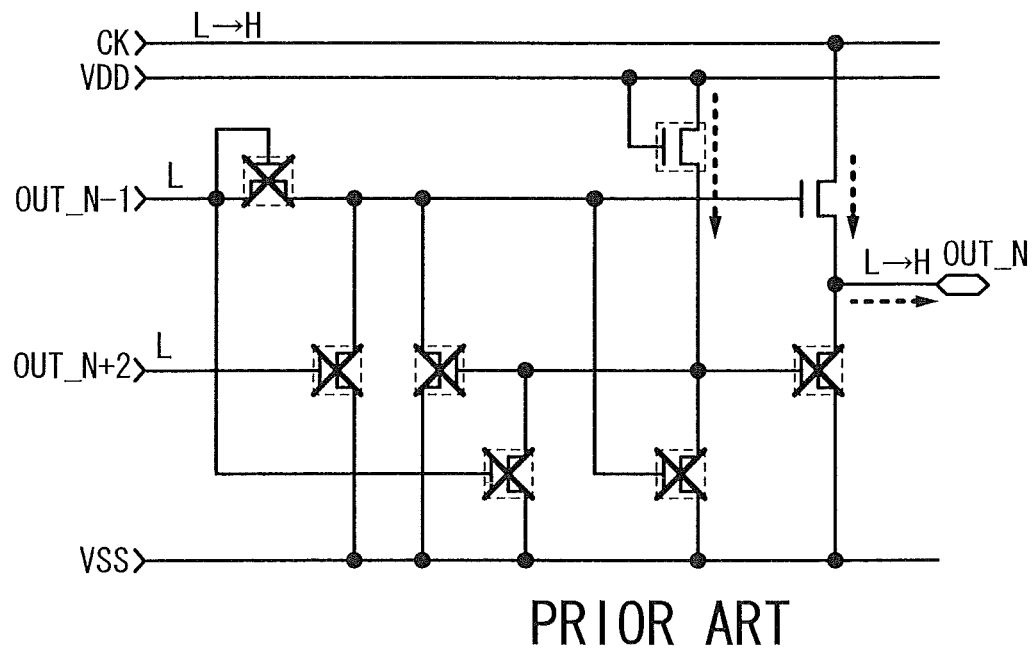
FIGS. 31A and 31B are circuit diagrams of the semiconductor device.
Figure 31B:
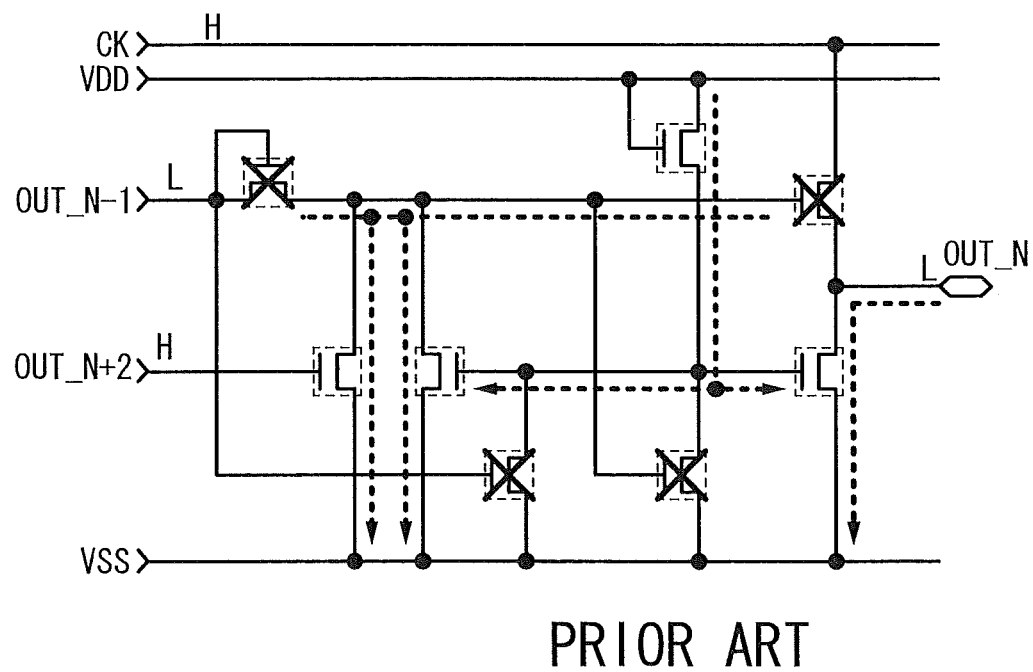

Next, in the fourth period T4, conduction/non-conduction of each wiring and each transistor just after the period is changed from the third period T3 to the fourth period T4 is illustrated in FIG. 31A as a period T4–1. In the period T4–1, the clock signal CK and the preceding stage signal OUT_N−1 are an H-level signal and an L-level signal, respectively. In this case, although the reset signal OUT_N+2 is an H-level signal, delay of rise or fall in a signal occurs, as in the preceding stage signal OUT_N−1 (indicated by a dashed-two dotted line 282 in FIG. 28B). Therefore, the rise of the output signal OUT_N which corresponds to the reset signal OUT_N+2 in a different stage is delayed as compared to the rise of the clock signal CK as illustrated in FIG. 28C, so that the reset signal OUT_N+2 and the clock signal function as an L-level signal in a short period in the period T4–1 and an H-level signal, respectively. Accordingly, current flows through the transistor M1 as indicated by dashed arrows in FIG. 31A. Thus, the potential of the output signal OUT_N cannot be kept at the L level and noise is generated as indicated by a dashed-two dotted line 283 in FIG. 28B. Note that in a period T4–2 after the period T4–1, as illustrated in FIG. 31B, the reset signal OUT_N+2 is an H-level signal. Thus, the transistors M2, M4, and M6 are turned on; current flows as indicated by the dashed arrows in FIG. 31A; electric charge stored in the node A is released; and the potential of the output signal OUT_N is at an L level.

Figure 32:
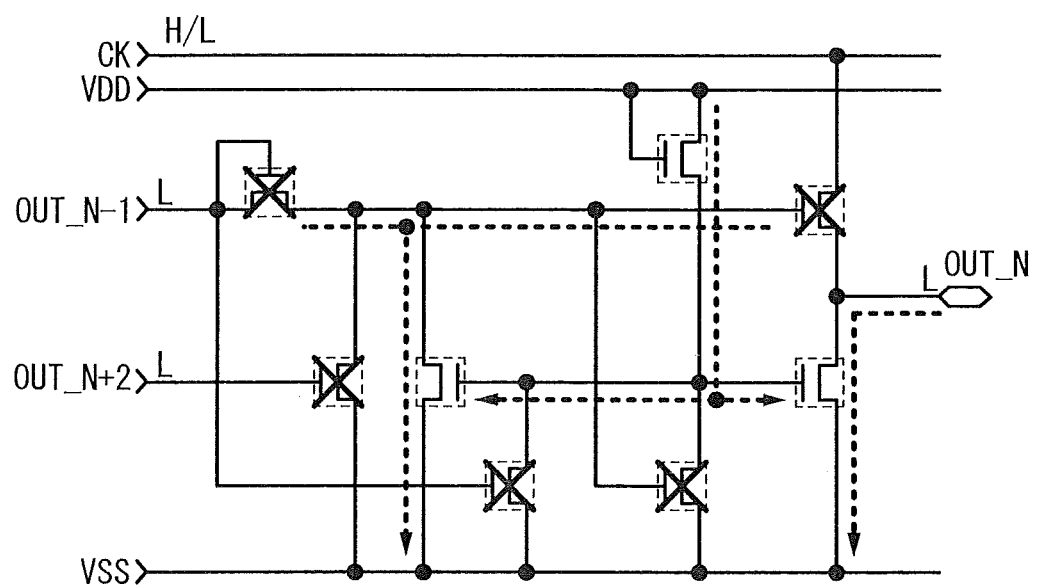
FIG. 32 is a circuit diagram of the semiconductor device.

Next, the fifth period T5 is described with reference to FIG. 32. In the fifth period T5, the clock signal CK, the preceding stage signal OUT_N−1, and the reset signal OUT_N+2 are an H-level signal or an L-level signal, an L-level signal, and an L-level signal, respectively. In this case, since the electric charge stored in the node A is released, the transistor M3 is turned off and the transistors M2 and M4 are turned on. Then, current flows as indicated by dashed arrows in FIG. 32, so that the potential of the output signal OUT_N is kept at the L level.

As described above, in the conventional technique (Reference 1), the clock signal CK is an H level in a period during which the transistor M1 is on in the period T4−1, so that the output signal OUT_N which is an unintended signal is supplied to a gate wiring or the like in some cases. Accordingly, the unintended output signal OUT_N might cause display defects.

Figure 2A:
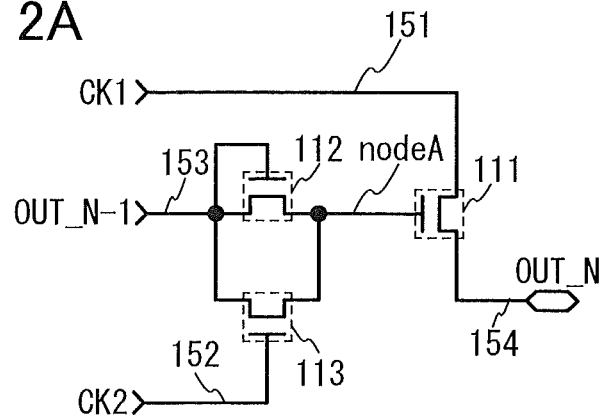
FIGS. 2A and 2B are a circuit diagram of the semiconductor device and a timing chart for illustrating the operation of the semiconductor device.
Figure 2B:
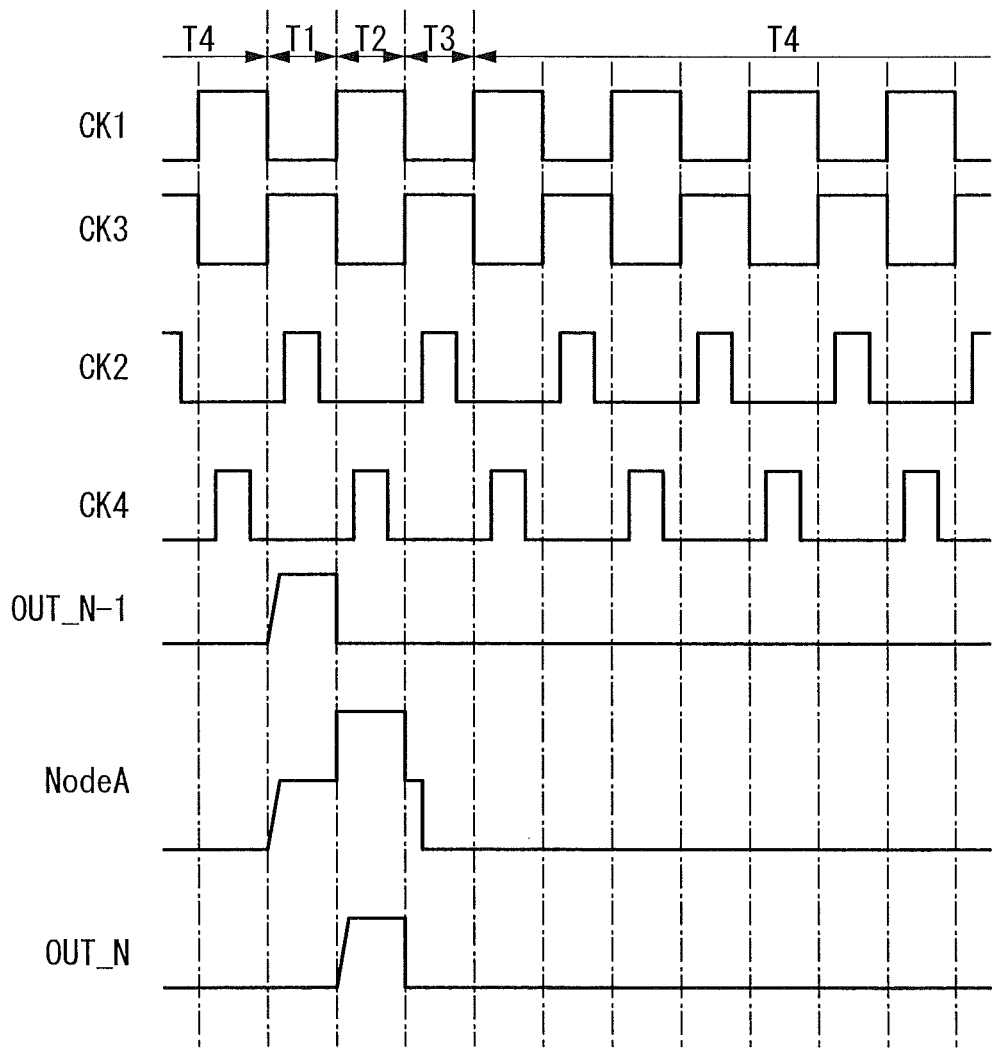

Next, a basic circuit which can be used in the semiconductor device in this embodiment is illustrated in FIGS. 2A and 2B, and advantages or the like of the basic circuit over the circuit in FIGS. 28A to 28C, FIGS. 29A and 29B, FIGS. 30A and 30B, FIGS. 31A and 31B, and FIG. 32 having the conventional structure are described in detail. In the structure described in this embodiment, a gate driver in which the fall time of the output signal OUT_N is shortened and the potential of the output signal OUT_N is prevented from rising can be provided.

Next, in a circuit in FIG. 2A, among the wirings and the transistors illustrated in FIGS. 1A to 1D, three transistors of the first transistor 111, the second transistor 112, and the third transistor 113, and the first to fourth signal lines 151 to 154 are focused. Note that since connection between terminals of each transistor in the circuit in FIG. 2A is similar to the connection in FIG. 1D, detailed description thereof is omitted. Further, in order to specifically describe the operation of a semiconductor device functioning as a shift register in a driver circuit with the use of the circuit in FIG. 2A, a timing chart in FIG. 2B is described by division of the whole period into the first period T1, the second period T2, the third period T3, and the fourth period T4. Note that in the following description, the first to third transistors 111 to 113 are N-channel transistors and are turned on when gate-source voltage Vgs exceeds the threshold voltage (Vth). In the timing chart in FIG. 2B, specific examples of waveforms of the first clock signal CK1, the third clock signal CK3, the second clock signal CK2, the fourth clock signal CK4, the preceding stage signal OUT_N−1, the node A, and the output signal OUT_N are illustrated. Furthermore, a high power supply potential and a low power supply potential of each signal are VDD and VSS, except the node A.

Note that the first clock signal CK1 and the third clock signal CK3, and the second clock signal CK2 and the fourth clock signal CK4 are signals having different duty ratios, as illustrated in FIG. 2B. For example, as illustrated in FIG. 2B, each of the first clock signal CK1 and the third clock signal CK3 is a signal having a duty ratio of 50% and each of the second clock signal CK2 and the fourth clock signal CK4 is a clock signal having a duty ratio less than 50%.

Figure 3A:
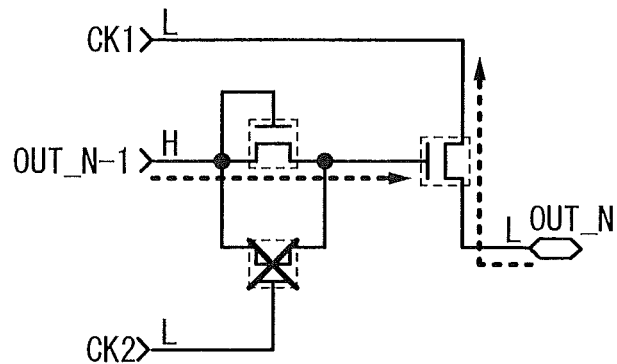
FIGS. 3A to 3C are schematic views for illustrating the operation of the semiconductor device.
Figure 3B:
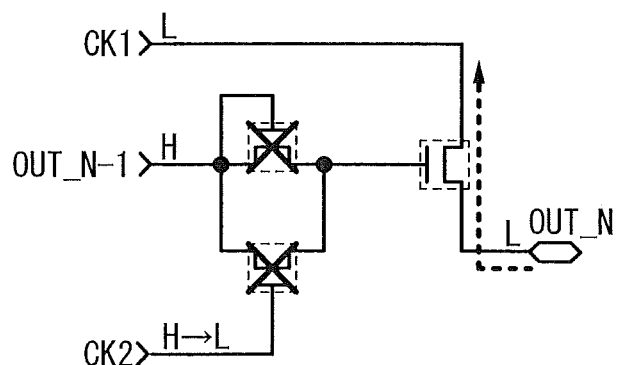
Figure 3C:
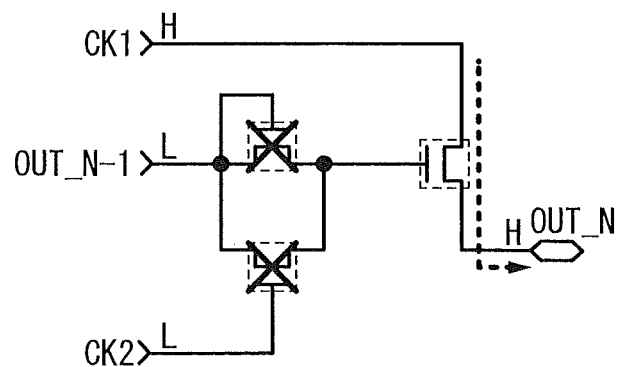

In the first period T1, the operation of the first half is illustrated in FIG. 3A as the period T1−1. Note that "the first half" here refers to a period before the second clock signal CK2 becomes an H-level signal among predetermined potentials supplied to the signal lines in the first period T1. In the period T1−1, the preceding stage signal OUT_N−1, the first clock signal CK1, and the second clock signal CK2 are an H-level signal, an L-level signal, and an L-level signal, respectively. Accordingly, the potential of the node A is at a potential obtained by addition of the threshold voltage to the low power supply potential VSS (VSS+Vth), so that the first and second transistors 111 and 112 are turned on and the third transistor 113 is turned off, as illustrated in the diagram. Then, current flows as indicated by dashed arrows in FIG. 3A. After that, when the potential of the node A rises from VSS+Vth to VDD−Vth, the first transistor 111 is turned off. Next, the operation of the latter half in the first period T1 is illustrated in FIG. 3B as the period T1−2. Note that "the latter half" here refers to a period during which the second clock signal CK2 is an H-level signal or an L-level signal after the H-level signal among the predetermined potentials supplied to the signal lines in the first period T1. In the period T1−2, the preceding stage signal OUT_N−1, the first clock signal CK1, and the second clock signal CK2 are an H-level signal, an L-level signal, and an H-level signal (changed to an L-level signal later), respectively. Then, the potential of the node A is not particularly changed from VDD−Vth, so that the first transistor III is turned on, the second transistor 112 is turned off, and the third transistor 113 is turned on or off, as illustrated in the diagram. Then, current flows as indicated by a dashed arrow in FIG. 3B.

Figure 4:
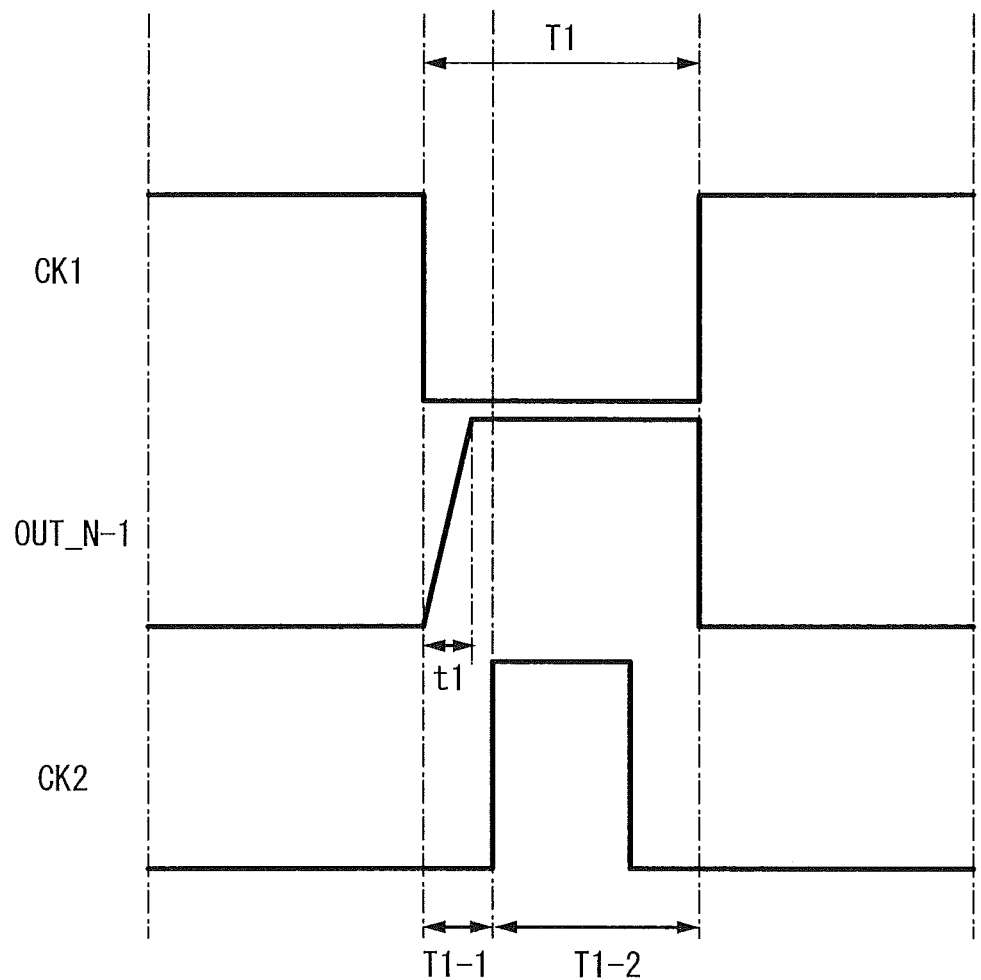
FIG. 4 is a timing chart for illustrating the operation of the semiconductor device.

Note that examples of the period T1−1 and the period T1−2 in the first period T1 are described with reference to FIG. 4. As illustrated in FIG. 4, in the first period T1, a period during which the second clock signal CK2 is changed from an L-level signal to an H-level signal is denoted by the period T1−1 and the following period is denoted by the period T1−2. Note that although FIG. 2B illustrates an example where the second clock signal CK2 is changed from an H-level signal to an L-level signal in the period T1−2, the second clock signal CK2 may be kept at the H level. Note that as illustrated in the diagram, it is preferable that the period T1−1 be set longer than a period t1 during which the preceding stage signal OUT_N−1 is changed from an L-level signal to an H-level signal.

Note that as in FIG. 28B, FIG. 2B briefly illustrates a waveform when the rise of the output signal OUT_N which corresponds to the preceding stage signal OUT_N−1 in a different stage is delayed as compared to the rise of the first clock signal CK1. Description of delay of the waveform is similar to the description in FIG. 28B.

Next, in the second period T2, the first clock signal CK1, the preceding stage signal OUT_N−1, and the second clock signal CK2 are an H-level signal, an L-level signal, and an L-level signal, respectively. Accordingly, the potential of the output signal OUT_N rises and the potential of the node A which is set to be in a floating state by bootstrap operation rises. Thus, current flows as indicated by a dashed arrow in FIG. 3C and an H-level signal is output as the output signal OUT_N.

Next, in the third period T3, the operation of the first half is illustrated in FIG. 5A as a period T3−1. Note that "the first half" here refers to a period before the second clock signal CK2 becomes an H-level signal among predetermined potentials supplied to the signal lines in the third period T3. In the period T3−1, the first clock signal CK1, the preceding stage signal OUT_N−1, the second clock signal CK2 are L-level signals. In this case, since the potential of the node A is higher than the potential VDD+Vth by the bootstrap operation in the second period T2, the first transistor 111 is kept on. Then, current flows from the terminal outputting the output signal OUT_N whose potential is at an H level as indicated by a dashed arrow in FIG. 5A, so that the potential of the output signal OUT_N decreases to an L level. After that, with capacitive coupling due to parasitic capacitance of the first transistor 111, the potential of the node A decreases to around VDD−Vth. Thus, the potential of the output signal OUT_N is at an L level. In the period T3−1 in the third period T3, the first transistor 111 is kept on by keeping the potential of the node A at a high potential. When the first transistor 111 is on in the period T3−1 in the third period T3, the first clock signal CK1 whose potential is at an L level can be supplied as the output signal OUT_N through the first transistor 111. Since the channel width of the first transistor 111 is larger than the channel widths of the other transistors because the first transistor 111 is used for driving a gate line, for example, a large amount of current can flow and the fall time of the output signal OUT_N can be shortened. Next, the operation of the latter half in the third period T3 is illustrated in FIG. 5B as a period T3−2. Note that "the latter half" here refers to a period during which the second clock signal CK2 is an H-level signal or an L-level signal after the H-level signal among the predetermined potentials supplied to the signal lines in the third period T3. In the period T3−2, the preceding stage signal OUT_N−1, the first clock signal CK1, and the second clock signal CK2 are an L-level signal, an L-level signal, and an H-level signal (changed to an L-level signal later), respectively. Then, current flows as indicated by the dashed arrow in FIG. 5B. Thus, the second transistor 112 is turned off, the third transistor 113 is turned on, and the potential of the node A is at an L level.

Note that examples of the period T3−1 and the period T3−2 in the third period T3 are described with reference to FIG. 6. As illustrated in FIG. 6, in the third period T3, a period during which the second clock signal CK2 is changed from an L-level signal to an H-level signal is denoted by the period T3−1 and the following period is denoted by the period T3−2. Note that although FIG. 2B illustrates an example where the second clock signal CK2 is changed from an H-level signal to an L-level signal in the period T3−2, a signal which is kept at the H level may be used (for example, a clock signal CK2−1 in FIG. 6). Further, the H-level signal in the period T3−2 may be a signal which is kept at the H level after the third period T3 (for example, a clock signal CK2−2 in FIG. 6). Note that as in the period T1−1, it is preferable that the period T3−1 be set longer than a period during which the output signal OUT_N+1 (not shown) is changed from an L-level signal to an H-level signal in the third period T3. In other words, it is preferable that a period during which the second clock signal CK2 is changed from an L-level signal to an H-level signal after the first clock signal CK1 is changed from an H-level signal to an L-level signal (the period T3−1 in FIG. 6) is set longer than the period during which the output signal OUT_N+1 is changed from an L-level signal to an H-level signal.

Figure 7A:
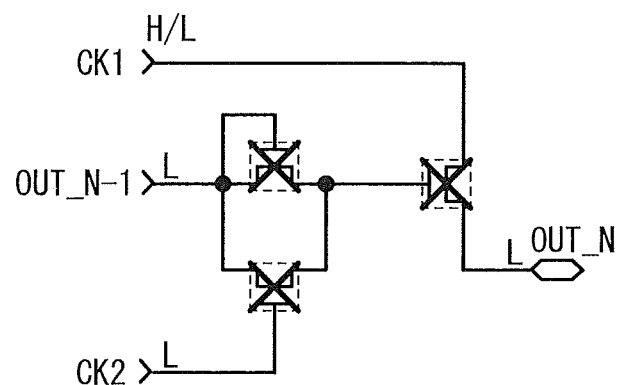
FIGS. 7A and 7B are schematic views for illustrating the operation of the semiconductor device.
Figure 7B:
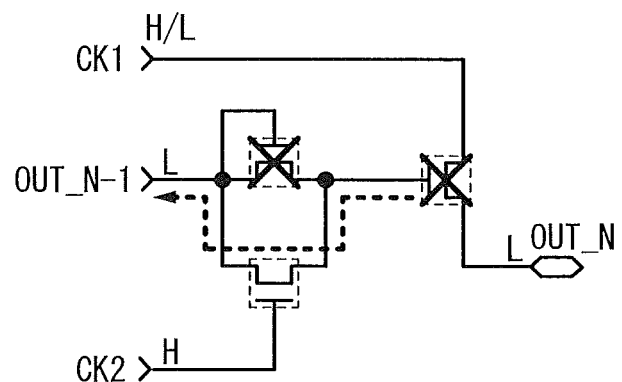

Next, in the fourth period T4, conduction/non-conduction of each wiring and each transistor in a period during which the second clock signal CK2 is an L-level signal is illustrated in FIG. 7A as the period T4−1. In the period T4−1, the preceding stage signal OUT_N−1 and the first clock signal CK1 are an L-level signal and a signal whose potential is switched between an H level and an L level, respectively. In this case, since the potential of the node A is set at a potential of an L-level signal through the operation in the third period T3, the first transistor 111 is kept off. Thus, the potential of the output signal OUT_N is at an L level. The operation of the latter half of the operation in the fourth period T4 is illustrated in FIG. 7B as a period T4−2. Note that "the latter half" here refers to a period during which the second clock signal CK2 is an H-level signal in the fourth period T4. In the period T4−2, the preceding stage signal OUT_N−1 and the first clock signal CK1 are L-level signals. Further, since the second clock signal CK2 is an H-level signal in the period T4−2, the third transistor 113 is turned on and the first and second transistors 111 and 112 are turned off. Accordingly, current flows as indicated by a dashed arrow in FIG. 7B. Thus, the second transistor 112 is turned off, the third transistor 113 is turned on, and the potential of the node A is at an L level.

As described above, with the structure in FIGS. 1A to 1C which is the structure in this embodiment, by setting the potential of the second clock signal CK2 at an H level after setting the potential of the second clock signal CK2 at an L level in the period T3−1 in the third period T3, the first clock signal CK1 which is at an L level can be output through the first transistor 111, and the fall time of the output signal OUT_N can be shortened. Further, by setting the potential of the second clock signal CK2 at an H level after setting the potential of the second clock signal CK2 at an L level in the period T3−2 in the third period T3, the first transistor 111 can be turned off before the first clock signal CK1 is set at an H level again. Thus, the first clock signal CK1 which is at an H level can be prevented from being output through the first transistor 111. Accordingly, the fall time of the output signal OUT_N can be shortened and the rise in the potential of the output signal OUT_N can be prevented.

Figure 8A:
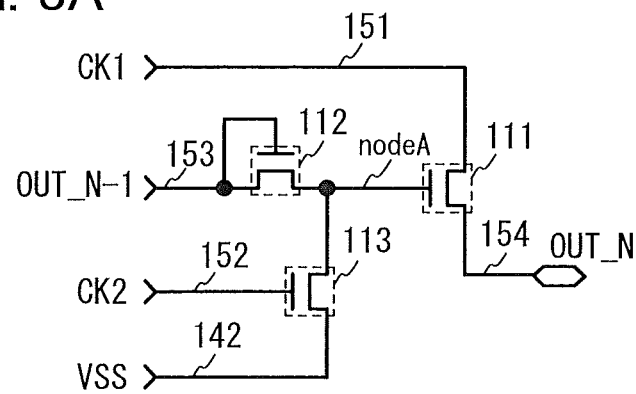
FIGS. 8A to 8C are circuit diagrams of a semiconductor device.
Figure 8B:
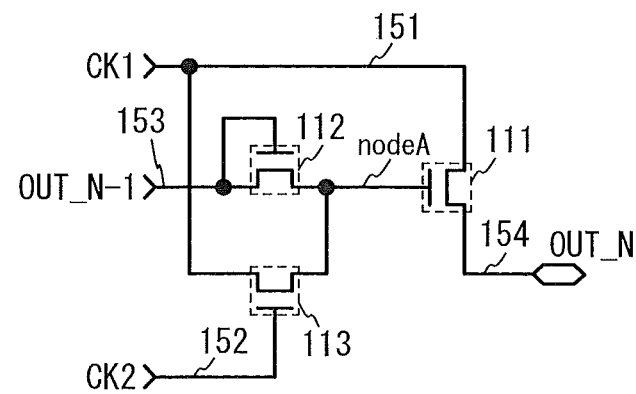
Figure 8C:
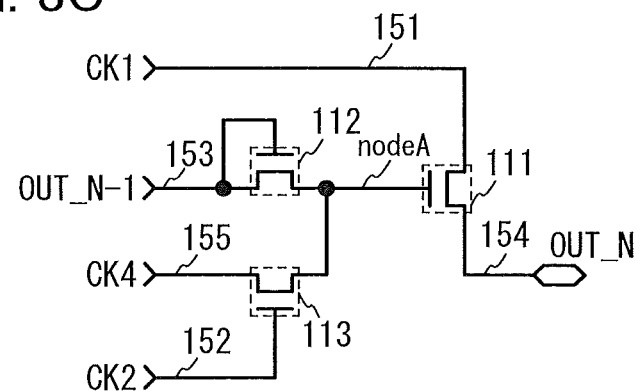

Note that FIG. 8A illustrates a structure which is different from the structure of the pulse output circuit in an odd-numbered stage illustrated in FIG. 2A. The structure illustrated in FIG. 8A differs from the structure illustrated in FIG. 2A in that the first terminal of the third transistor 113 is connected to the second power supply line 142 to which the low power supply potential VSS is supplied. In addition, a different structure is illustrated in FIG. 8B. The structure illustrated in FIG. 8B differs from the structure illustrated in FIG. 2A in that the first terminal of the third transistor 113 is connected to the first signal line 151 to which the first clock signal CK1 is input. Further, a different structure is illustrated in FIG. 8C. The structure illustrated in FIG. 8C differs from the structure illustrated in FIG. 2A in that the first terminal of the third transistor 113 is connected to a signal line 155 to which the fourth clock signal CK4 is input (also referred to as a fifth signal line). With the structures in FIGS. 8A to 8C, a signal which is input to the gate of the third transistor 113 can be prevented from being transmitted to the preceding stage signal OUT_N−1 which is input to the third signal line 153. For example, in FIG. 2A, parasitic capacitance exists between the gate of the third transistor 113 and the third signal line 153. Due to the parasitic capacitance, the second clock signal CK2 is transmitted to a potential of the third signal line 153. With the structures in FIGS. 8A to 8C, signal transmission due to the parasitic capacitance can be prevented. Furthermore, with the structures in FIGS. 8A to 8C, the first clock signal CK1 or the fourth clock signal CK4 is input to the first terminal or the second terminal of the third transistor 113, so that reverse bias voltage having a polarity which is opposite to that of voltage used for turning on the third transistor 113 can be applied. Thus, degradation of the transistor due to electron trap at the time of turning on the third transistor 113 can be suppressed.

Figure 9A:
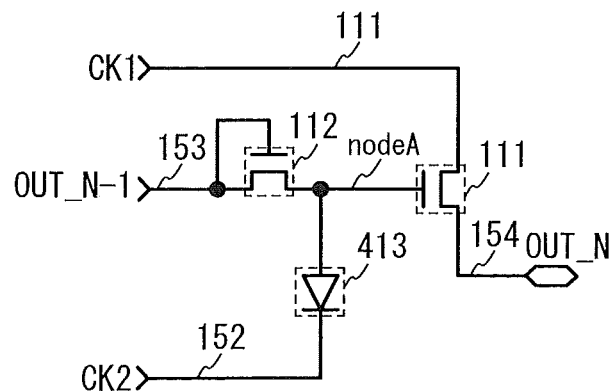
FIGS. 9A to 9C are circuit diagrams of a semiconductor device and a timing chart for illustrating the operation of the semiconductor device.
Figure 9B:
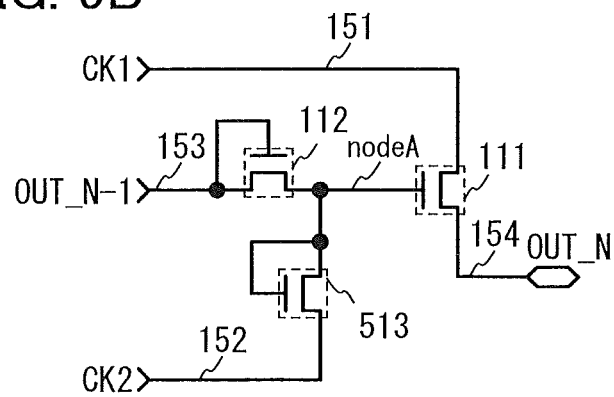
Figure 9C:
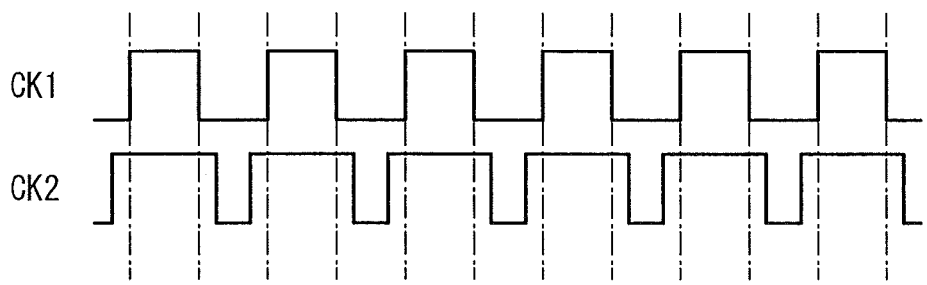

Note that FIG. 9A illustrates a structure which is different from the structures of the pulse output circuits in odd-numbered stages illustrated in FIG. 2A and FIGS. 8A to 8C, i.e., a structure where the third transistor 113 is replaced by a diode element. The structure illustrated in FIG. 9A differs from the structure illustrated in FIG. 2A in that a diode element 413 is provided as a substitute for the third transistor 113, a first terminal of the diode element 413 is connected to the second signal line 152 to which the second clock signal CK2 is input, and that a second terminal of the diode element 413 is connected to the node A. In addition, a different structure is illustrated in FIG. 9B. The structure illustrated in FIG. 9B differs from the structure illustrated in FIG. 2A in that a diode-connected third transistor 513 is provided as a substitute for the third transistor 113, a first terminal of the third transistor 513 is connected to the second signal line 152 to which the second clock signal CK2 is input, and that a gate and a second terminal of the third transistor 513 is connected to the node A. Note that in the circuit structure in FIG. 9B, as illustrated in FIG. 9C, it is preferable that the duty ratio of the second clock signal CK2 be 50% or more, that is, it is preferable that a period of an L level be longer than a period of an H level. With the structures in FIGS. 9A and 9B, a wiring for controlling a potential of a gate of the transistor can be eliminated. With the structure in FIG. 9B, reverse bias voltage having a polarity which is opposite to that of voltage used for turning on the transistor 513 can be applied. Thus, degradation of the transistor due to electron trap at the time of turning on the transistor 513 can be suppressed.

Figure 10A:
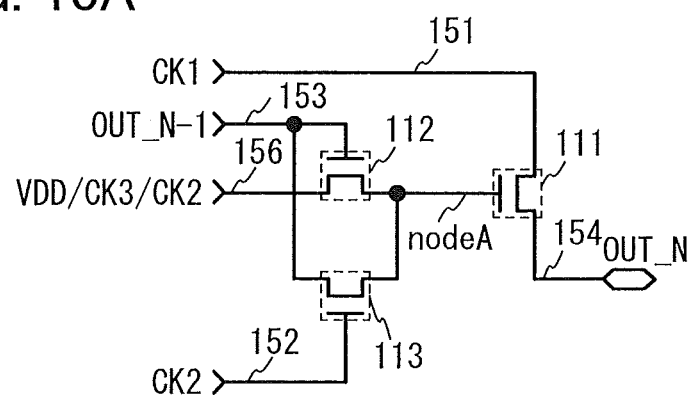
FIGS. 10A and 10B are schematic views for illustrating the operation of a semiconductor device.
Figure 10B:
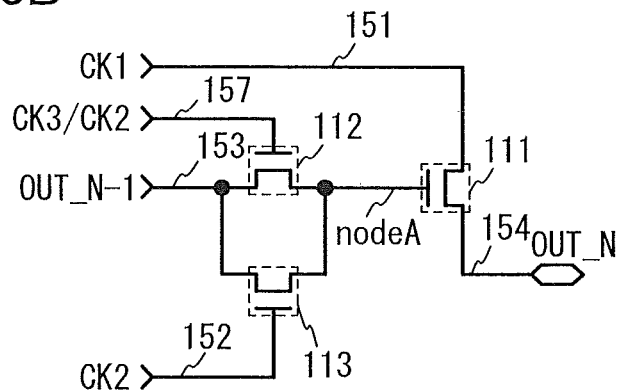

Note that in the structure of the pulse output circuit in the odd-numbered stage, as illustrated in FIG. 10A, the high power supply potential VDD, the third clock signal CK3, or the second clock signal CK2 may be supplied to a signal line 156 which is connected to the first terminal of the second transistor 112 (also referred to as a fifth signal line). The structure illustrated in FIG. 10A differs from the structure illustrated in FIG. 2A in that the signal line 156 for supplying the high power supply potential VDD, the third clock signal CK3, or the second clock signal CK2 is connected to the first terminal of the second transistor 112. In addition, in the structure of the pulse output circuit in the odd-numbered stage, as illustrated in FIG. 10B, the third clock signal CK3 or the second clock signal CK2 may be supplied to a signal line 157 which is connected to the gate of the second transistor 112 (also referred to as a sixth signal line). The structure illustrated in FIG. 10B differs from the structure illustrated in FIG. 2A in that the signal line 157 for supplying the third clock signal CK3 or the second clock signal CK2 is connected to the gate of the second transistor 112. Further, with the structures in FIGS. 10A and 10B, reverse bias voltage having a polarity which is opposite to that of voltage used for turning on the transistor 112 can be applied. Thus, degradation of the transistor due to electron trap at the time of turning on the transistor 112 can be suppressed. Furthermore, with the structure in FIG. 10B, the transistor 112 is repeatedly turned on or off in accordance with the third clock signal CK3 or the second clock signal CK2. Thus, the preceding stage signal OUT_N-1 can be input to the node A every given period. Accordingly, the potential of the node A can be set at a stable potential.

As described above, in the semiconductor device in this embodiment, malfunctions due to input signals can be suppressed, so that display defects can be reduced. Therefore, a correction circuit or the like for suppressing malfunctions of a circuit is not needed, so that a secondary advantage such as improvement in display quality, reduction in the size of a display device, reduction in cost, or reduction in the size of a frame can be obtained.

Note that the contents described in each drawing in this embodiment can be freely combined with or replaced with the contents described in any of the other embodiments as appropriate.

Embodiment 2

In this embodiment, examples of semiconductor devices are specifically described. The semiconductor device in this embodiment is described in order to describe the structure of the semiconductor device in Embodiment 1, particularly the structure in FIG. 1D, more specifically. The semiconductor device in this embodiment can be used for a flip flop, a shift register, a gate driver, a source driver, a display device, or the like, for example. Note that the semiconductor device in this embodiment can also be referred to as a flip flop or a driver circuit.

Figure 11A:
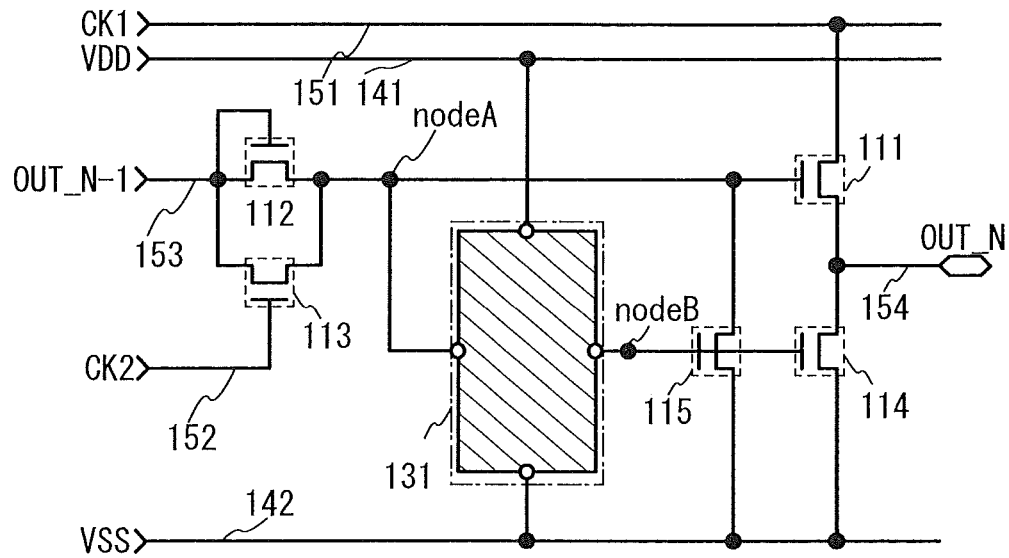
FIGS. 11A and 11B are a circuit diagram of a semiconductor device and a timing chart for illustrating the operation of the semiconductor device.
Figure 11B:
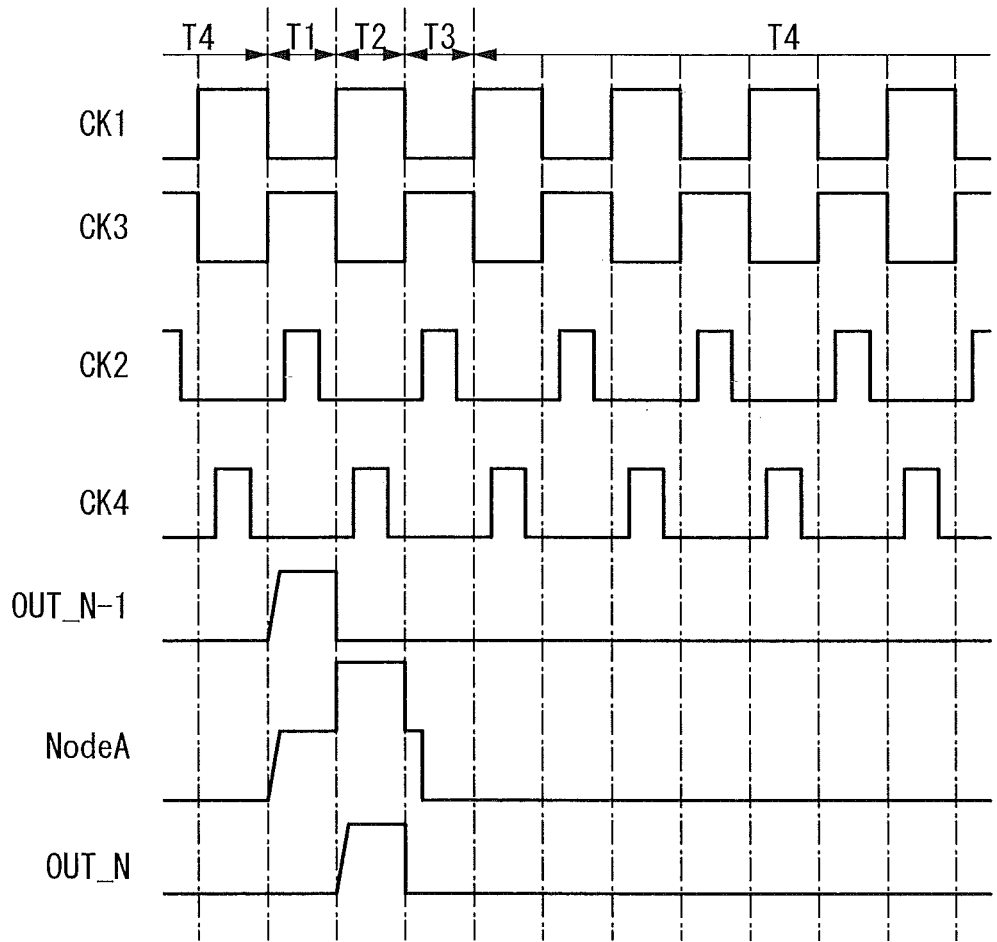

First, an example of the semiconductor device in this embodiment is described with reference to FIG. 11A. The semiconductor device in FIG. 11A is similar to the semiconductor device in FIG. 1D, and a timing chart in FIG. 11B is similar to the timing chart in FIG. 2B. Thus, the description in Embodiment 1 is incorporated for detailed description.

Figure 12A:
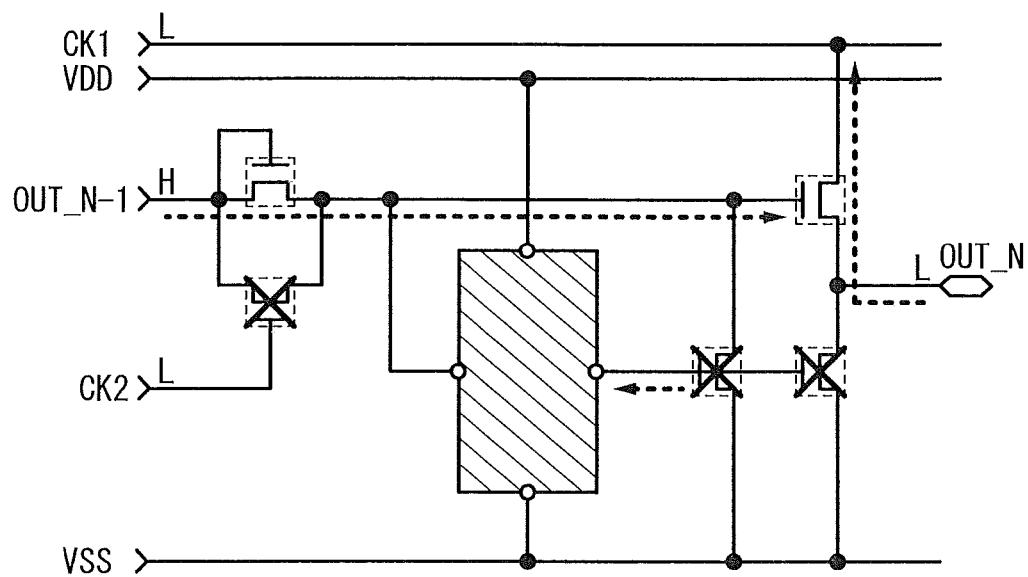
FIGS. 12A and 12B are schematic views for illustrating the operation of the semiconductor device.
Figure 12B:
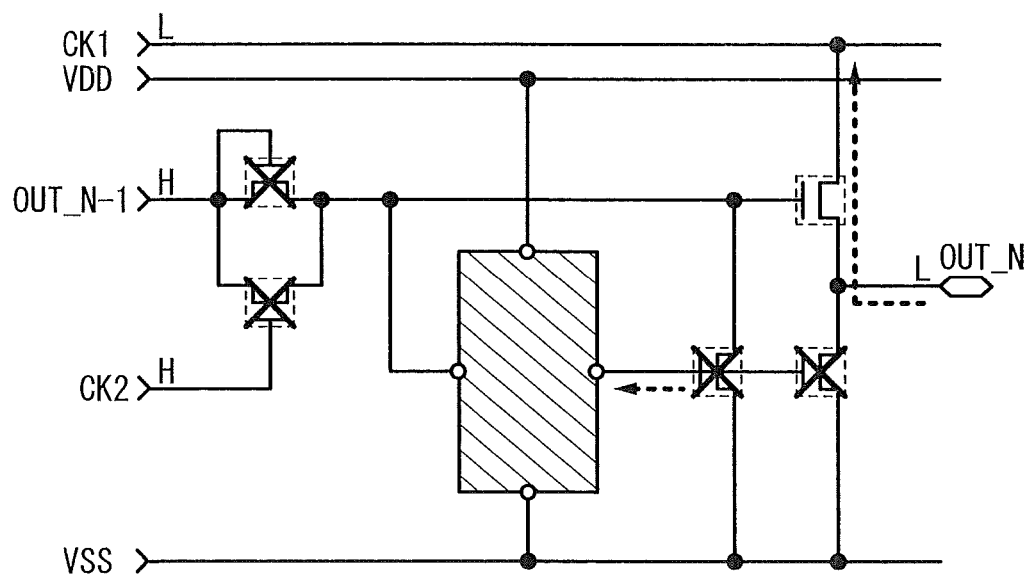

In the first period T1, the operation of the first half is illustrated in FIG. 12A as the period T1-1. Note that "the first half" here refers to a period before the second clock signal CK2 becomes an H-level signal among predetermined potentials supplied to the signal lines in the first period T1. In the period T1-1, the preceding stage signal OUT_N-1, the first clock signal CK1, and the second clock signal CK2 are an H-level signal, an L-level signal, and an L-level signal, respectively. Accordingly, the potential of the node A is at a potential obtained by addition of the threshold voltage to the low power supply potential VSS (VSS+Vth), so that the first and second transistors 111 and 112 are turned on and the third transistor 113 is turned off, as illustrated in the diagram. Then, current flows through the first transistor III as indicated by dashed arrows in FIG. 12A. After that, when the potential of the node A rises from VSS+Vth to VDD−Vth, the first transistor III is turned off. Further, when the potential of the node A rises to VDD−Vth, the control circuit 131 controls the potential of the node B so that the potential of the node B is lowered and the fourth and fifth transistors 114 and 115 are turned off. Next, the operation of the latter half in the first period T1 is illustrated in FIG. 12B as the period T1-2. Note that "the latter half" here refers to a period during which the second clock signal CK2 is an H-level signal or an L-level signal after the H-level signal among the predetermined potentials supplied to the signal lines in the first period T1. In the period T1-2, the preceding stage signal OUT_N-1, the first clock signal CK1, and the second clock signal CK2 are an H-level signal, an L-level signal, and an H-level signal (changed to an L-level signal later), respectively. Then, the potential of the node A is not particularly changed from VDD−Vth, so that the first transistor 111 is turned on, the second transistor 112, the fourth transistor 114, and the fifth transistor 115 are turned off, and the third transistor 113 is turned on or off, as illustrated in the diagram. Then, current flows as indicated by dashed arrows in FIG. 12B.

Figure 13:
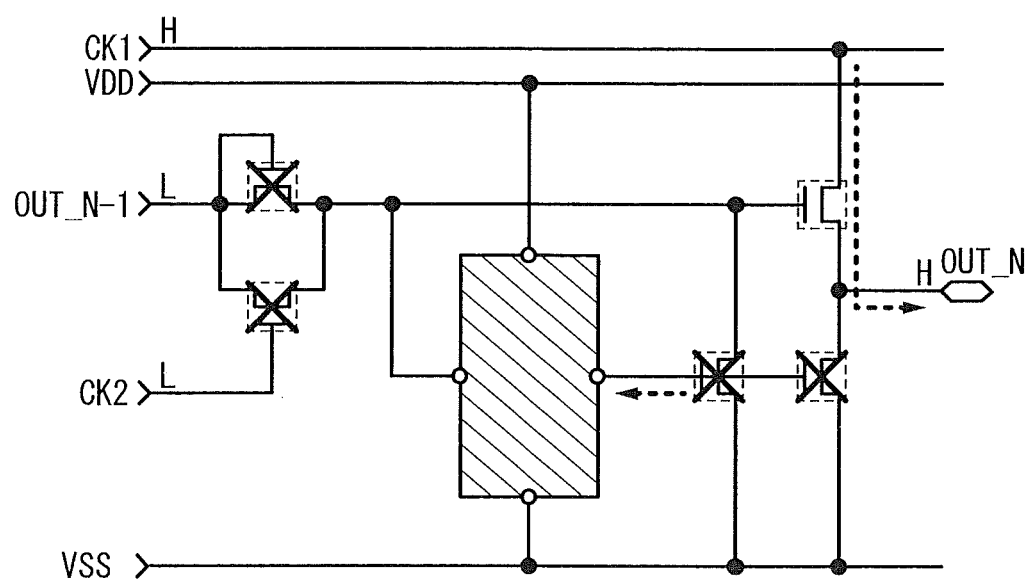
FIG. 13 is a schematic view for illustrating the operation of the semiconductor device.

Next, in the second period T2, the first clock signal CK1, the preceding stage signal OUT_N-1, and the reset signal OUT_N+2 are an H-level signal, an L-level signal, and an L-level signal, respectively. Accordingly, the potential of the output signal OUT_N rises and the potential of the node A which is set to be in a floating state by bootstrap operation rises. Thus, current flows as indicated by dashed arrows in FIG. 13 and an H-level signal is output as the output signal OUT_N. Further, when the potential of the node A is higher than VDD−Vth, as in the previous period, the control circuit 131 controls the potential of the node B so that the potential of the node B is lowered and the fourth and fifth transistors 114 and 115 are turned off.

Figure 14A:
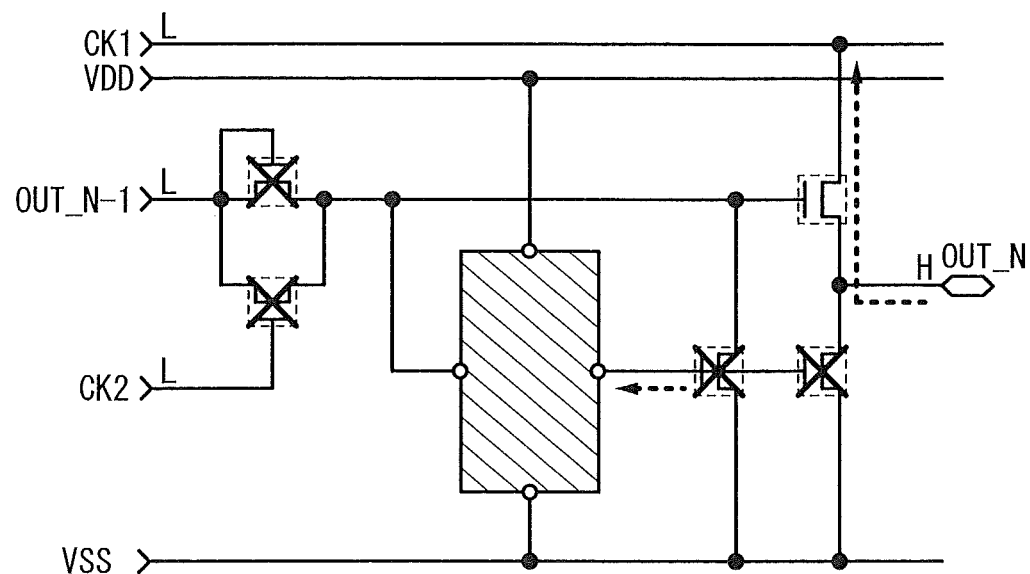
FIGS. 14A and 14B are schematic views for illustrating the operation of the semiconductor device.
Figure 14B:
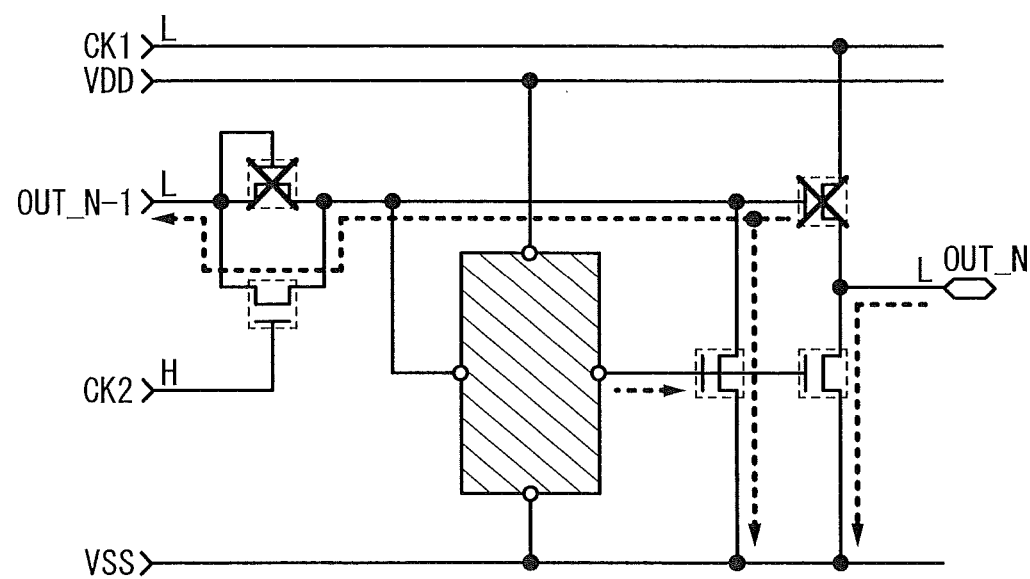

Next, in the third period T3, the operation of the first half is illustrated in FIG. 14A as the period T3-1. Note that "the first half" here refers to a period before the second clock signal CK2 becomes an H-level signal among predetermined potentials supplied to the signal lines in the third period T3. In the period T3-1, the first clock signal CK1, the preceding stage signal OUT_N-1, the second clock signal CK2 are L-level signals. In this case, since the potential of the node A is higher than the potential VDD+Vth by the bootstrap operation in the second period T2, the first transistor 111 is kept on. Further, when the potential of the node A is higher than VDD+Vth, as in the previous period, the control circuit 131 controls the potential of the node B so that the potential of the node B is lowered and the fourth and fifth transistors 114 and 115 are turned off. Then, current flows from the terminal outputting the output signal OUT_N whose potential is at an H level as indicated by dashed arrows in FIG. 14B, so that the potential of the output signal OUT_N decreases to an L level. After that, with capacitive coupling due to parasitic capacitance of the first transistor 111, the potential of the node A decreases to around VDD−Vth. Thus, the potential of the output signal OUT_N is at an L level. In the period T3-1 in the third period T3, the first transistor 111 is kept on by keeping the potential of the node A at a high potential. When the first transistor 111 is on in the period T3-1 in the third period T3, the first clock signal CK1 whose potential is at an L level can be supplied as the output signal OUT_N through the first transistor 111. Since the channel width of the first transistor 111 is larger than the channel widths of other transistors (the fourth and fifth transistors 114 and 115) because the first transistor 111 is used for driving a gate line, a large amount of current can flow and the fall time of the output signal OUT_N can be shortened. Next, the operation of the latter half in the third period T3 is illustrated in FIG. 14B as the period T3-2. Note that "the latter half" here refers to a period during which the second clock signal CK2 is an H-level signal or an L-level signal after the H-level signal among the predetermined potentials supplied to the signal lines in the third period T3. In the period T3-2, the preceding stage signal OUT_N-1, the first clock signal CK1, and the second clock signal CK2 are an L-level signal, an L-level signal, and an H-level signal (changed to an L-level signal later), respectively. Then, current flows as indicated by the dashed arrows in FIG. 14B. Thus, the second transistor 112 is turned off, the third transistor 113 is turned on, and the potential of the node A is at an L level. Then, when the potential of the node A is set at an L level, the control circuit 131 controls the potential of the node B so that the potential of the node B is raised and the fourth and fifth transistors 114 and 115 are turned on.

Figure 15A:
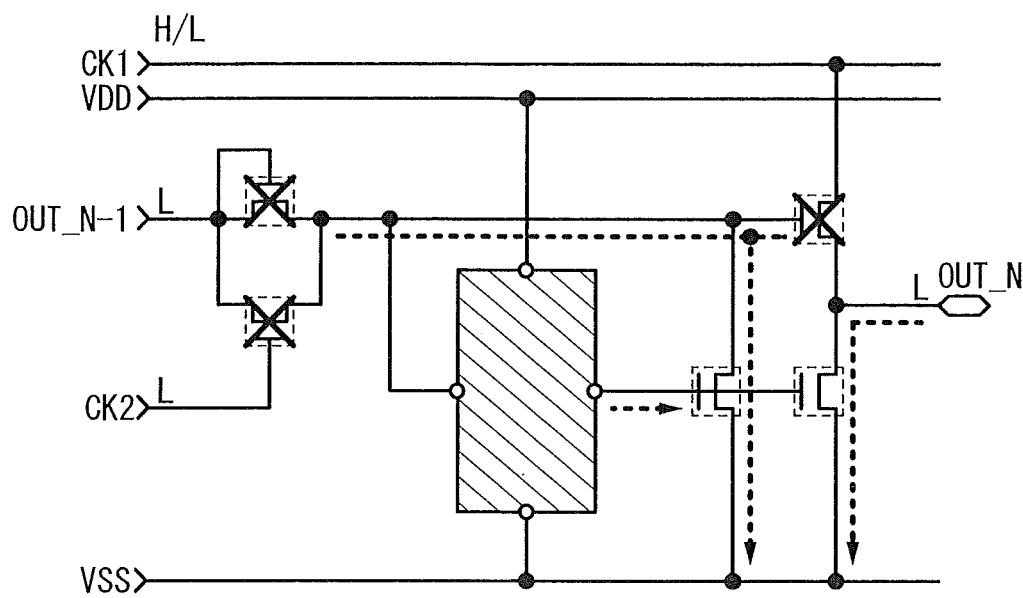
FIGS. 15A and 15B are schematic views for illustrating the operation of the semiconductor device.
Figure 15B:
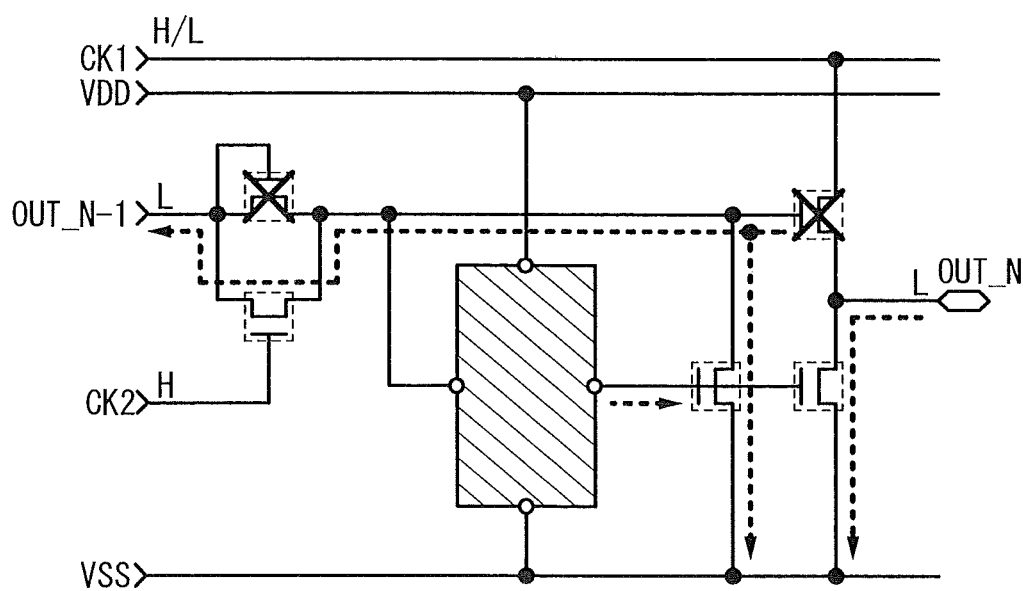

Next, in the fourth period T4, conduction/non-conduction of each wiring and each transistor in a period during which the second clock signal CK2 is an L-level signal is illustrated in FIG. 15A as the period T4-1. In the period T4-1, the preceding stage signal OUT_N-1 and the first clock signal CK1 are an L-level signal and a signal whose potential is switched between an H level and an L level, respectively. In this case, since the potential of the node A is set at a potential of an L-level signal through the operation in the third period T3, the first transistor 111 is kept off and the fourth and fifth transistors 114 and 115 are kept on by the control circuit 131. Thus, the potential of the output signal OUT_N is at an L level. The operation of the latter half in the fourth period T4 is illustrated in FIG. 15B as the period T4-2. Note that "the latter half" here refers to a period during which the second clock signal CK2 is an H-level signal in the fourth period T4. In the period. T4-2, the preceding stage signal OUT_N-1 and the first clock signal CK1 are L-level signals. Further, since the second clock signal CK2 is an H-level signal in the period T4-2, the third transistor 113 is turned on and the first and second transistors 111 and 112 are turned off. Accordingly, current flows as indicated by dashed arrows in FIG. 15B. Thus, the second transistor 112 is turned off, the third transistor 113 is turned on, and the potential of the node A is at an L level. Then, when the potential of the node A is set at an L level, the control circuit 131 controls the potential of the node B so that the potential of the node B is raised and the fourth and fifth transistors 114 and 115 are turned on.

As described above, with the structure in FIGS. 1A to 1C which is the structure in this embodiment, by setting the potential of the second clock signal CK2 at an H level after setting the potential of the second clock signal CK2 at an L level in the period T3-1 in the third period T3, the first clock signal CK1 which is at an L level can be output through the first transistor 111, and the fall time of the output signal OUT_N can be shortened. Further, by setting the potential of the second clock signal CK2 at an H level after setting the potential of the second clock signal CK2 at an L level in the period T3-2 in the third period T3, the first transistor 111 can be turned off before the first clock signal CK1 is set at an H level again. Thus, the first clock signal CK1 which is at an H level can be prevented from being output through the first transistor 111. Accordingly, the fall time of the output signal OUT_N can be shortened and the rise in the potential of the output signal OUT_N can be prevented.

Next, in this embodiment, an example of a specific circuit structure of the control circuit 131 illustrated in FIG. 11A is described.

Figure 16A:
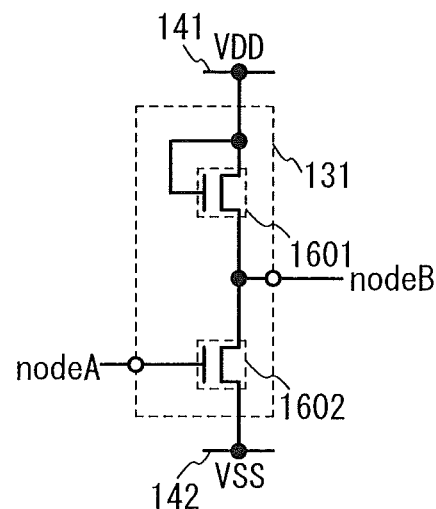
FIGS. 16A and 16B are circuit diagrams of a semiconductor device.
Figure 16B:
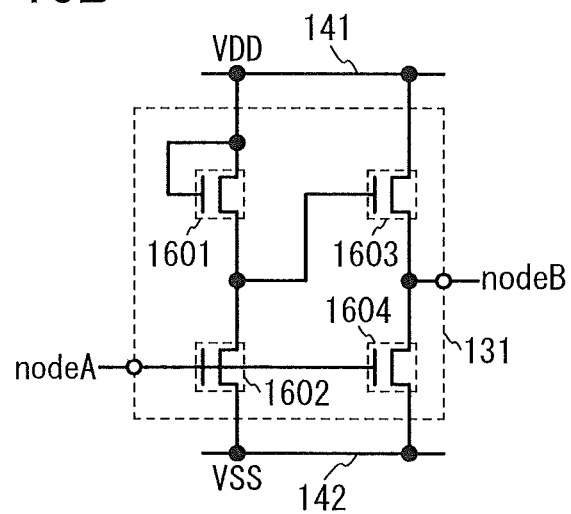

As illustrated in FIG. 11A, the control circuit 131 illustrated in FIG. 16A is connected to the node A, the node B, the first power supply line 141 to which a high power supply potential is supplied, and the second power supply line 142 to which a low power supply potential is supplied, and includes n-channel transistors 1601 and 1602. A first terminal of the transistor 1601, which is connected to the first power supply line 141, is connected to a gate of the transistor 1601. A gate of the transistor 1602 is connected to the node A. A second terminal of the transistor 1602 is connected to the second power supply line 142. A second terminal of the transistor 1601, a first terminal of the transistor 1602, and the node B are connected to each other. Further, the control circuit 131 which is illustrated in FIG. 16B and has a different structure is connected to the node A, the node B, the first power supply line 141 to which a high power supply potential is supplied, and the second power supply line 142 to which a low power supply potential is supplied, and includes the n-channel transistors 1601 and, 1602, and n-channel transistors 1603 and 1604. The first terminal of the transistor 1601, which is connected to the first power supply line 141, is connected to the gate of the transistor 1601. The gate of the transistor 1602 is connected to the node A and a gate of the transistor 1604. The second terminal of the transistor 1602 is connected to the second power supply line 142. The second terminal of the transistor 1601, the first terminal of the transistor 1602, and a gate of the transistor 1603 are connected to each other. A first terminal of the transistor 1603 is connected to the first power supply line 141. A second terminal of the transistor 1604 is connected to the second power supply line 142. A second terminal of the transistor 1603, a first terminal of the transistor 1604, and the node B are connected to each other.

Figure 17A:
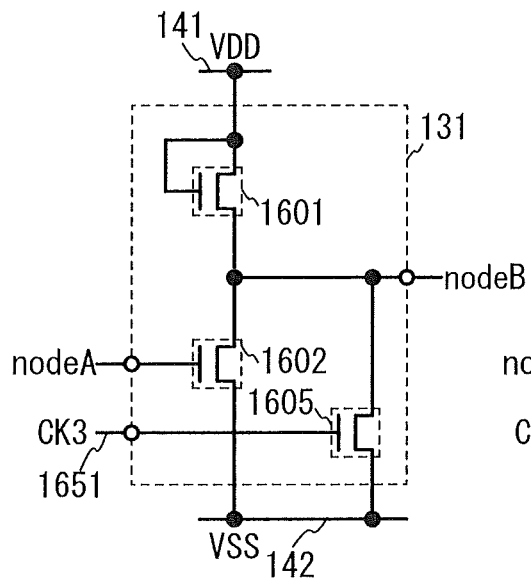
FIGS. 17A to 17D are circuit diagrams of a semiconductor device.
Figure 17B:
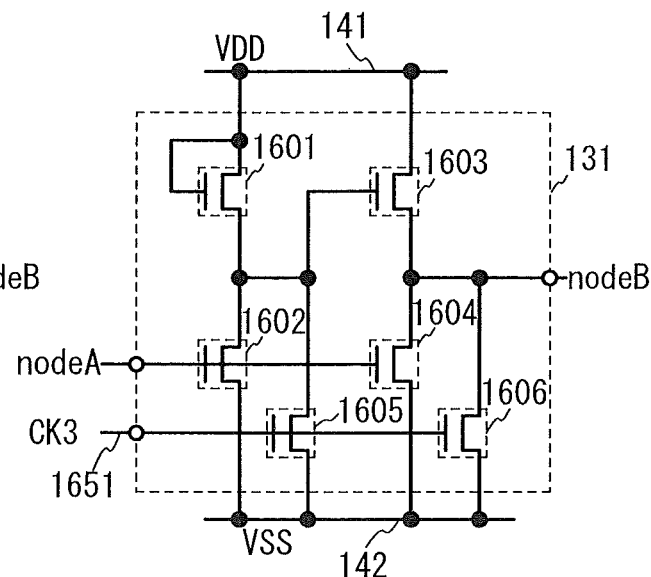

In addition, circuit structures which are different from the structures in FIGS. 16A and 16B are described. Unlike the structure in FIG. 11A, the control circuit 131 illustrated in FIG. 17A is connected to the node A, the node B, the first power supply line 141 to which a high power supply potential is supplied, the second power supply line 142 to which a low power supply potential is supplied, and a wiring 1651 to which the third clock signal CK3 is input (also referred to as a signal line), and includes the n-channel transistors 1601 and, 1602, and an n-channel transistor 1605. The first terminal of the transistor 1601, which is connected to the first power supply line 141, is connected to the gate of the transistor 1601. The gate of the transistor 1602 is connected to the node A. The second terminal of the transistor 1602 is connected to the second power supply line 142. The second terminal of the transistor 1601, the first terminal of the transistor 1602, the first terminal of the transistor 1605, and the node B are connected to each other. A gate of the transistor 1605 is connected to the wiring 1651. A second terminal of the transistor 1605 is connected to the second power supply line 142. Further, the control circuit 131 which is illustrated in FIG. 17B and has a different structure is connected to the node A, the node B, the first power supply line 141 to which a high power supply potential is supplied, the second power supply line 142 to which a low power supply potential is supplied, and the wiring 1651 to which the third clock signal CK3 is input, and includes the n-channel transistors 1601, 1602, 1603, 1604, and 1605 and an n-channel transistor 1606. The first terminal of the transistor 1601, which is connected to the first power supply line 141, is connected to the gate of the transistor 1601. The gate of the transistor 1602 is connected to the node A and the gate of the transistor 1604. The second terminal of the transistor 1602 is connected to the second power supply line 142. The second terminal of the transistor 1601, the first terminal of the transistor 1602, a first terminal of the transistor 1605, and the gate of the transistor 1603 are connected to each other. The first terminal of the transistor 1603 is connected to the first power supply line 141. The second terminal of the transistor 1604 is connected to the second power supply line 142. A gate of the transistor 1605 is connected to the wiring 1651 and a gate of the transistor 1606. The second terminal of the transistor 1605 is connected to the second power supply line 142. The second terminal of the transistor 1603, the first terminal of the transistor 1604, a first terminal of the transistor 1606, and the node B are connected to each other. By provision of the transistor 1605 whose gate is supplied with the third clock signal CK3, the potential of the node B can be repeatedly switched between an H level and an L level in the fourth period T4. Thus, a period during which the transistors 114 and 115 are on can be shortened, so that degradation of the transistors can be suppressed.

Figure 17C:
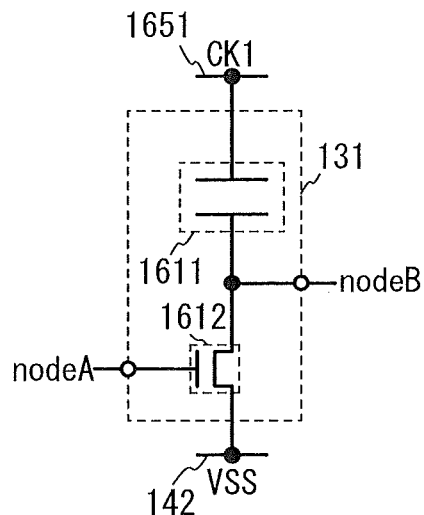

In addition, a circuit structure which is different from the structures in FIGS. 16A and 16B and FIGS. 17A and 17B is described. Unlike the structure in FIG. 11A, the control circuit 131 illustrated in FIG. 17C is connected to the node A, the node B, the wiring 1651 to which the first clock signal is input, and the second power supply line 142 to which a low power supply potential is supplied, and includes a capacitor 1611 and an n-channel transistor 1612. A first electrode (also referred to as a first terminal or one of electrodes) of the capacitor 1611 is connected to the wiring 1651. The gate of the transistor 1602 is connected to the node A. The second terminal of the transistor 1602 is connected to the power supply line 142. A second electrode (also referred to as a second terminal or the other of the electrodes) of the capacitor 1611, the first terminal of the transistor 1602, and the node B are connected to each other. By provision of the capacitor 1611, operation which is similar to the operation when a transistor is provided can be realized, the amount of steady-state current can be reduced, and power consumption can be reduced.

Figure 17D:
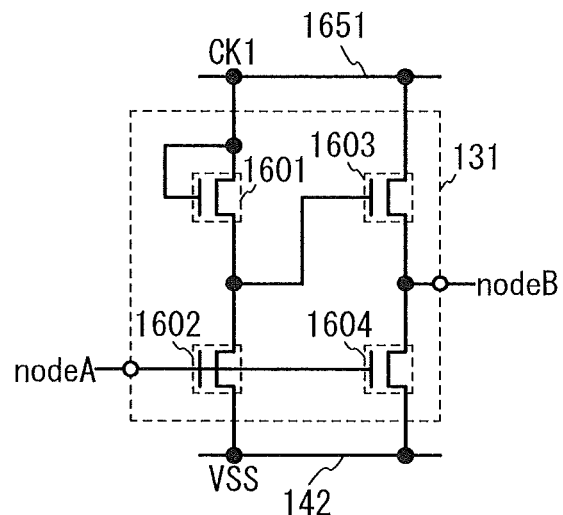

In addition, a circuit structure which is different from the structures in FIGS. 16A and 16B and FIGS. 17A to 17C is described. Unlike the structure in FIG. 11A, the control circuit 131 illustrated in FIG. 17D is connected to the node A, the node B, the wiring 1651 to which the first clock signal is input, and the second power supply line 142 to which a low power supply potential is supplied, and includes the n-channel transistors 1601, 1602, 1603, and 1604. The first terminal of the transistor 1601, which is connected to the wiring 1651, is connected to the gate of the transistor 1601. The gate of the transistor 1602 is connected to the node A and the gate of the transistor 1604. The second terminal of the transistor 1602 is connected to the second power supply line 142. The second terminal of the transistor 1601, the first terminal of the transistor 1602, and the gate of the transistor 1603 are connected to each other. The first terminal of the transistor 1603 is connected to the wiring 1651. The second terminal of the transistor 1604 is connected to the second power supply line 142. The second terminal of the transistor 1603, the first terminal of the transistor 1604, and the node B are connected to each other. With the structure of the control circuit in FIG. 17D, the potential of the node B can be repeatedly switched between an H level and an L level in the fourth period T4. Thus, a period during which the transistors 114 and 115 are on can be shortened, so that degradation of the transistors 114 and 115 can be suppressed. Further, when the node B outputs an H-level signal, the level of gate-source voltage of the transistors 114 and 115 can be raised. Thus, the channel widths of the transistors 114 and 115 can be decreased or delay of an output signal can be reduced.

As described above, in the semiconductor device in this embodiment, malfunctions due to input signals can be suppressed as in Embodiment 1, so that display defects can be reduced. Therefore, a correction circuit or the like for suppressing malfunctions of a circuit is not needed, so that a secondary advantage such as reduction in the size of a display device, reduction in cost, or reduction in the size of a frame can be obtained.

Note that the contents described in each drawing in this embodiment can be freely combined with or replaced with the contents described in any of the other embodiments as appropriate.

Embodiment 3

In this embodiment, examples of display devices are described.

First, an example of a system block of a liquid crystal display device is described with reference to FIG. 18A. The liquid crystal display device includes a circuit 5361, a circuit 5362, a circuit 5363_1, a circuit 53632, a pixel portion 5364, a circuit 5365, and a lighting device 5366. A plurality of wirings 5371 which are extended from the circuit 5362 and a plurality of wirings 5372 which are extended from the circuit 5363_1 and the circuit 53632 are provided in the pixel portion 5364. In addition, pixels 5367 which include display elements such as liquid crystal elements are provided in matrix in respective regions where the plurality of wirings 5371 and the plurality of wirings 5372 intersect with each other.

The circuit 5361 has a function of outputting a signal, voltage, current, or the like to the circuit 5362, the circuit 5363_1, the circuit 53632, and the circuit 5365 in response to a video signal 5360 and can serve as a controller, a control circuit, a timing generator, a power supply circuit, a regulator, or the like. In this embodiment, for example, the circuit 5361 supplies a signal line driver circuit start signal (SSP), a signal line driver circuit clock signal (SCK), a signal line driver circuit inverted clock signal (SCKB), video signal data (DATA), or a latch signal (LAT) to the circuit 5362. Alternatively, for example, the circuit 5361 supplies a scan line driver circuit start signal (GSP), a scan line driver circuit clock signal (GCK), or a scan line driver circuit inverted clock signal (GCKB) to the circuit 5363_1 and the circuit 5363_2. Alternatively, the circuit 5361 outputs a backlight control signal (BLC) to the circuit 5365. Note that this embodiment is not limited to this. The circuit 5361 can supply a variety of signals, voltages, currents, or the like to the circuit 5362, the circuit 5363_1, the circuit 5363_2, and the circuit 5365.

The circuit 5362 has a function of outputting video signals to the plurality of wirings 5371 in response to a signal supplied from the circuit 5361 (e.g., SSP, SCK, SCKB, DATA, or LAT) and can serve as a signal line driver circuit. The circuit 5363_1 and the circuit 5363_2 each have a function of outputting scan signals to the plurality of wirings 5372 in response to a signal supplied from the circuit 5361 (e.g., GSP, GCK, or GCKB) and can serve as a scan line driver circuit. The circuit 5365 has a function of controlling the luminance (or average luminance) of the lighting device 5366 by controlling the amount of electric power supplied to the lighting device 5366, time to supply the electric power to the lighting device 5366, or the like in response to the backlight control signal (BLC) which is supplied from the circuit 5361, and can serve as a power supply circuit.

Note that in the case where video signals are input to the plurality of wirings 5371, the plurality of wirings 5371 can serve as signal lines, video signal lines, source lines, or the like. In the case where scan signals are input to the plurality of wirings 5372, the plurality of wirings 5372 can serve as signal lines, scan lines, gate lines, or the like. Note that this embodiment is not limited to this.

Note that in the case where the same signal is input to the circuit 5363_1 and the circuit 5363_2 from the circuit 5361, scan signals output from the circuit 5363_1 to the plurality of wirings 5372 and scan signals output from the circuit 5363_2 to the plurality of wirings 5372 have approximately the same timings in many cases. Therefore, a load caused by driving of the circuit 5363_1 and the circuit 5363_2 can be reduced. Accordingly, the display device can be made larger. Alternatively, the display device can have higher definition. Alternatively, since the channel width of transistors included in the circuit 5363_1 and the circuit 5363_2 can be decreased, a display device with a narrower frame can be obtained. Note that this embodiment is not limited to this. The circuit 5361 can supply different signals to the circuit 5363_1 and the circuit 5363_2.

Note that one of the circuit 5363_1 and the circuit 5363_2 can be eliminated.

Note that a wiring such as a capacitor line, a power supply line, or a scan line can be additionally provided in the pixel portion 5364. Then, the circuit 5361 can output a signal, voltage, or the like to such a wiring. Alternatively, a circuit which is similar to the circuit 5363_1 or the circuit 5363_2 can be additionally provided. The additionally provided circuit can output a signal such as a scan signal to the additionally provided wiring.

Note that the pixel 5367 can include a light-emitting element such as an EL element as a display element. In this case, as illustrated in FIG. 18B, since the display element can emit light, the circuit 5365 and the lighting device 5366 can be eliminated. In addition, in order to supply electric power to the display element, a plurality of wirings 5373 which can serve as power supply lines can be provided in the pixel portion 5364. The circuit 5361 can supply power supply voltage called voltage (ANO) to the wirings 5373. The wirings 5373 can be separately connected to the pixels in accordance with color elements or connected to all the pixels.

Note that FIG. 18B illustrates an example in which the circuit 5361 supplies different signals to the circuit 5363_1 and the circuit 5363_2. The circuit 5361 supplies signals such as a scan line driver circuit start signal (GSP1), a scan line driver circuit clock signal (GCK1), and a scan line driver circuit inverted clock signal (GCKB1) to the circuit 5363_1. In addition, the circuit 5361 supplies signals such as a scan line driver circuit start signal (GSP2), a scan line driver circuit clock signal (GCK2), and a scan line driver circuit inverted clock signal (GCKB2) to the circuit 5363_2. In this case, the circuit 5363_1 can scan only wirings in odd-numbered rows of the plurality of wirings 5372 and the circuit 5363_2 can scan only wirings in even-numbered rows of the plurality of wirings 5372. Thus, the driving frequency of the circuit 5363_1 and the circuit 5363_2 can be lowered, so that power consumption can be reduced. Alternatively, an area in which a flip-flop of one stage can be laid out can be made larger. Therefore, a display device can have higher definition. Alternatively, a display device can be made larger. Note that this embodiment is not limited to this. As in FIG. 18A, the circuit 5361 can supply the same signal to the circuit 5363_1 and the circuit 5363_2.

Figure 18A:
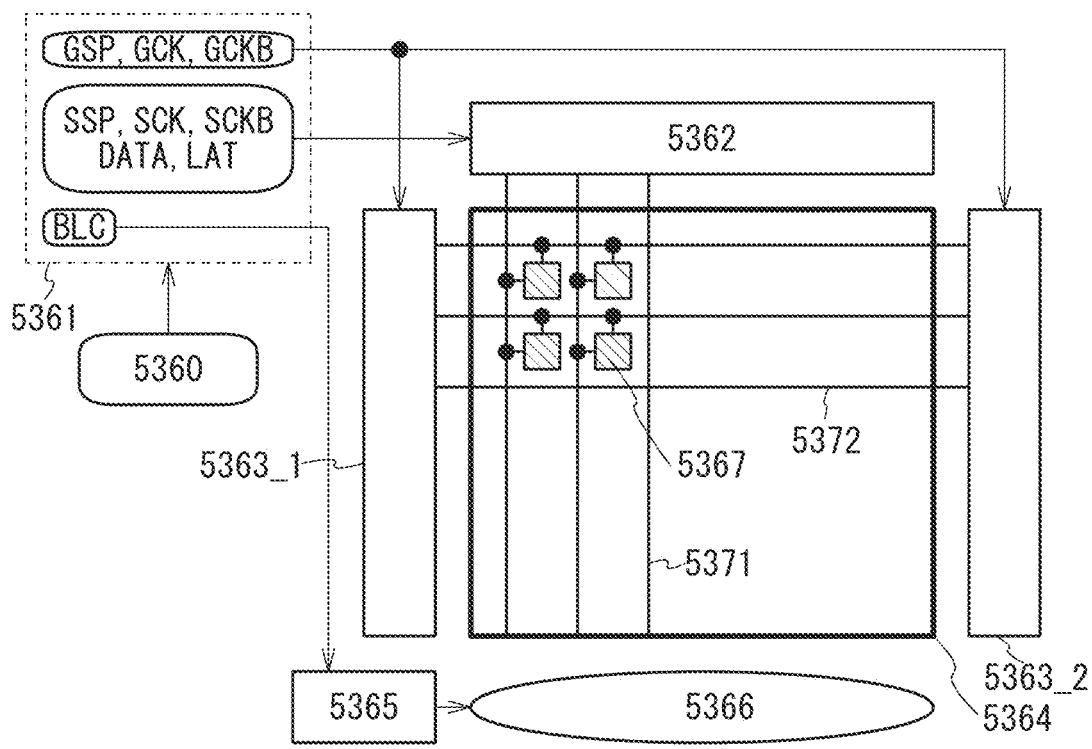
FIGS. 18A and 18B are block diagrams of display devices.
Figure 18B:
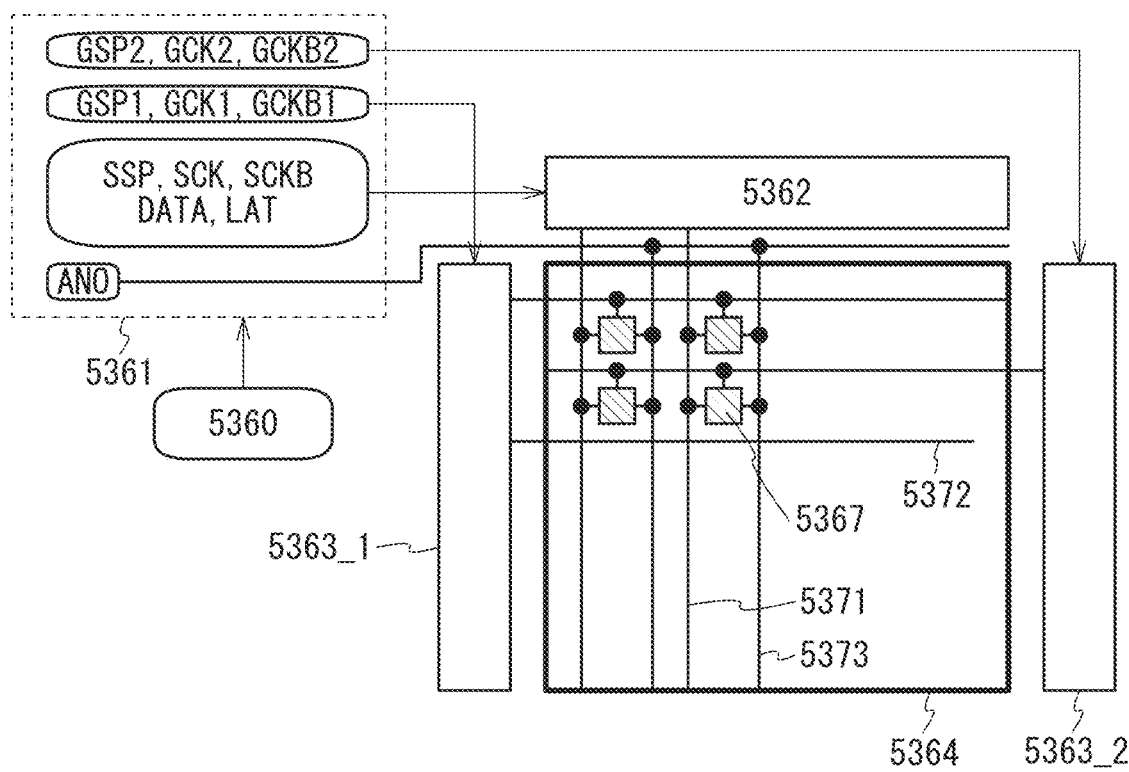

Note that as in FIG. 18B, the circuit 5361 can supply different signals to the circuit 5363_1 and the circuit 5363_2 in FIG. 18A.

Thus far, the example of a system block of a display device is described.

Next, examples of structures of the display devices are described with reference to FIGS. 19A to 19E.

Figure 19A:
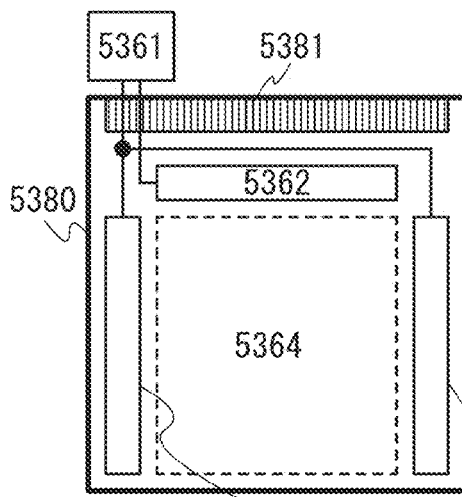
FIGS. 19A to 19E are block diagrams of display devices.

In FIG. 19A, circuits which have a function of outputting signals to the pixel portion 5364 (e.g., the circuit 5362, the circuit 5363_1, and the circuit 5363_2) are formed over the same substrate 5380 as the pixel portion 5364. In addition, the circuit 5361 is formed over a different substrate from the pixel portion 5364. In this manner, since the number of external components is reduced, reduction in cost can be achieved. Alternatively, since the number of signals or voltages input to the substrate 5380 is reduced, the number of connections between the substrate 5380 and the external component can be reduced. Therefore, improvement in reliability or the increase in yield can be achieved.

Note that in the case where the circuit is formed over a different substrate from the pixel portion 5364, the substrate can be mounted on an FPC (flexible printed circuit) by TAB (tape automated bonding). Alternatively, the substrate can be mounted on the same substrate 5380 as the pixel portion 5364 by COG (chip on glass).

Note that in the case where the circuit is formed over a different substrate from the pixel portion 5364, a transistor formed using a single crystal semiconductor can be formed on the substrate. Therefore, the circuit formed over the substrate can have advantages such as improvement in driving frequency, improvement in driving voltage, and suppression of variations in output signals.

Note that a signal, voltage, current, or the like is input from an external circuit through an input terminal 5381 in many cases.

Figure 19B:
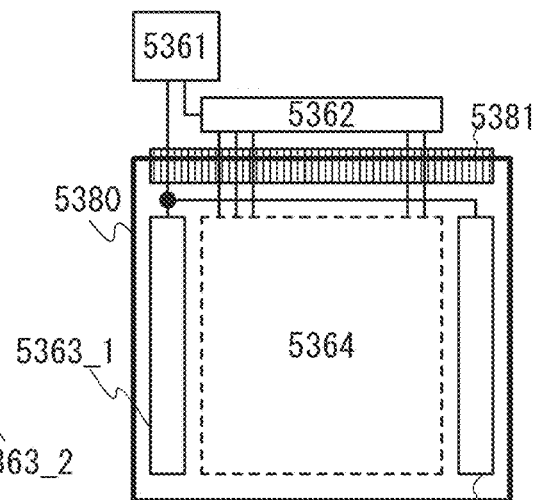

In FIG. 19B, circuits with low driving frequency (e.g., the circuit 5363_1 and the circuit 5363_2) are formed over the same substrate 5380 as the pixel portion 5364. In addition, the circuit 5361 and the circuit 5362 are formed over a different substrate from the pixel portion 5364. In this manner, since the circuit formed over the substrate 5380 can be formed using a transistor with low mobility, a non-single-crystal semiconductor, an amorphous semiconductor, a microcrystalline semiconductor, an organic semiconductor, an oxide semiconductor, or the like can be used for a semiconductor layer of the transistor. Accordingly, the increase in the size of the display device, reduction in the number of steps, reduction in cost, improvement in yield, or the like can be achieved.

Figure 19C:
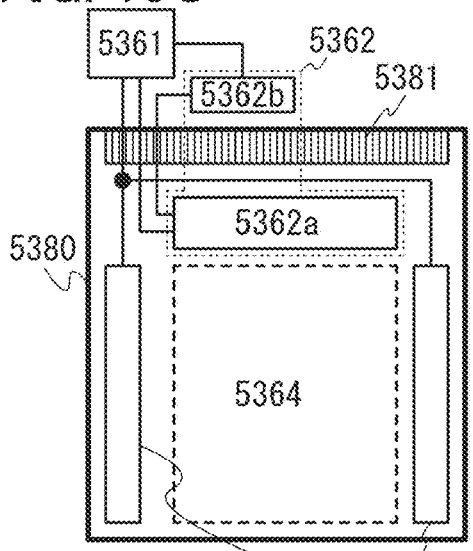

Note that as illustrated in FIG. 19C, part of the circuit 5362 (a circuit 5362a) can be formed over the same substrate 5380 as the pixel portion 5364 and the other part of the circuit 5362 (a circuit 5362b) can be formed over a different substrate from the pixel portion 5364. The circuit 5362a includes a circuit which can be formed using a transistor with low mobility (e.g., a shift register, a selector, or a switch) in many cases. In addition, the circuit 5362b includes a circuit which is preferably formed using a transistor with high mobility and few variations in characteristics (e.g., a shift register, a latch circuit, a buffer circuit, a DA converter circuit, or an AD converter circuit) in many cases. In this manner, as in FIG. 19B, a non-single-crystal semiconductor, an amorphous semiconductor, a microcrystalline semiconductor, an organic semiconductor, an oxide semiconductor, or the like can be used for a semiconductor layer of the transistor. Further, reduction in external components can be achieved.

Figure 19D:
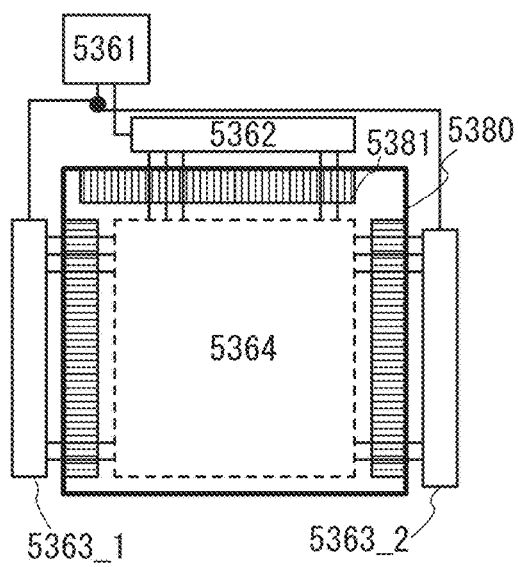

In FIG. 19D, circuits which have a function of outputting signals to the pixel portion 5364 (e.g., the circuit 5362, the circuit 5363_1, and the circuit 5363_2) and a circuit which has a function of controlling these circuits (e.g., the circuit 5361) are formed over a different substrate from the pixel portion 5364. In this manner, since the pixel portion and peripheral circuits thereof can be formed over different substrates, improvement in yield can be achieved.

Note that as in FIG. 19D, the circuit 5363_1 and the circuit 5363_2 can be formed over a different substrate from the pixel portion 5364 in FIGS. 19A to 19C.

Figure 19E:
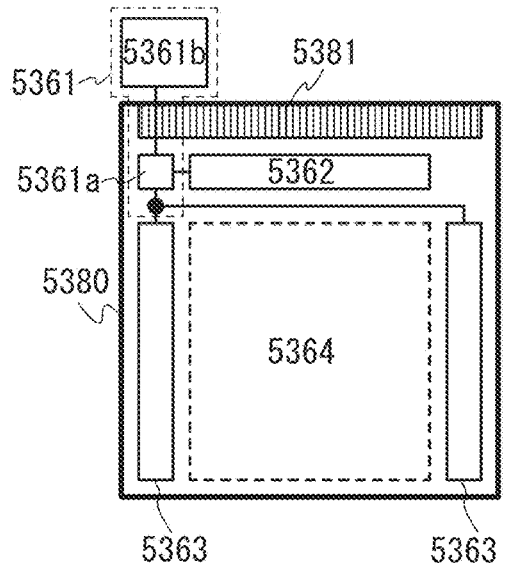

In FIG. 19E, part of the circuit 5361 (a circuit 5361a) is formed over the same substrate 5380 as the pixel portion 5364 and the other part of the circuit 5361 (a circuit 5361b) is formed over a different substrate from the pixel portion 5364. The circuit 5361a includes a circuit which can be formed using a transistor with low mobility (e.g., a switch, a selector, or a level shift circuit) in many cases. In addition, the circuit 5361b includes a circuit which is preferably formed using a transistor with high mobility and few variations (e.g., a shift register, a timing generator, an oscillator, a regulator, or an analog buffer) in many cases.

Note that also in FIGS. 19A to 19D, the circuit 5361a can be formed over the same substrate as the pixel portion 5364 and the circuit 5361b can be formed over a different substrate from the pixel portion 5364.

Here, for the circuits 5363_1 and 5363_2, the semiconductor device or the shift register in Embodiment 1 or 2 can be used. In this case, when the circuit 5363_1, the circuit 5363_2, and the pixel portion are formed over the same substrate, all the transistors that are formed over the substrate can be n-channel transistors or p-channel transistors. Therefore, reduction in the number of steps, improvement in yield, improvement in reliability, or reduction in cost can be achieved. In particular, in the case where all the transistors are n-channel transistors, a non-single-crystal semiconductor, an amorphous semiconductor, a microcrystalline semiconductor, an organic semiconductor, an oxide semiconductor, or the like can be used for a semiconductor layer of each transistor. Thus, the increase in the size of the display device, reduction in cost, improvement in yield, or the like can be achieved.

In the semiconductor device or the shift register in Embodiment 1 or 2, the channel width of the transistor can be decreased. Thus, a layout area can be reduced, so that the size of a frame can be reduced. Alternatively, since the layout area can be reduced, resolution can be increased.

Alternatively, in the semiconductor device or the shift register in Embodiment 1 or 2, parasitic capacitance can be reduced. Thus, power consumption can be reduced. Alternatively, the current supply capability of an external circuit can be decreased, or the size of the external circuit or the size of a display device including the external circuit can be reduced.

Note that in a transistor in which a non-single-crystal semiconductor, an amorphous semiconductor, a microcrystalline semiconductor, an organic semiconductor, an oxide semiconductor, or the like is used for a semiconductor layer, degradation in characteristics, such as the increase in the threshold voltage or reduction in mobility, often occurs. However, in the semiconductor device or the shift register in Embodiment 1 or 2, degradation in characteristics of a transistor can be suppressed, so that the life of a display device can be prolonged.

Note that the semiconductor device or the shift register in Embodiment 1 or 2 can be used as part of the circuit 5362. For example, the circuit 5362a can include the semiconductor device or the shift register in Embodiment 1 or 2.

Embodiment 4

In this embodiment, an example of a signal line driver circuit is described. Note that the signal line driver circuit can be referred to as a semiconductor device or a signal generation circuit.

An example of a signal line driver circuit is described with reference to FIG. 20A. The signal line driver circuit includes a circuit 2001 and a circuit 2002. The circuit 2002 includes a plurality of circuits 2002_1 to 2002_N (N is a natural number). The circuits 2002_1 to 2002_N each include a plurality of transistors 2003_1 to 2003_k (k is a natural number). The transistors 2003_1 to 2003_k are n-channel transistors. However, this embodiment is not limited to this. The transistors 2003_1 to 2003_k can be either p-channel transistors or CMOS switches.

The connection relation of the signal line driver circuit is described taking the circuit 2002_1 as an example. First terminals of the transistors 2003_1 to 2003_k are connected to wirings 2004_1 to 2004_k, respectively. Second terminals of the transistors 2003_1 to 2003_k are connected to wirings S1 to Sk, respectively. Gates of the transistors 2003_1 to 2003_k are connected to the wiring 2004_1.

The circuit 2001 has a function of sequentially outputting high-level signals to wirings 2005_1 to 2005_N or a function of sequentially selecting the circuits 2002_1 to 2002_N. In this manner, the circuit 2001 functions as a shift register. However, this embodiment is not limited to this. The circuit 2001 can output high-level signals to the wirings 20051 to 2005_N in different orders. Alternatively, the circuits 2002_1 to 2002_N can be selected in different orders. In this manner, the circuit 2001 can function as a decoder.

The circuit 2002_1 has a function of controlling conduction between the wirings 20041 to 2004_k and the wrings S1 to Sk. Alternatively, the circuit 2001_1 has a function of supplying potentials of the wirings 20041 to 2004_$k$ to the wirings S1 to Sk. In this manner, the circuit 2002_1 can function as a selector. However, this embodiment is not limited to this. Note that each of the circuits 2002_2 to 2002_N can have a function which is similar to the function of the circuit 2002_1.

Each of the transistors 2003_1 to 2003_N has a function of controlling the conduction between the wirings 2004_1 to 2004_$k$ and the wrings S1 to Sk. Alternatively, each of the transistors 2003_1 to 2003_N has a function of supplying the potentials of the wirings 2004_1 to 2004_$k$ to the wirings S1 to Sk. For example, the transistor 2003_1 has a function of controlling conduction between the wiring 2004_1 and the wiring S1. Alternatively, the transistor 2003_1 has a function of supplying the potential of the wiring 2004_1 to the wiring S1. In this manner, each of the transistors 2003_1 to 2003_N functions as a switch. However, this embodiment is not limited to this.

Note that different signals are supplied to the wirings 2004_1 to 2004_$k$ in many cases. The signals are analog signals corresponding to image data or image signals in many cases. In this manner, the signals can function as video signals. Thus, the wirings 2004_1 to 2004_$k$ can function as signal lines. However, this embodiment is not limited to this. For example, depending on the pixel structure, the signals can be digital signals, analog voltage, or analog current.

Figure 20A:
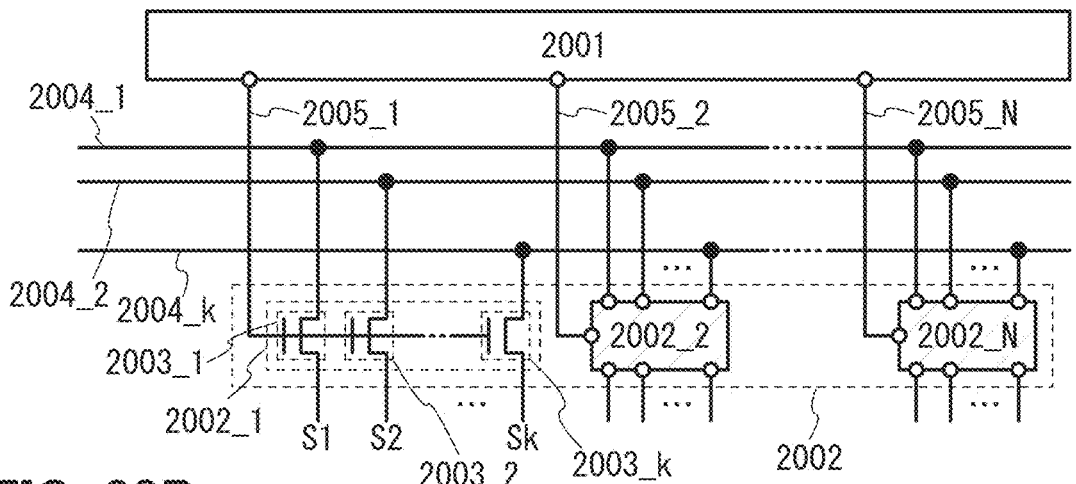
FIGS. 20A to 20D are circuit diagrams of a semiconductor device and a timing chart for illustrating the operation of the semiconductor device.
Figure 20B:
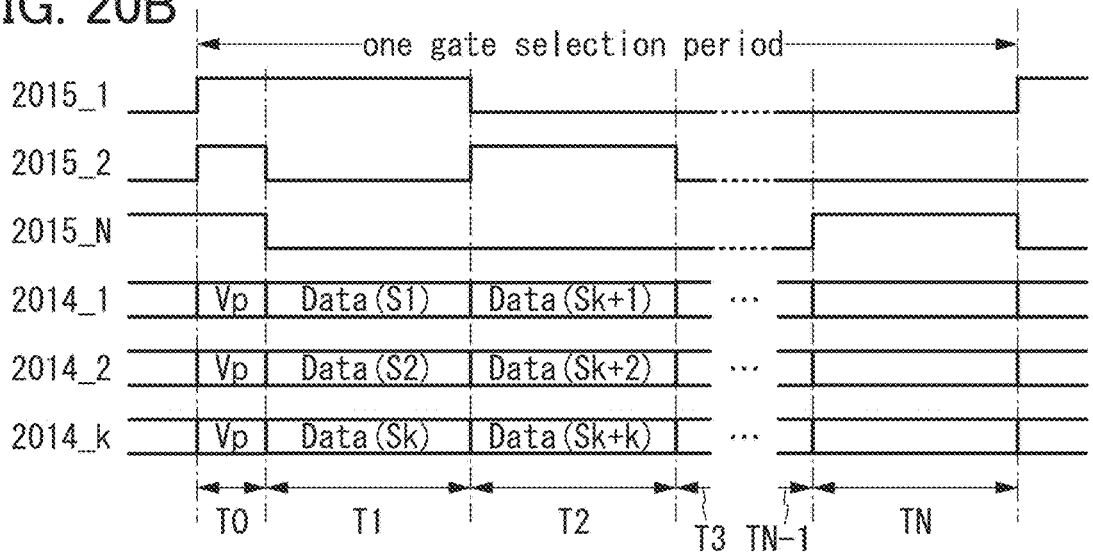

Next, the operation of the signal line driver circuit in FIG. 20A is described with reference to a timing chart in FIG. 20B. FIG. 20B illustrates examples of signals 2015_1 to 2015_N and signals 2014_1 to 2014_$k$. The signals 2015_1 to 2015_N are examples of output signals in the circuit 2001. The signals 2014_1 to 2014_$k$ are examples of signals which are input to the wirings 20041 to 2004_$k$. Note that one operation period of the signal line driver circuit corresponds to one gate selection period in a display device. For example, one gate selection period is divided into a period T0 to TN. The period T0 is a period for applying precharge voltage to pixels in a selected row concurrently and can serve as a precharge period. Each of the periods T1 to TN is a period during which video signals are written to pixels in the selected row and can serve as a writing period.

First, in the period T0, the circuit 2001 supplies high-level signals to the wirings 2005_1 to 2005_N. Then, for example, the transistors 2003_1 to 2003_$k$ are turned on in the circuit 20021, so that the wirings 2004_1 to 2004_$k$ and the wirings S1 to Sk are brought into conduction. In this case, precharge voltage Vp is applied to the wirings 2004_1 to 2004_$k$. Thus, the precharge voltage Vp is output to the wirings S1 to Sk through the transistors 2003_1 to 2003_$k$. Thus, the precharge voltage Vp is written to the pixels in the selected row, so that the pixels in the selected row are precharged.

In the periods T1 to TN, the circuit 2001 sequentially outputs high-level signals to the wirings 2005_1 to 2005_N. For example, in the period T1, the circuit 2001 outputs a high-level signal to the wirings 2005_1. Then, the transistors 2003_1 to 2003_$k$ are turned on, so that the wirings 20041 to 2004_$k$ and the wirings S1 to Sk are brought into conduction. In this case, Data (S1) to Data (Sk) are input to the wirings 2004_1 to 2004_$k$, respectively. The Data (S1) to Data (Sk) are input to pixels in a selected row in a first to k-th columns through the transistors 2003_1 to 2003_$k$, respectively. Thus, in the periods T1 to TN, video signals are sequentially written to the pixels in the selected row by k columns.

By writing video signals to pixels by a plurality of columns, the number of video signals or the number of wirings can be reduced. Thus, the number of connections to an external circuit can be reduced, so that improvement in yield, improvement in reliability, reduction in the number of components, and/or reduction in cost can be achieved. Alternatively, by writing video signals to pixels by a plurality of columns, writing time can be extended. Thus, shortage of writing of video signals can be prevented, so that display quality can be improved.

Note that by increasing k, the number of connections to the external circuit can be reduced. However, if k is too large, time to write signals to pixels would be shortened. Thus, it is preferable that k≤6. It is more preferable that k≤3. It is much more preferable that k=2. However, this embodiment is not limited to this.

In particular, in the case where the number of color elements of a pixel is n (n is a natural number), k=n or k=n×d (d is a natural number) is preferable. For example, in the case where the pixel is divided into color elements of red (R), green (G), and blue (B), k=3 or k=3×d is preferable. However, this embodiment is not limited to this. For example, in the case where the pixel is divided into m (m is a natural number) pieces of pixels (hereinafter also referred to as subpixels), k=m or k=m×d is preferable. For example, in the case where the pixel is divided into two subpixels, k=2 is preferable. Alternatively, in the case where the number of color elements of the pixel is n, k=m×n or k=m×n×d is preferable. However, this embodiment is not limited to this.

Figure 20C:
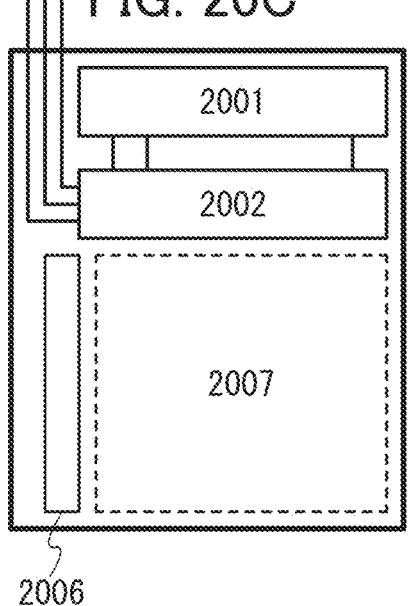
Figure 20D:
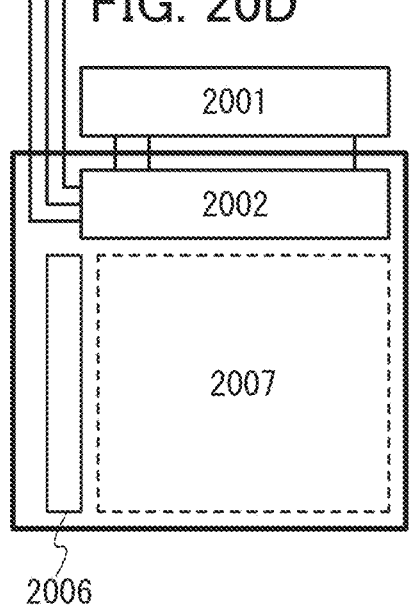

Note that the drive frequencies of the circuit 2001 and the circuit 2002 are low in many cases, so that the circuit 2001 and the circuit 2002 can be formed over the same substrate as a pixel portion 2007 as illustrated in FIG. 20C. Thus, the number of connections between the substrate over which the pixel portion is formed and an external circuit can be reduced, so that improvement in yield, improvement in reliability, reduction in the number of components, or reduction in cost can be achieved, for example. In particular, when a signal line driver circuit 2006 is formed over the same substrate as the pixel portion 2007, the number of connections to the external circuit can be further reduced. However, this embodiment is not limited to this. For example, as illustrated in FIG. 20D, the circuit 2001 can be formed over a substrate which is different from the substrate over which the pixel portion 2007 is formed, and the circuit 2002 can be formed over the same substrate as the pixel portion 2007. Also in this case, the number of connections between the substrate over which the pixel portion is formed and the external circuit can be reduced, so that improvement in yield, improvement in reliability, reduction in the number of components, or reduction in cost can be achieved, for example. Alternatively, since the number of circuits which are formed over the same substrate as the pixel portion 2007 is made smaller, the size of a frame can be reduced.

Note that the semiconductor device or the shift register described in Embodiment 1 or 2 can be used for the circuit 2001. In this case, all the transistors included in the circuit 2001 can be n-channel transistors or p-channel transistors. Therefore, reduction in the number of steps, improvement in yield, or reduction in cost can be achieved.

Note that not only the transistors included in the circuit 2001 but also all the transistors included in the circuits 2002_1 to 2002_N can be n-channel transistors or p-channel transistors. Therefore, in the case where the circuit 2001 and the circuits 2002_1 to 2002_N are formed over the same substrate as the pixel portion, reduction in the number of steps, improvement in yield, or reduction in cost can be achieved. In particular, in the case where all the transistors are n-channel transistors, a non-single-crystal semiconductor, an amorphous semiconductor, a microcrystalline semiconductor, an organic semiconductor, an oxide semiconductor, or the like can be used for a semiconductor layer of each transistor. This is because the drive frequencies of the circuit 2001 and the circuits 2002_1 to 2002_N are low in many cases.

Embodiment 5

In this embodiment, examples of protection circuits are described.

First, an example of a protection circuit is described with reference to FIG. 21A. A protection circuit 3000 is provided in order to prevent a semiconductor device (e.g., a transistor, a capacitor, or a circuit) which is connected to a wiring 3011, or the like from being damaged by ESD (electrostatic discharge). The protection circuit 3000 includes a transistor 3001 and a transistor 3002. The transistor 3001 and the transistor 3002 are n-channel transistors in many cases. However, this embodiment is not limited to this. The transistor 3001 and the transistor 3002 can be p-channel transistors.

A first terminal of the transistor 3001 is connected to a wiring 3012. A second terminal of the transistor 3001 is connected to the wiring 3011. A gate of the transistor 3001 is connected to the wiring 3011. A first terminal of the transistor 3002 is connected to a wiring 3013. A second terminal of the transistor 3002 is connected to the wiring 3011. A gate of the transistor 3002 is connected to the wiring 3013.

For example, a signal (e.g., a scan signal, a video signal, a clock signal, a start signal, a reset signal, or a selection signal) or voltage (e.g., negative power supply voltage, ground voltage, or positive power supply voltage) can be supplied to the wiring 3011. For example, positive power supply voltage (VDD) is supplied to the wiring 3012. For example, negative power supply voltage (VSS), ground voltage, or the like is supplied to the wiring 3013. However, this embodiment is not limited to this.

When a potential of the wiring 3011 is between VSS and VDD, the transistor 3001 and the transistor 3002 are turned off. Thus, voltage, a signal, or the like supplied to the wiring 3011 is supplied to the semiconductor device which is connected to the wiring 3011. Note that due to an adverse effect of static electricity, a potential which is higher or lower than power supply voltage is supplied to the wiring 3011 in some cases. Then, the semiconductor device which is connected to the wiring 3011 might be broken by the potential which is higher or lower than the power supply voltage. In order to prevent such a semiconductor device from being damaged by electrostatic discharge, the transistor 3001 is turned on in the case where the potential which is higher than the power supply voltage is supplied to the wiring 3011. Then, since electric charge accumulated in the wiring 3011 is transferred to the wiring 3012 through the transistor 3001, the potential of the wiring 3011 is lowered. On the other hand, in the case where the potential which is lower than the power supply voltage is supplied to the wiring 3011, the transistor 3002 is turned on. Then, since the electric charge accumulated in the wiring 3011 is transferred to the wiring 3013 through the transistor 3002, the potential of the wiring 3011 is raised. Thus, the semiconductor device which is connected to the wiring 3011 can be prevented from being damaged by electrostatic discharge.

Figure 21A:
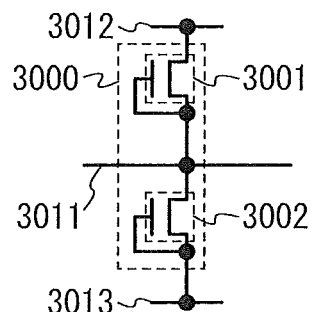
FIGS. 21A to 21G are circuit diagrams of protection circuits.
Figure 21B:
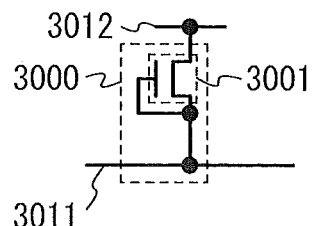
Figure 21C:
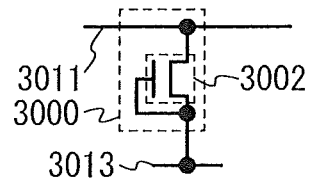

Note that in the structure illustrated in FIG. 21A, the transistor 3002 can be eliminated, as illustrated in FIG. 21B. Alternatively, in the structure illustrated in FIG. 21A, the transistor 3001 can be eliminated, as illustrated in FIG. 21C. However, this embodiment is not limited to this.

Figure 21D:
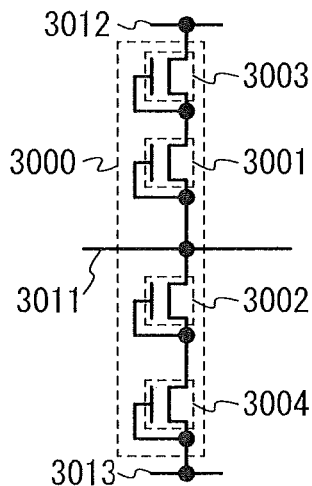
Figure 21E:
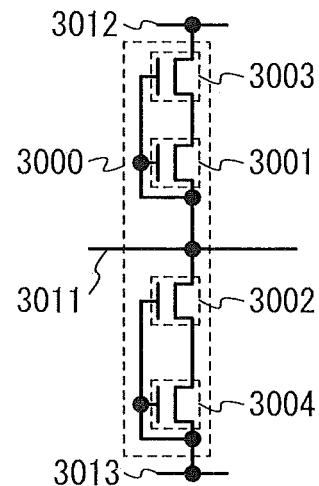

Note that in the structures illustrated in FIGS. 21A to 21C, transistors can be connected in series between the wiring 3011 and the wiring 3012, as illustrated in FIG. 21D. Alternatively, transistors can be connected in series between the wiring 3011 and the wiring 3013. A first terminal of a transistor 3003 is connected to the wiring 3012. A second terminal of the transistor 3003 is connected to the first terminal of the transistor 3001. A gate of the transistor 3003 is connected to the first terminal of the transistor 3001. A first terminal of a transistor 3004 is connected to the wiring 3013. A second terminal of the transistor 3004 is connected to the first terminal of the transistor 3002. A gate of the transistor 3004 is connected to the first terminal of the transistor 3004. However, this embodiment is not limited to this. For example, as illustrated in FIG. 21E, the gate of the transistor 3001 and the gate of the transistor 3003 can be connected to each other. Alternatively, the gate of the transistor 3002 and the gate of the transistor 3004 can be connected to each other.

Figure 21F:
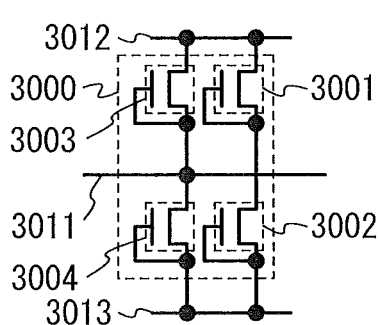

Note that in the structures illustrated in FIGS. 21A to 21E, the transistors can be connected in parallel between the wiring 3011 and the wiring 3012, as illustrated in FIG. 21F. Alternatively, the transistors can be connected in parallel between the wiring 3011 and the wiring 3013. The first terminal of the transistor 3003 is connected to the wiring 3012. The second terminal of the transistor 3003 is connected to the wiring 3011. The gate of the transistor 3003 is connected to the wiring 3011. The first terminal of the transistor 3004 is connected to the wiring 3013. The second terminal of the transistor 3004 is connected to the wiring 3011. The gate of the transistor 3004 is connected to the wiring 3013.

Figure 21G:
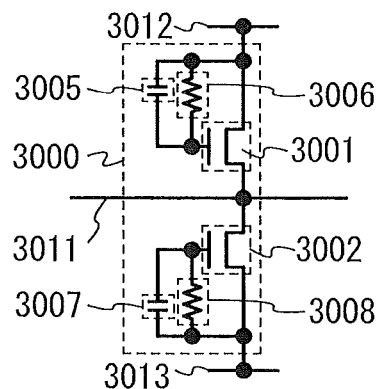

Note that in the structures illustrated in FIGS. 21A to 21F, a capacitor 3005 and a resistor 3006 can be connected in parallel between the gate of the transistor 3001 and the first terminal of the transistor 3001, as illustrated in FIG. 21G. Alternatively, a capacitor 3007 and a resistor 3008 can be connected in parallel between the gate of the transistor 3002 and the first terminal of the transistor 3002. Thus, breakage or degradation of the protection circuit 3000 itself can be prevented. For example, in the case where a potential which is higher than power supply voltage is supplied to the wiring 3011, Vgs of the transistor 3001 is raised. Thus, the transistor 3001 is turned on, so that the potential of the wiring 3011 is lowered. However, since high voltage is applied between the gate of the transistor 3001 and the second terminal of the transistor 3001, the transistor might be damaged or degraded. In order to prevent damage or degradation of the transistor, a potential of the gate of the transistor 3001 is raised and Vgs of the transistor 3001 is lowered. The capacitor 3005 is used for realizing this operation. When the transistor 3001 is turned on, a potential of the first terminal of the transistor 3001 is raised instantaneously. Then, with capacitive coupling of the capacitor 3005, the potential of the gate of the transistor 3001 is raised. In this manner, Vgs of the transistor 3001 can be lowered, and breakage or degradation of the transistor 3001 can be suppressed. However, this embodiment is not limited to this. In a similar manner, in the case where a potential which is lower than the power supply voltage is supplied to the wiring 3011, a potential of the first terminal of the transistor 3002 is lowered instantaneously. Then, with capacitive coupling of the capacitor 3007, the potential of the gate of the transistor 3002 is lowered. In this manner, Vgs of the transistor 3002 can be lowered, so that breakage or degradation of the transistor 3002 can be suppressed.

Figure 22A:
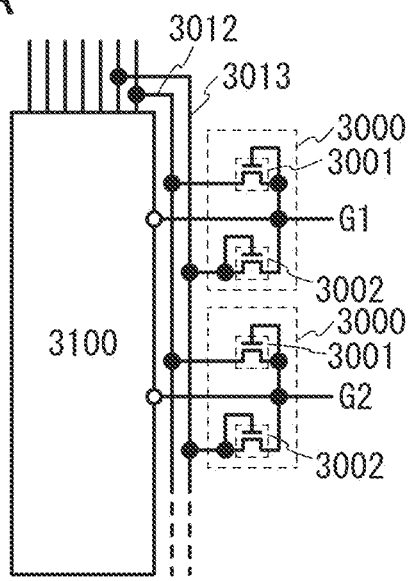
FIGS. 22A and 22B are circuit diagrams of protection circuits.
Figure 22B:
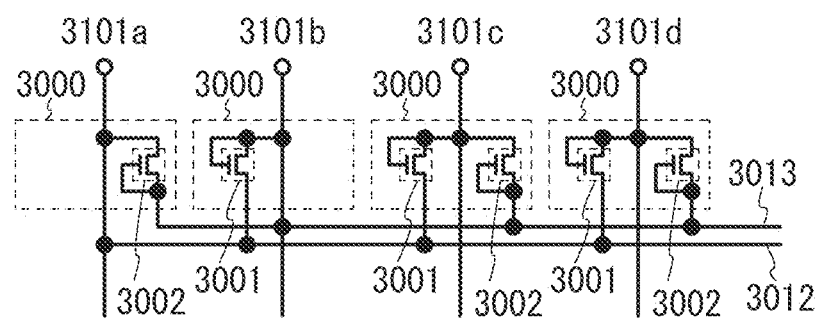

Here, the protection circuits illustrated in FIGS. 21A to 21G can be used for various purposes. FIG. 22A illustrates a structure when a protection circuit is provided in a gate signal line, for example. In this case, the wiring 3012 and the wiring 3013 can be connected to any of wirings connected to a gate driver 3100. Thus, the number of power sources and the number of wirings can be reduced. FIG. 22B illustrates a structure when a protection circuit is provided in a terminal to which a signal or voltage is supplied from the outside such as an FPC, for example. In this case, the wiring 3012 and the wiring 3013 can be connected to any of external terminals. For example, the wiring 3012 is connected to a terminal 3101a, and the wiring 3013 is connected to a terminal 3101b. In this case, in a protection circuit provided in the terminal 3101a, the transistor 3001 can be eliminated. In a similar manner, in a protection circuit provided in the terminal 3101b, the transistor 3002 can be eliminated. Thus, the number of transistors can be reduced, so that a layout area can be reduced.

Embodiment 6

In this embodiment, examples of structures of transistors are described with reference to FIGS. 23A to 23C.

Figure 23A:
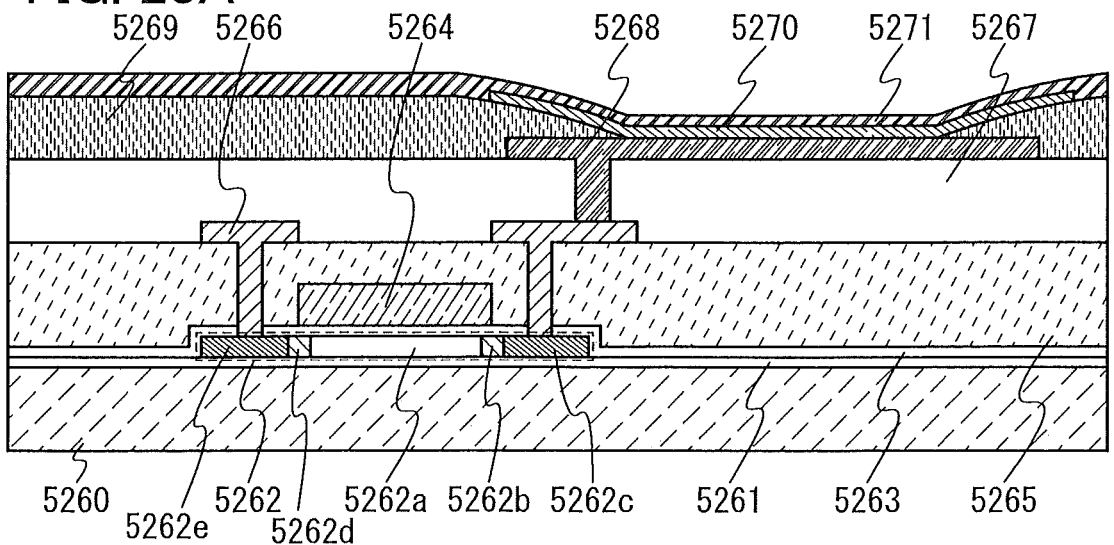
FIGS. 23A to 23C are cross-sectional views of transistors.

FIG. 23A illustrates an example of the structure of a top-gate transistor or an example of the structure of a display device. FIG. 23B illustrates an example of the structure of a bottom-gate transistor or an example of the structure of a display device. FIG. 23C illustrates an example of the structure of a transistor formed using a semiconductor substrate.

The transistor in FIG. 23A includes a substrate 5260; an insulating layer 5261 formed over the substrate 5260; a semiconductor layer 5262 which is formed over the insulating layer 5261 and is provided with a region 5262a, a region 5262b, a region 5262c, a region 5262d, and a region 5262e; an insulating layer 5263 formed so as to cover the semiconductor layer 5262; a conductive layer 5264 formed over the semiconductor layer 5262 and the insulating layer 5263; an insulating layer 5265 which is formed over the insulating layer 5263 and the conductive layer 5264 and is provided with openings; and a conductive layer 5266 which is formed over the insulating layer 5265 and in the openings formed in the insulating layer 5265.

Figure 23B:
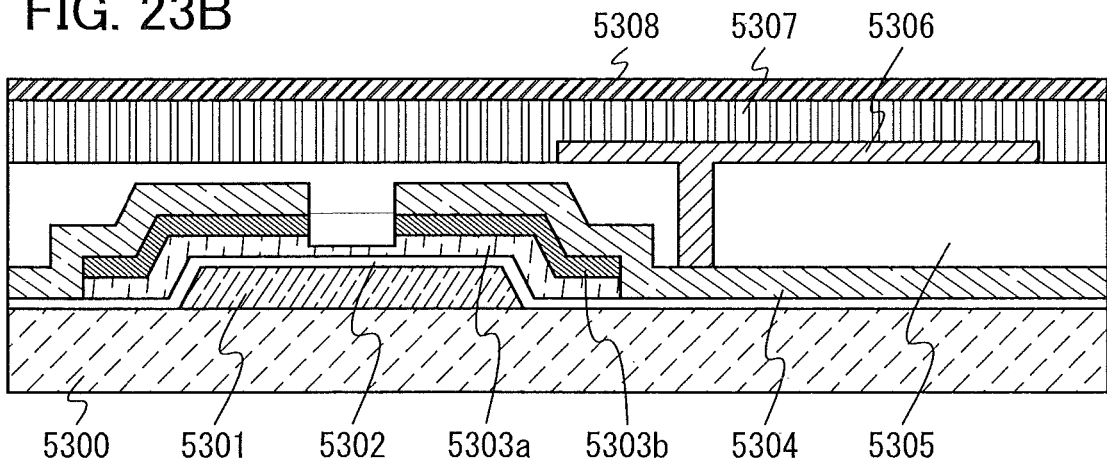

The transistor in FIG. 23B includes a substrate 5300; a conductive layer 5301 formed over the substrate 5300; an insulating layer 5302 formed so as to cover the conductive layer 5301; a semiconductor layer 5303a formed over the conductive layer 5301 and the insulating layer 5302; a semiconductor layer 5303b formed over the semiconductor layer 5303a; a conductive layer 5304 formed over the semiconductor layer 5303b and the insulating layer 5302; an insulating layer 5305 which is formed over the insulating layer 5302 and the conductive layer 5304 and is provided with an opening; and a conductive layer 5306 which is formed over the insulating layer 5305 and in the opening formed in the insulating layer 5305.

Figure 23C:
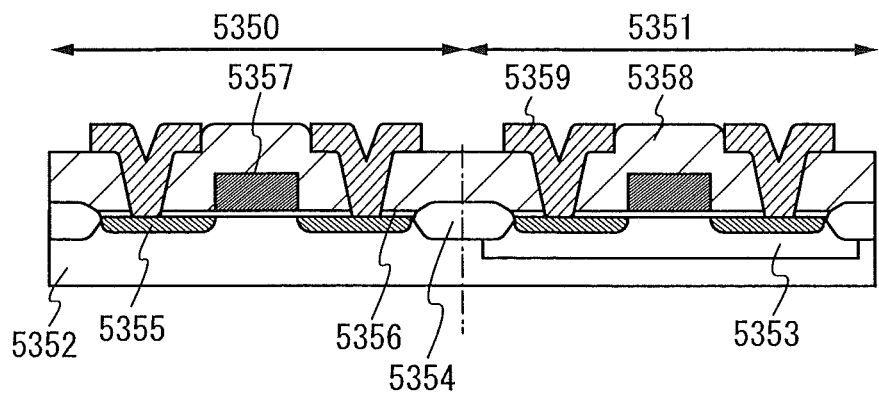

The transistor in FIG. 23C includes a semiconductor substrate 5352 including a region 5353 and a region 5355; an insulating layer 5356 formed over the semiconductor substrate 5352; an insulating layer 5354 formed over the semiconductor substrate 5352; a conductive layer 5357 formed over the insulating layer 5356; an insulating layer 5358 which is formed over the insulating layer 5354, the insulating layer 5356, and the conductive layer 5357 and is provided with openings; and a conductive layer 5359 which is formed over the insulating layer 5358 and in the openings formed in the insulating layer 5358. Thus, a transistor is formed in each of a region 5350 and a region 5351.

Note that in each of the structures of the transistors illustrated in FIGS. 23A to 23C, as illustrated in FIG. 23A, over the transistor, it is possible to form an insulating layer 5267 which is formed over the conductive layer 5266 and the insulating layer 5265 and is provided with an opening; a conductive layer 5268 which is formed over the insulating layer 5267 and in the opening formed in the insulating layer 5267; an insulating layer 5269 which is formed over the insulating layer 5267 and the conductive layer 5268 and is provided with an opening; a light-emitting layer 5270 which is formed over the insulating layer 5269 and in the opening formed in the insulating layer 5269; and a conductive layer 5271 formed over the insulating layer 5269 and the light-emitting layer 5270.

Note that in each of the structures of the transistors illustrated in FIGS. 23A to 23C, as illustrated in FIG. 23B, over the transistor, it is possible to form a liquid crystal layer 5307 which is formed over the insulating layer 5305 and the conductive layer 5306 and a conductive layer 5308 which is formed over the liquid crystal layer 5307.

The insulating layer 5261 can serve as a base film. The insulating layer 5354 serves as an element isolation layer (e.g., a field oxide film). Each of the insulating layer 5263, the insulating layer 5302, and the insulating layer 5356 can serve as a gate insulating film. Each of the conductive layer 5264, the conductive layer 5301, and the conductive layer 5357 can serve as a gate electrode. Each of the insulating layer 5265, the insulating layer 5267, the insulating layer 5305, and the insulating layer 5358 can serve as an interlayer film or a planarization film. Each of the conductive layer 5266, the conductive layer 5304, and the conductive layer 5359 can serve as a wiring, an electrode of a transistor, an electrode of a capacitor, or the like. Each of the conductive layer 5268 and the conductive layer 5306 can serve as a pixel electrode, a reflective electrode, or the like. The insulating layer 5269 can serve as a partition wall. Each of the conductive layer 5271 and the conductive layer 5308 can serve as a counter electrode, a common electrode, or the like.

As each of the substrate 5260 and the substrate 5300, a glass substrate, a quartz substrate, a single crystal substrate (e.g., a silicon substrate), an SOI substrate, a plastic substrate, a metal substrate, a stainless steel substrate, a substrate including stainless steel foil, a tungsten substrate, a substrate including tungsten foil, a flexible substrate, or the like can be used, for example. As a glass substrate, a barium borosilicate glass substrate, an aluminoborosilicate glass substrate, or the like can be used, for example. For a flexible substrate, a flexible synthetic resin such as plastics typified by polyethylene terephthalate (PET), polyethylene naphthalate (PEN), or polyether sulfone (PES), or acrylic can be used, for example. Alternatively, an attachment film (formed using polypropylene, polyester, vinyl, polyvinyl fluoride, polyvinyl chloride, or the like), paper including a fibrous material, a base material film (formed using polyester, polyamide, polyimide, an inorganic vapor deposition film, paper, or the like), or the like can be used.

As the semiconductor substrate 5352, for example, a single crystal silicon substrate having n-type or p-type conductivity can be used. For example, the region 5353 is a region where an impurity is added to the semiconductor substrate 5352 and serves as a well. For example, in the case where the semiconductor substrate 5352 has p-type conductivity, the region 5353 has n-type conductivity and serves as an n-well. On the other hand, in the case where the semiconductor substrate 5352 has n-type conductivity, the region 5353 has p-type conductivity and serves as a p-well. For example, the region 5355 is a region where an impurity is added to the semiconductor substrate 5352 and serves as a source region or a drain region. Note that an LDD region can be formed in the semiconductor substrate 5352.

For the insulating layer 5261, a single-layer structure or a layered structure of an insulating film containing oxygen or nitrogen, such as silicon oxide ($SiO_x$) film, silicon nitride ($SiN_x$) film, silicon oxynitride ($SiO_xN_y$) (x >y >0) film, or silicon nitride oxide ($SiN_xO_y$) (x >y >0) film can be used, for example. In an example in the case where the insulating layer 5261 has a two-layer structure, a silicon nitride film and a silicon oxide film can be formed as a first insulating layer and a second insulating layer, respectively. In an example in the case where the insulating layer 5261 has a three-layer structure, a silicon oxide film, a silicon nitride film, and a silicon oxide film can be formed as a first insulating layer, a second insulating layer, and a third insulating layer, respectively.

For each of the semiconductor layer 5262, the semiconductor layer 5303a, and the semiconductor layer 5303b, for example, a non-single-crystal semiconductor (e.g., amorphous silicon, polycrystalline silicon, or microcrystalline silicon), a single crystal semiconductor, a compound semiconductor (e.g., SiGe or GaAs), an oxide semiconductor (e.g., ZnO, InGaZnO, IZO (indium zinc oxide), ITO (indium tin oxide), SnO, TiO, or AIZnSnO (AZTO)), an organic semiconductor, a carbon nanotube, or the like can be used.

Note that for example, the region 5262a is an intrinsic region where an impurity is not added to the semiconductor layer 5262 and serves as a channel region. However, an impurity can be added to the region 5262a. The concentration of the impurity added to the region 5262a is preferably lower than the concentration of an impurity added to the region 5262b, the region 5262c, the region 5262d, or the region 5262e. Each of the region 5262b and the region 5262d is a region to which an impurity is added at lower concentration than the region 5262c or the region 5262e and serves as an LDD (lightly doped drain) region. Note that the region 5262b and the region 5262d can be eliminated. Each of the region 5262c and the region 5262e is a region to which an impurity is added at high concentration and serves as a source region or a drain region.

Note that the semiconductor layer 5303b is a semiconductor layer to which phosphorus or the like is added as an impurity element and has n-type conductivity.

Note that in the case where an oxide semiconductor or a compound semiconductor is used for the semiconductor layer 5303a, the semiconductor layer 5303b can be eliminated.

For each of the insulating layer 5263, the insulating layer 5302, and the insulating layer 5356, a single-layer structure or a layered structure of an insulating film containing oxygen or nitrogen, such as silicon oxide ($SiO_x$) film, silicon nitride ($SiN_x$) film, silicon oxynitride ($SiO_xN_y$) (x >y >0) film, or silicon nitride oxide ($SiN_xO_y$) (x >y >0) film can be used, for example.

As each of the conductive layer 5264, the conductive layer 5266, the conductive layer 5268, the conductive layer 5271, the conductive layer 5301, the conductive layer 5304, the conductive layer 5306, the conductive layer 5308, the conductive layer 5357, and the conductive layer 5359, for example, a conductive film having a single-layer structure or a layered structure, or the like can be used. For example, for the conductive film, a single-layer film containing one element selected from the group consisting of aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), manganese (Mn), cobalt (Co), niobium (Nb), silicon (Si), iron (Fe), palladium (Pd), carbon (C), scandium (Sc), zinc (Zn), gallium (Ga), indium (In), tin (Sn), zirconium (Zr), and cerium (Ce); a compound containing one or more elements selected from the above group; or the like can be used. Note that the single film or the compound can contain phosphorus (P), boron (B), arsenic (As), and/or oxygen (O), for example. For example, the compound is an alloy containing one or more elements selected from the above plurality of elements (e.g., an alloy material such as indium tin oxide (ITO), indium zinc oxide (IZO), indium tin oxide containing silicon oxide (ITSO), zinc oxide (ZnO), tin oxide (SnO), cadmium tin oxide (CTO), aluminum-neodymium (Al—Nd), aluminum-tungsten (Al—W), aluminum-zirconium (Al—Zr), aluminum titanium (Al—Ti), aluminum-cerium (Al—Ce), magnesium-silver (Mg—Ag), molybdenum-niobium (Mo—Nb), molybdenum-tungsten (Mo—W), or molybdenum-tantalum (Mo—Ta)); a compound containing nitrogen and one or more elements selected from the above plurality of elements (e.g., a nitride film such as a titanium nitride film, a tantalum nitride film, a molybdenum nitride film, or the like); or a compound containing silicon and one or more elements selected from the above plurality of elements (e.g., a silicide film such as a tungsten silicide film, a titanium silicide film, a nickel silicide film, an aluminum silicon film, or a molybdenum silicon film); or the like. Alternatively, a nanotube material such as a carbon nanotube, an organic nanotube, an inorganic nanotube, or a metal nanotube can be used, for example.

Note that the conductive layer can have a single-layer structure or a multi-layer structure.

For each of the insulating layer 5265, the insulating layer 5267, the insulating layer 5269, the insulating layer 5305, and the insulating layer 5358, an insulating layer having a single-layer structure or a layered structure, or the like can be used, for example. For example, as the insulating layer, an insulating film containing oxygen or nitrogen, such as silicon oxide ($SiO_x$) film, silicon nitride ($SiN_x$) film, silicon oxynitride ($SiO_xN_y$) (x >y >0) film, or silicon nitride oxide ($SiN_xO_y$) (x >y >0) film; a film containing carbon such as diamond-like carbon (DLC); an organic material such as a siloxane resin, epoxy, polyimide, polyamide, polyvinyl phenol, benzocyclobutene, or acrylic; or the like can be used.

Note that an insulating layer which serves as an alignment film, an insulating layer which serves as a protrusion portion, or the like can be formed over the insulating layer 5305 and the conductive layer 5306.

Note that an insulating layer or the like which serves as a color filter, a black matrix, or a protrusion portion can be formed over the conductive layer 5308. An insulating layer which serves as an alignment film can be formed below the conductive layer 5308.

The transistor in this embodiment can be used for the shift register in Embodiment 1 or 2. Since degradation of the transistor can be suppressed in the shift register in Embodiment 1 or 2, a non-single-crystal semiconductor such as an amorphous semiconductor or a microcrystalline semiconductor, an organic semiconductor, an oxide semiconductor, or the like can be used for a semiconductor layer in FIG. 23B. Therefore, reduction in the number of manufacturing steps, reduction in manufacturing cost, improvement in yield, the increase in the size of a display device, or the like can be achieved.

Embodiment 7

In this embodiment, examples of cross-sectional structures of a display device are described with reference to FIGS. 24A to 24C.

Figure 24A:
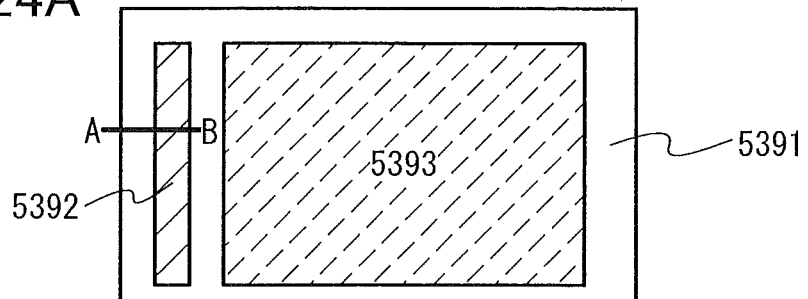
FIGS. 24A to 24C are a top view of a display device and cross-sectional views of the display device.

FIG. 24A illustrates an example of a top view of a display device. A driver circuit 5392 and a pixel portion 5393 are formed over a substrate 5391. An example of the driver circuit 5392 is a scan line driver circuit, a signal line driver circuit, or the like.

Figure 24B:
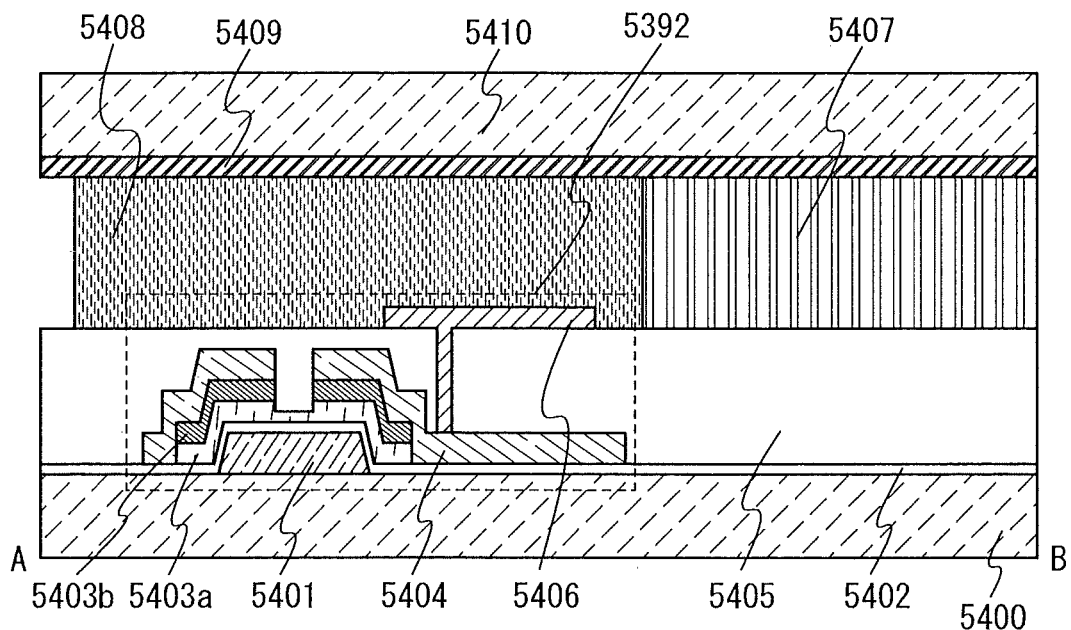

FIG. 24B illustrates an example of a cross section taken along line A-B in FIG. 24A. FIG. 24B illustrates a substrate 5400, a conductive layer 5401 formed over the substrate 5400, an insulating layer 5402 formed so as to cover the conductive layer 5401, a semiconductor layer 5403a formed over the conductive layer 5401 and the insulating layer 5402, a semiconductor layer 5403b formed over the semiconductor layer 5403a, a conductive layer 5404 formed over the semiconductor layer 5403b and the insulating layer 5402, an insulating layer 5405 which is formed over the insulating layer 5402 and the conductive layer 5404 and is provided with an opening portion, a conductive layer 5406 formed over the insulating layer 5405 and in the opening portion in the insulating layer 5405, an insulating layer 5408 provided over the insulating layer 5405 and the conductive layer 5406, a liquid crystal layer 5407 formed over the insulating layer 5405, a conductive layer 5409 formed over the liquid crystal layer 5407 and the insulating layer 5408, and a substrate 5410 provided over the conductive layer 5409.

The conductive layer 5401 can serve as a gate electrode. The insulating layer 5402 can serve as a gate insulating film. The conductive layer 5404 can serve as a wiring, an electrode of a transistor, an electrode of a capacitor, or the like. The insulating layer 5405 can serve as an interlayer film or a planarization film. The conductive layer 5406 can serve as a wiring, a pixel electrode, or a reflective electrode. The insulating layer 5408 can serve as a sealant. The conductive layer 5409 can serve as a counter electrode or a common electrode.

Here, parasitic capacitance is generated between the driver circuit 5392 and the conductive layer 5409 in some cases. Accordingly, an output signal from the driver circuit 5392 or a potential of each node is distorted or delayed, or power consumption is increased. However, when the insulating layer 5408 which can serve as the sealant is formed over the driver circuit 5392 as illustrated in FIG. 24B, parasitic capacitance generated between the driver circuit 5392 and the conductive layer 5409 can be reduced. This is because the dielectric constant of the sealant is often lower than the dielectric constant of the liquid crystal layer. Therefore, distortion or delay of the output signal from the driver circuit 5392 or the potential of each node can be reduced. Alternatively, power consumption of the driver circuit 5392 can be reduced.

Figure 24C:
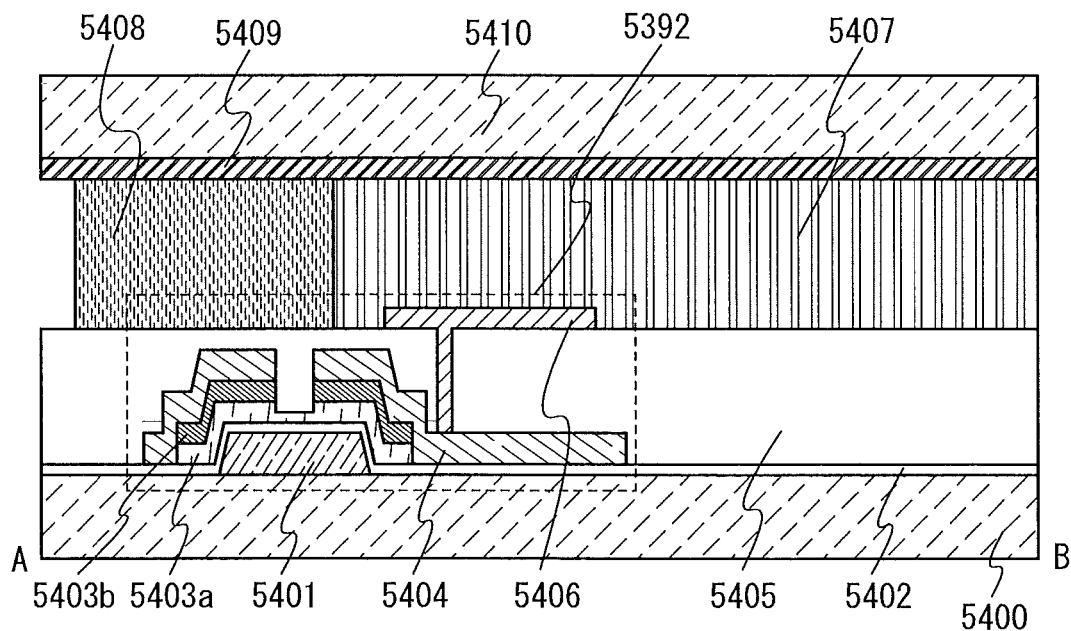

Note that as illustrated in FIG. 24C, the insulating layer 5408 which can serve as the sealant can be formed over part of the driver circuit 5392. Also in such a case, parasitic capacitance generated between the driver circuit 5392 and the conductive layer 5409 can be reduced. Thus, distortion or delay of the output signal from the driver circuit 5392 or the potential of each node can be reduced. Note that this embodiment is not limited to this. It is possible not to form the insulating layer 5408, which can serve as the sealant, over the driver circuit 5392.

Note that a display element is not limited to a liquid crystal element, and a variety of display elements such as an EL element or an electrophoretic element can be used.

The structure of the display device in this embodiment can be combined with the shift register in Embodiment 1 or 2. For example, in the case where a non-single-crystal semiconductor such as an amorphous semiconductor or a microcrystalline semiconductor, an organic semiconductor, an oxide semiconductor, or the like is used for a semiconductor layer of a transistor, the channel width of the transistor is increased in many cases. However, by reducing parasitic capacitance of the driver circuit as in this embodiment, the channel width of the transistor can be decreased. Thus, a layout area can be reduced, so that the frame of the display device can be reduced. Alternatively, the display device can have higher definition.

Embodiment 8

In this embodiment, an example of a manufacturing process of a transistor and a capacitor is described. In particular, a manufacturing process when an oxide semiconductor is used for a semiconductor layer is described.

Figure 25A:
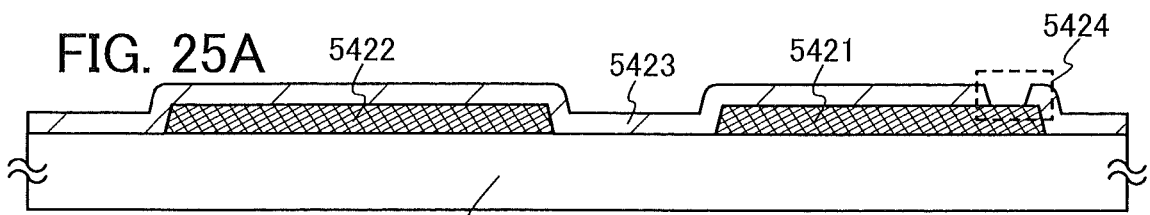
FIGS. 25A to 25E are cross-sectional views for illustrating manufacturing steps of a transistor.
Figure 25B:
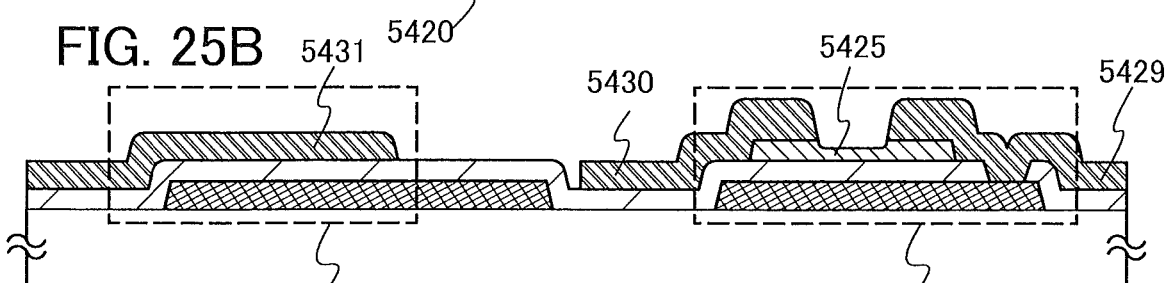
Figure 25C:
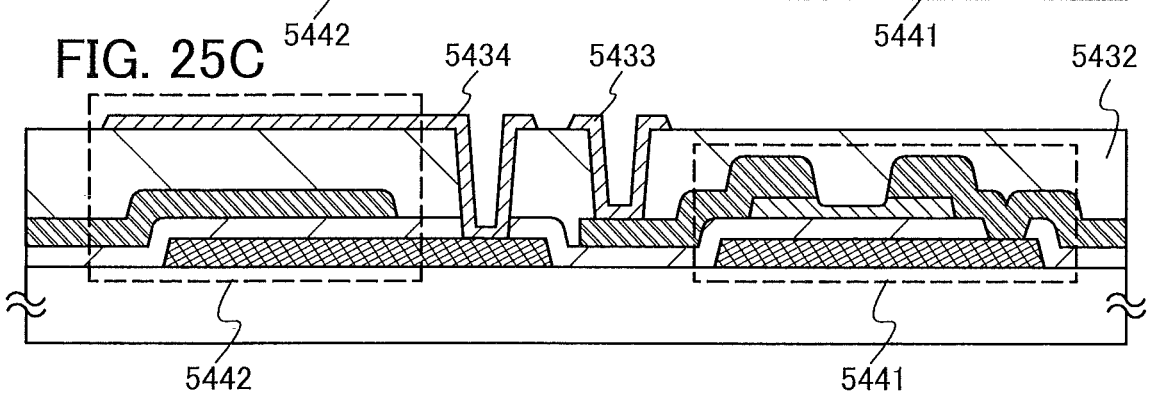

An example of a manufacturing process of a transistor and a capacitor is described with reference to FIGS. 25A to 25C. FIGS. 25A to 25C illustrate an example of a manufacturing process of a transistor 5441 and a capacitor 5442. The transistor 5441 is an example of an inverted staggered thin film transistor, in which a wiring is provided over an oxide semiconductor layer with a source electrode or a drain electrode therebetween.

First, a first conductive layer is formed over the entire surface of a substrate 5420 by sputtering. Next, the first conductive layer is selectively etched with the use of a resist mask formed through a photolithography process using a first photomask, so that a conductive layer 5421 and a conductive layer 5422 are formed. The conductive layer 5421 can serve as a gate electrode. The conductive layer 5422 can serve as one of electrodes of the capacitor. Note that this embodiment is not limited to this, and each of the conductive layers 5421 and 5422 can include a portion serving as a wiring, a gate electrode, or an electrode of the capacitor. After that, the resist mask is removed.

Next, an insulating layer 5423 is formed over the entire surface by plasma-enhanced CVD or sputtering. The insulating layer 5423 can serve as a gate insulating layer and is formed so as to cover the conductive layers 5421 and 5422. Note that the thickness of the insulating layer 5423 is often 50 to 250 nm.

Next, the insulating layer 5423 is selectively etched with the use of a resist mask formed through a photolithography process using a second photomask, so that a contact hole 5424 which reaches the conductive layer 5421 is formed. Then, the resist mask is removed. Note that this embodiment is not limited to this, and the contact hole 5424 can be eliminated. Alternatively, the contact hole 5424 can be formed after an oxide semiconductor layer is formed. A cross-sectional view of the steps so far corresponds to FIG. 25A.

Next, an oxide semiconductor layer is formed over the entire surface by sputtering. Note that this embodiment is not limited to this, and it is possible to form the oxide semiconductor layer by sputtering and to form a buffer layer (e.g., an $n^+$ layer) thereover. Note that the thickness of the oxide semiconductor layer is often 5 to 200 nm.

Next, the oxide semiconductor layer is selectively etched using a third photomask. After that, the resist mask is removed.

Next, a second conductive layer is formed over the entire surface by sputtering. Then, the second conductive layer is selectively etched with the use of a resist mask formed through a photolithography process using a fourth photomask, so that a conductive layer 5429, a conductive layer 5430, and a conductive layer 5431 are formed. The conductive layer 5429 is connected to the conductive layer 5421 through the contact hole 5424. The conductive layers 5429 and 5430 can serve as the source electrode and the drain electrode. The conductive layer 5431 can serve as the other of the electrodes of the capacitor. Note that this embodiment is not limited to this, and each of the conductive layers 5429, 5430, and 5431 can include a portion serving as a wiring, the source electrode, the drain electrode, or the electrode of the capacitor. A cross-sectional view of the steps so far corresponds to FIG. 25B.

Next, heat treatment is performed at 200 to 600° C. in an air atmosphere or a nitrogen atmosphere. Through this heat treatment, rearrangement at the atomic level occurs in an In—Ga—Zn—O-based non-single-crystal layer. In this manner, through heat treatment (including light annealing), strain which inhibits carrier movement is released. Note that there is no particular limitation to timing at which the heat treatment is performed, and the heat treatment can be performed at any time after the oxide semiconductor layer is formed.

Next, an insulating layer 5432 is formed over the entire surface. The insulating layer 5432 can have either a single-layer structure or a layered structure. For example, in the case where an organic insulating layer is used as the insulating layer 5432, the organic insulating layer is formed in such a manner that a composition which is a material for the organic insulating layer is applied and subjected to heat treatment at 200 to 600° C. in an air atmosphere or a nitrogen atmosphere. By forming the organic insulating layer which is in contact with the oxide semiconductor layer in this manner, a thin film transistor with highly reliable electric characteristics can be manufactured. Note that in the case where an organic insulating layer is used as the insulating layer 5432, a silicon nitride film or a silicon oxide film can be provided below the organic insulating layer.

Next, a third conductive layer is formed over the entire surface. Then, the third conductive layer is selectively etched with the use of a resist mask formed through a photolithography process using a fifth photomask, so that a conductive layer 5433 and a conductive layer 5434 are formed. A cross-sectional view of the steps so far corresponds to FIG. 25C. Each of the conductive layers 5433 and 5434 can serve as a wiring, a pixel electrode, a reflective electrode, a light-transmitting electrode, or the electrode of the capacitor. In particular, since the conductive layer 5434 is connected to the conductive layer 5422, the conductive layer 5434 can serve as the electrode of the capacitor 5442. Note that this embodiment is not limited to this, and the conductive layers 5433 and 5434 can have a function of connecting the first conductive layer and the second conductive layer to each other. For example, by connecting the conductive layers 5433 and 5434 to each other, the conductive layer 5422 and the conductive layer 5430 can be connected to each other through the third conductive layer (the conductive layers 5433 and 5434).

Through the above steps, the transistor 5441 and the capacitor 5442 can be manufactured.

Figure 25D:
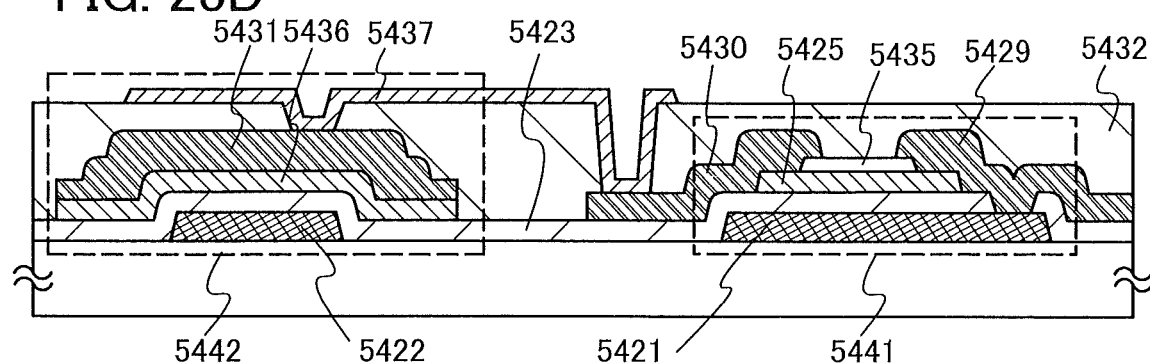

Note that as illustrated in FIG. 25D, an insulating layer 5435 can be formed over the oxide semiconductor layer 5425.

Figure 25E:
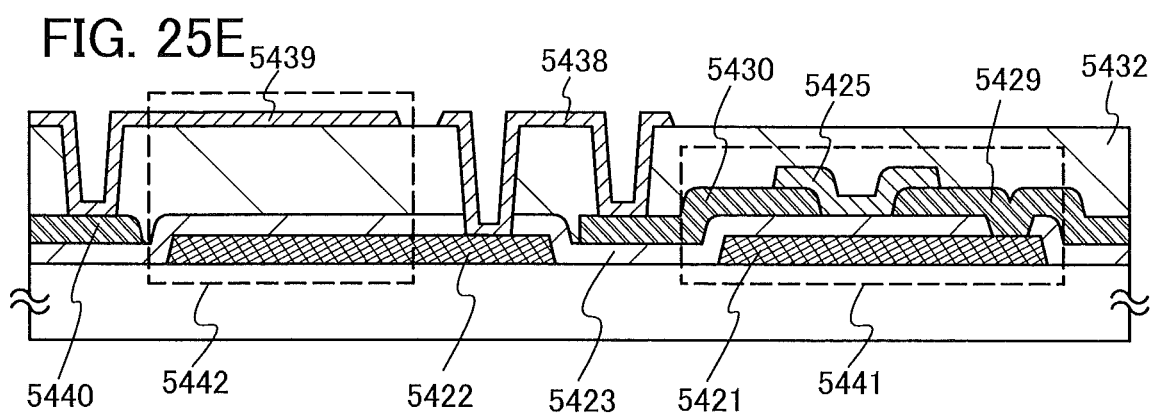

Note that as illustrated in FIG. 25E, the oxide semiconductor layer 5425 can be formed after the second conductive layer is patterned.

Note that for the substrate, the insulating film, the conductive film, and the semiconductor layer in this embodiment, the materials described in the other embodiments or materials which are similar to those described in this specification can be used.

When the transistor in this embodiment is used in the shift register in Embodiment 1 or 2 or a display device including the shift register, the size of a display portion can be increased. Alternatively, the display portion can have higher definition.

Embodiment 9

In this embodiment, examples of electronic devices are described.

FIGS. 26A to 26H and FIGS. 27A to 27D illustrate electronic devices. These electronic devices can include a housing 5000, a display portion 5001, a speaker 5003, an LED lamp 5004, operation keys 5005 (including a power switch or an operation switch for controlling the operation of a display device), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 26A:
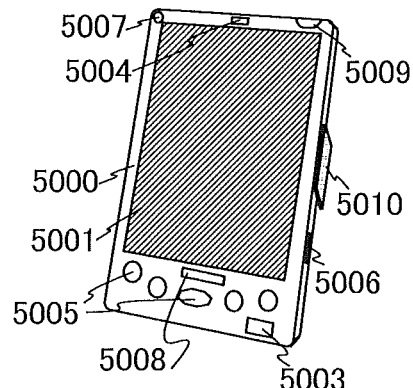
FIGS. 26A to 26H are diagrams illustrating electronic devices.
Figure 26B:
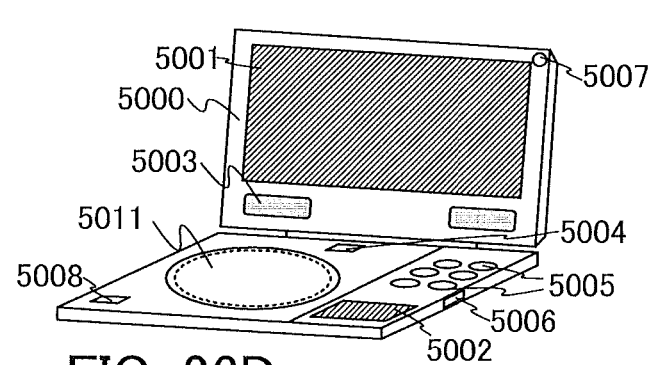
Figure 26C:
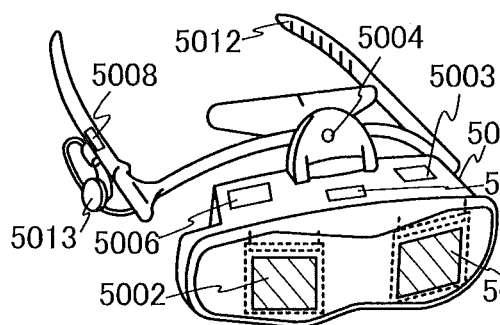
Figure 26D:
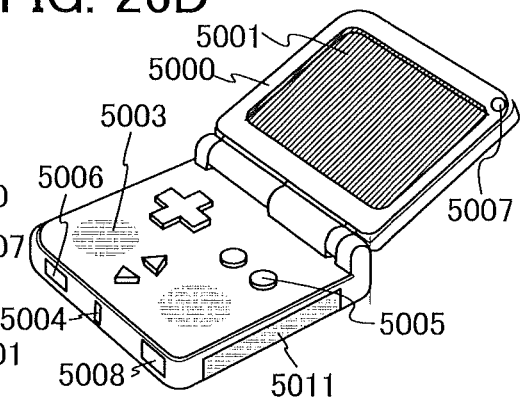
Figure 26E:
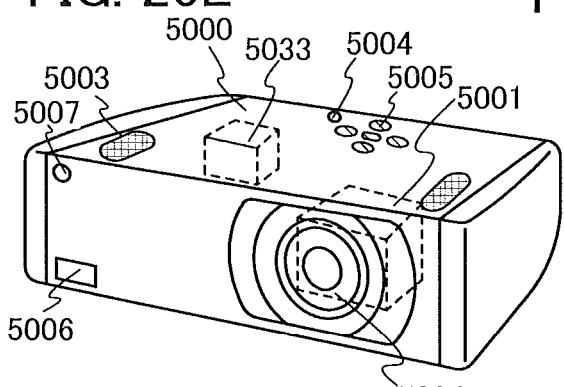
Figure 26F:
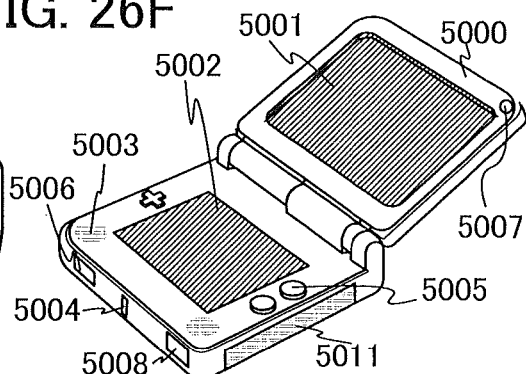
Figure 26G:
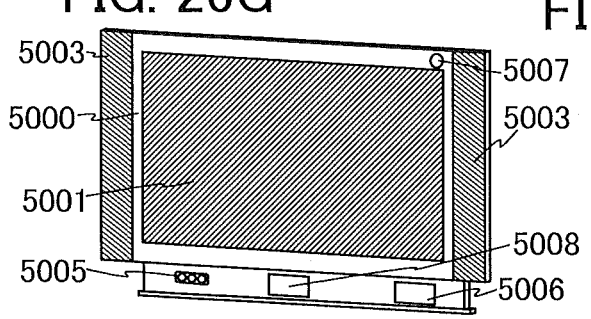
Figure 26H:
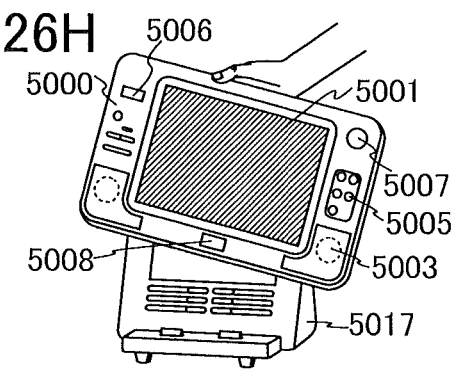
Figure 27A:
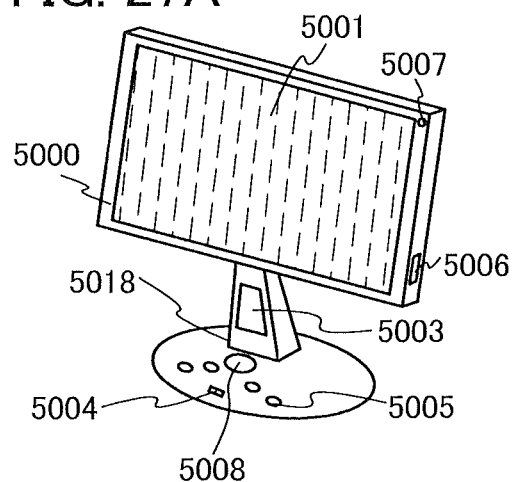
FIGS. 27A to 27H are diagrams illustrating electronic devices.
Figure 27B:
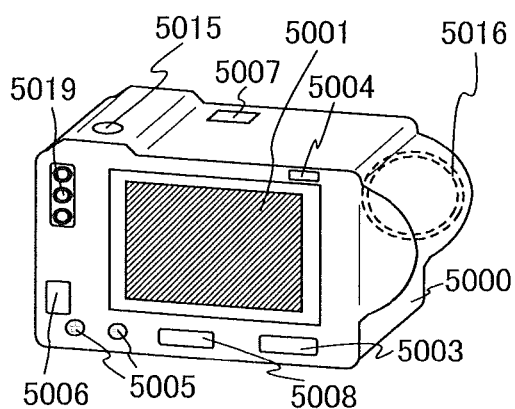
Figure 27C:
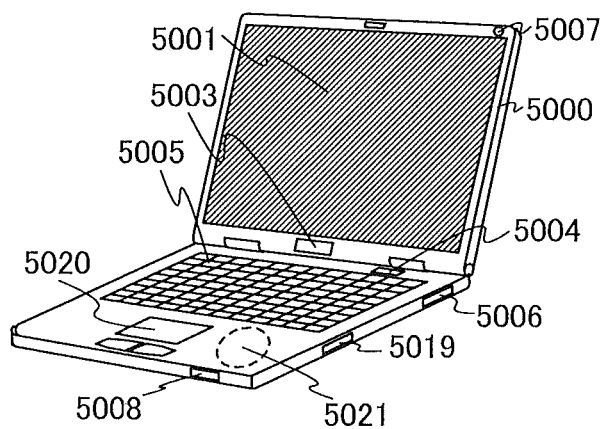
Figure 27D:
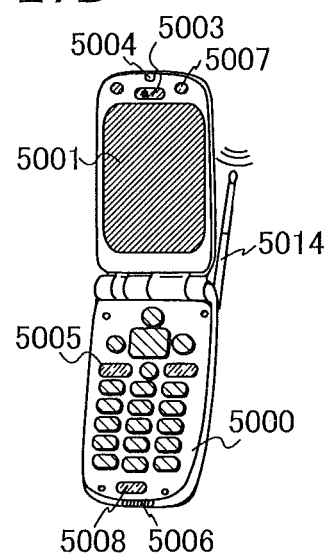

FIG. 26A illustrates a mobile computer, which can include a switch 5009, an infrared port 5010, and the like in addition to the above objects. FIG. 26B illustrates a portable image regenerating device provided with a memory medium (e.g., a DVD regenerating device), which can include a second display portion 5002, a memory medium reading portion 5011, and the like in addition to the above objects. FIG. 26C illustrates a goggle-type display, which can include the second display portion 5002, a support portion 5012, an earphone 5013, and the like in addition to the above objects. FIG. 26D illustrates a portable game machine, which can include the memory medium reading portion 5011 and the like in addition to the above objects. FIG. 26E illustrates a projector, which can include a light source 5033, a projector lens 5034, and the like in addition to the above objects. FIG. 26F illustrates a portable game machine, which can include the second display portion 5002, the memory medium reading portion 5011, and the like in addition to the above objects. FIG. 26G illustrates a television receiver, which can include a tuner, an image processing portion, and the like in addition to the above objects. FIG. 26H illustrates a portable television receiver, which can include a charger 5017 capable of transmitting and receiving signals and the like in addition to the above objects. FIG. 27A illustrates a display, which can include a support base 5018 and the like in addition to the above objects. FIG. 27B illustrates a camera, which can include an external connecting port 5019, a shutter button 5015, an image receiving portion 5016, and the like in addition to the above objects. FIG. 27C illustrates a computer, which can include a pointing device 5020, the external connecting port 5019, a reader/writer 5021, and the like in addition to the above objects. FIG. 27D illustrates a mobile phone, which can include an antenna 5014, a tuner of one-segment (1seg digital TV broadcasts) partial reception service for mobile phones and mobile terminals, and the like in addition to the above objects.

The electronic devices illustrated in FIGS. 26A to 26H and FIGS. 27A to 27D can have a variety of functions, for example, a function of displaying a lot of information (e.g., a still image, a moving image, and a text image) on a display portion; a touch panel function; a function of displaying a calendar, date, time, and the like; a function of controlling processing with a lot of software (programs); a wireless communication function; a function of being connected to a variety of computer networks with a wireless communication function; a function of transmitting and receiving a lot of data with a wireless communication function; a function of reading a program or data stored in a memory medium and displaying the program or data on a display portion. Further, the electronic device including a plurality of display portions can have a function of displaying image information mainly on one display portion while displaying text information on another display portion, a function of displaying a three-dimensional image by displaying images where parallax is considered on a plurality of display portions, or the like. Furthermore, the electronic device including an image receiving portion can have a function of photographing a still image, a function of photographing a moving image, a function of automatically or manually correcting a photographed image, a function of storing a photographed image in a memory medium (an external memory medium or a memory medium incorporated in the camera), a function of displaying a photographed image on the display portion, or the like. Note that functions which can be provided for the electronic devices illustrated in FIGS. 26A to 26H and FIGS. 27A to 27D are not limited them, and the electronic devices can have a variety of functions.

The electronic devices described in this embodiment each include a display portion for displaying some kind of information. In particular, in the case where a display device includes the shift register described in Embodiment 1 or 2, malfunctions of a circuit can be prevented. Thus, display quality can be improved.

Next, applications of semiconductor devices are described.

Figure 27E:
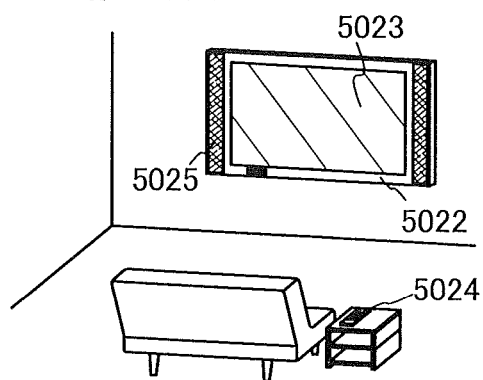

FIG. 27E illustrates an example in which a semiconductor device is incorporated in a building structure. FIG. 27E illustrates a housing 5022, a display portion 5023, a remote controller 5024 which is an operation portion, a speaker 5025, and the like. The semiconductor device is incorporated in the building structure as a wall-hanging type and can be provided without requiring a large space.

Figure 27F:
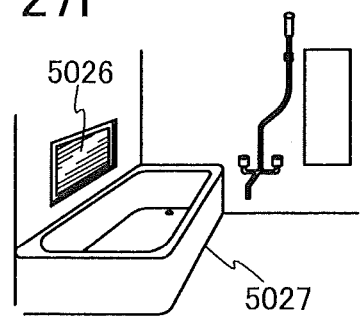

FIG. 27F illustrates another example in which a semiconductor device is incorporated in a building structure. A display panel 5026 is incorporated in a prefabricated bath unit 5027, so that a bather can view the display panel 5026.

Note that although this embodiment describes the wall and the prefabricated bath are given as examples of the building structures, this embodiment is not limited to them. The semiconductor devices can be provided in a variety of building structures.

Next, examples in which semiconductor devices are incorporated in moving objects are described.

Figure 27G:
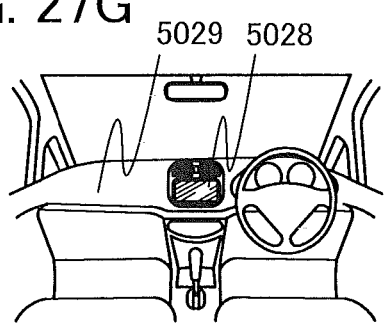

FIG. 27G illustrates an example in which a semiconductor device is incorporated in a car. A display panel 5028 is incorporated in a car body 5029 of the car and can display information related to the operation of the car or information input from inside or outside of the car on demand. Note that the display panel 5028 may have a navigation function.

Figure 27H:
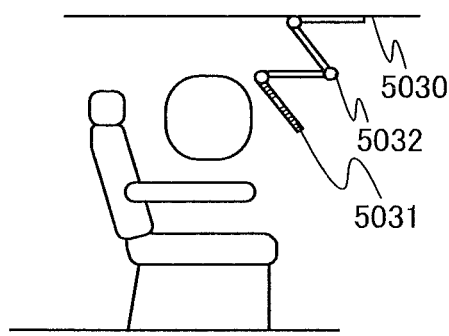

FIG. 27H illustrates an example in which a semiconductor device is incorporated in a passenger airplane. FIG. 27H illustrates a usage pattern when a display panel 5031 is provided for a ceiling 5030 above a seat of the passenger airplane. The display panel 5031 is incorporated in the ceiling 5030 through a hinge portion 5032, and a passenger can view the display panel 5031 by stretching of the hinge portion 5032. The display panel 5031 has a function of displaying information by the operation of the passenger.

Note that although bodies of a car and an airplane are illustrated as examples of moving objects in this embodiment, this embodiment is not limited to them. The semiconductor devices can be provided for a variety of objects such as two-wheeled vehicles, four-wheeled vehicles (including cars, buses, and the like), trains (including monorails, railroads, and the like), and vessels.

This application is based on Japanese Patent Application serial no. 2009-077955 filed with Japan Patent Office on Mar. 27, 2009, the entire contents of which are hereby incorporated by reference.

What is claimed is:

1. A semiconductor device comprising:
   a first transistor, a second transistor, a third transistor, a fourth transistor, a fifth transistor, a sixth transistor, a seventh transistor, an eighth transistor, a ninth transistor, and a tenth transistor,
   wherein one of a source and a drain of the first transistor is electrically connected to a first wiring for inputting a clock signal,
   wherein the other of the source and the drain of the first transistor is electrically connected to a second wiring for outputting an output signal,
   wherein one of a source and a drain of the second transistor is electrically connected to the second wiring,
   wherein the other of the source and the drain of the second transistor is electrically connected to a first power supply line,
   wherein one of a source and a drain of the third transistor is electrically connected to a gate of the first transistor,
   wherein the other of the source and the drain of the third transistor is electrically connected to a first signal line,
   wherein one of a source and a drain of the fourth transistor is electrically connected to the gate of the first transistor,
   wherein the other of the source and the drain of the fourth transistor is electrically connected to a second signal line,
   wherein one of a source and a drain of the fifth transistor is electrically connected to the gate of the first transistor,
   wherein the other of the source and the drain of the fifth transistor is electrically connected to the first power supply line,
   wherein a gate of the fifth transistor is electrically connected to a gate of the second transistor,
   wherein one of a source and a drain of the sixth transistor is electrically connected to the gate of the second transistor,
   wherein the other of the source and the drain of the sixth transistor is electrically connected to the first power supply line,
   wherein one of a source and a drain of the seventh transistor is electrically connected to the gate of the second transistor,
   wherein the other of the source and the drain of the seventh transistor is electrically connected to a second power supply line, wherein a gate of the seventh transistor is electrically connected to one of a source and a drain of the eighth transistor and one of a source and a drain of the ninth transistor, wherein one of a source and a drain of the tenth transistor is electrically connected to the gate of the second transistor, wherein the other of the source and the drain of the tenth transistor is electrically connected to the first power supply line, wherein a gate of the tenth transistor is electrically connected to the gate of the first transistor, and wherein a potential of the first power supply line is lower than a potential of the second power supply line.

2. A semiconductor device comprising:

a first scan line driver circuit configured to scan wirings in odd-numbered rows;

a second scan line driver circuit configured to scan wirings in even-numbered rows; and a pixel portion provided between the first scan line driver circuit and the second scan line driver circuit, the pixel portion comprising a plurality of pixels, wherein each of the plurality of pixels comprises a liquid crystal element, wherein at least one of the first scan line driver circuit and the second scan line driver circuit comprises a first transistor, a second transistor, a third transistor, a fourth transistor, a fifth transistor, a sixth transistor, a seventh transistor, an eighth transistor, a ninth transistor, and a tenth transistor, wherein one of a source and a drain of the first transistor is electrically connected to a first wiring for inputting a clock signal, wherein the other of the source and the drain of the first transistor is electrically connected to the pixel through a second wiring for outputting an output signal, wherein one of a source and a drain of the second transistor is electrically connected to the second wiring, wherein the other of the source and the drain of the second transistor is electrically connected to a first power supply line, wherein one of a source and a drain of the third transistor is electrically connected to a gate of the first transistor, wherein the other of the source and the drain of the third transistor is electrically connected to a first signal line, wherein one of a source and a drain of the fourth transistor is electrically connected to the gate of the first transistor, wherein the other of the source and the drain of the fourth transistor is electrically connected to a second signal line, wherein one of a source and a drain of the fifth transistor is electrically connected to the gate of the first transistor, wherein the other of the source and the drain of the fifth transistor is electrically connected to the first power supply line, wherein a gate of the fifth transistor is electrically connected to a gate of the second transistor, wherein one of a source and a drain of the sixth transistor is electrically connected to the gate of the second transistor, wherein the other of the source and the drain of the sixth transistor is electrically connected to the first power supply line, wherein one of a source and a drain of the seventh transistor is electrically connected to the gate of the second transistor, wherein the other of the source and the drain of the seventh transistor is electrically connected to a second power supply line, wherein a gate of the seventh transistor is electrically connected to one of a source and a drain of the eighth transistor and one of a source and a drain of the ninth transistor, wherein one of a source and a drain of the tenth transistor is electrically connected to the gate of the second transistor, wherein the other of the source and the drain of the tenth transistor is electrically connected to the first power supply line, wherein a gate of the tenth transistor is electrically connected to the gate of the first transistor, wherein a potential of the first power supply line is lower than a potential of the second power supply line, and wherein a channel width of the first transistor is larger than a channel width of each of the second transistor, the third transistor, the fourth transistor, the fifth transistor, the sixth transistor, the seventh transistor, the eighth transistor, the ninth transistor, and the tenth transistor.

* * * * *